United States Patent
Kodama et al.

(10) Patent No.: US 11,714,552 B2
(45) Date of Patent: Aug. 1, 2023

(54) MEMORY SYSTEM

(71) Applicant: Kioxia Corporation, Tokyo (JP)

(72) Inventors: Sho Kodama, Kawasaki (JP); Keiri Nakanishi, Kawasaki (JP); Masato Sumiyoshi, Yokohama (JP); Zheye Wang, Kawasaki (JP); Kohei Oikawa, Kawasaki (JP); Youhei Fukazawa, Kawasaki (JP); Daisuke Yashima, Tachikawa (JP); Takashi Miura, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/304,025

(22) Filed: Jun. 14, 2021

(65) Prior Publication Data

US 2022/0269416 A1 Aug. 25, 2022

(30) Foreign Application Priority Data

Feb. 22, 2021 (JP) ................................. 2021-026455

(51) Int. Cl.
*G06F 3/06* (2006.01)
*H03M 7/30* (2006.01)

(52) U.S. Cl.
CPC .......... *G06F 3/0608* (2013.01); *G06F 3/0625* (2013.01); *G06F 3/0659* (2013.01); *G06F 3/0679* (2013.01); *H03M 7/3088* (2013.01)

(58) Field of Classification Search
CPC .... G06F 3/0608; G06F 3/0625; G06F 3/0659; G06F 3/0679; H03M 7/3088
USPC .......................................................... 711/103
See application file for complete search history.

(56) References Cited

U.S. PATENT DOCUMENTS

| | | |
|---|---|---|
| 6,661,839 B1 | 12/2003 | Ishida et al. |
| 10,067,705 B2 | 9/2018 | Abali et al. |
| 10,097,202 B1 | 10/2018 | Ki et al. |
| 10,423,596 B2 | 9/2019 | Amit et al. |
| 10,687,066 B2 | 6/2020 | Li |
| 2008/0154928 A1* | 6/2008 | Bashyam ................. H03M 7/30 |
| 2012/0131266 A1* | 5/2012 | Cho ......................... G06F 12/04 |
| | | 711/E12.008 |
| 2014/0244604 A1 | 8/2014 | Oltean et al. |
| 2017/0357454 A1 | 12/2017 | Kumar et al. |
| 2019/0007058 A1* | 1/2019 | Ki ......................... H03M 7/3088 |
| 2019/0123763 A1 | 4/2019 | Bissessur et al. |

* cited by examiner

*Primary Examiner* — Gautam Sain
(74) *Attorney, Agent, or Firm* — Oblon, McClelland, Maier & Neustadt, L.L.P.

(57) ABSTRACT

According to one embodiment, a memory system includes a compressor configured to output second data obtained by compressing input first data and a non-volatile memory to which third data based on the second data output from the compressor is written. The compressor includes a dictionary coding unit configured to perform dictionary coding on the first data, an entropy coding unit configured to perform entropy coding on the result of the dictionary coding, a first calculation unit configured to calculate compression efficiencies of the dictionary coding and the entropy coding, and a first control unit configured to control an operation of at least one of the dictionary coding unit and the entropy coding unit based on the compression efficiencies and a power reduction level.

44 Claims, 34 Drawing Sheets

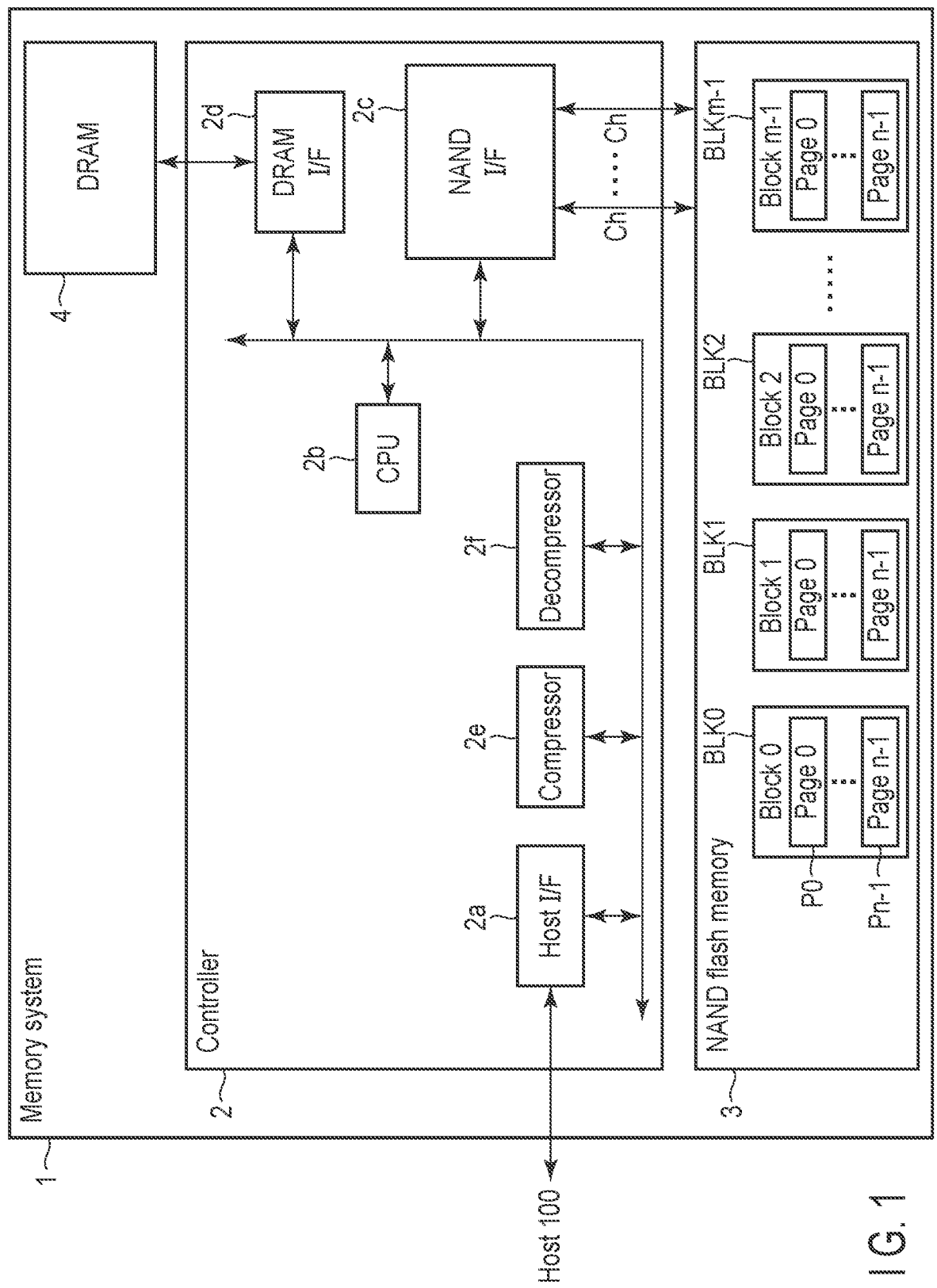
F I G. 1

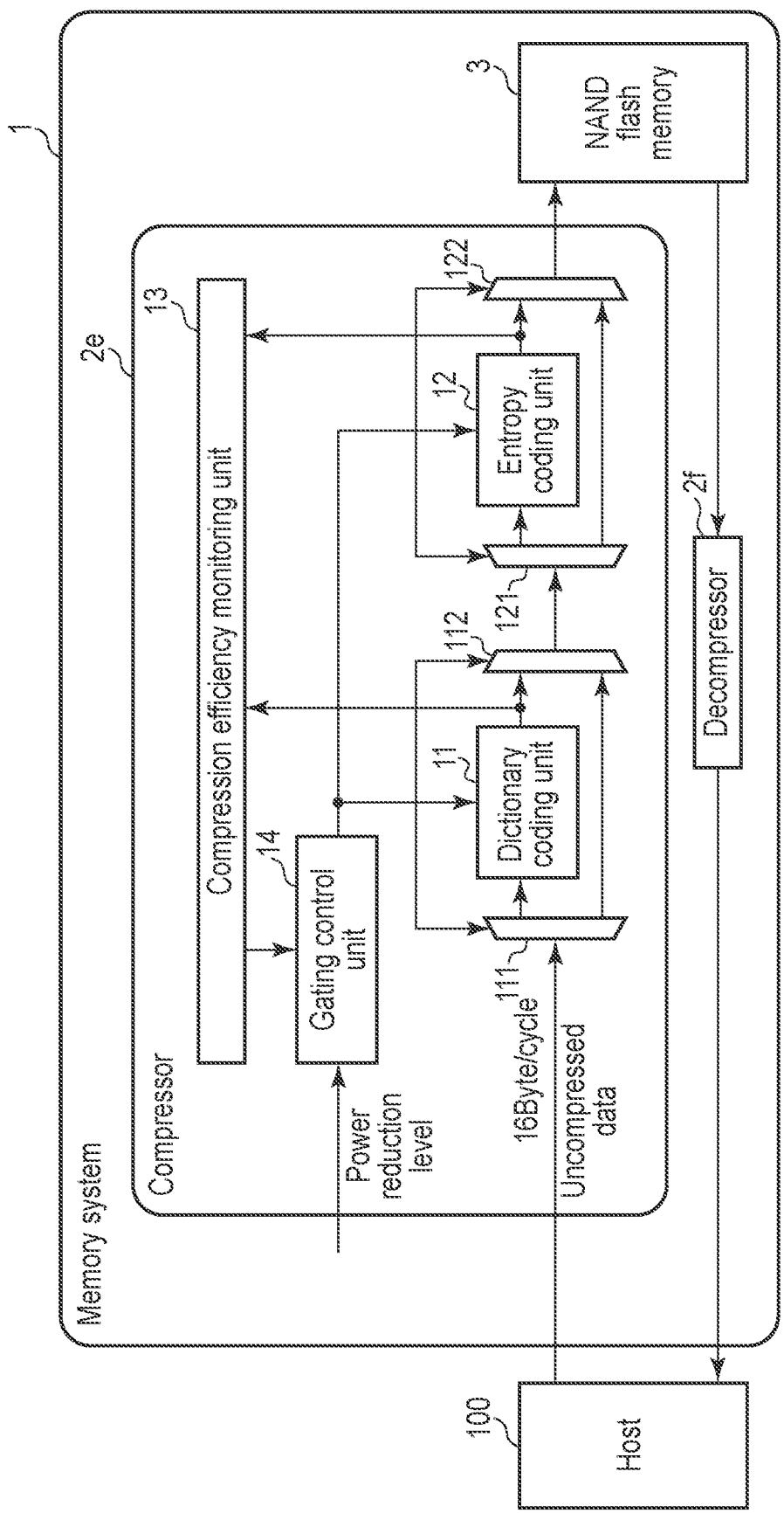
F I G. 2

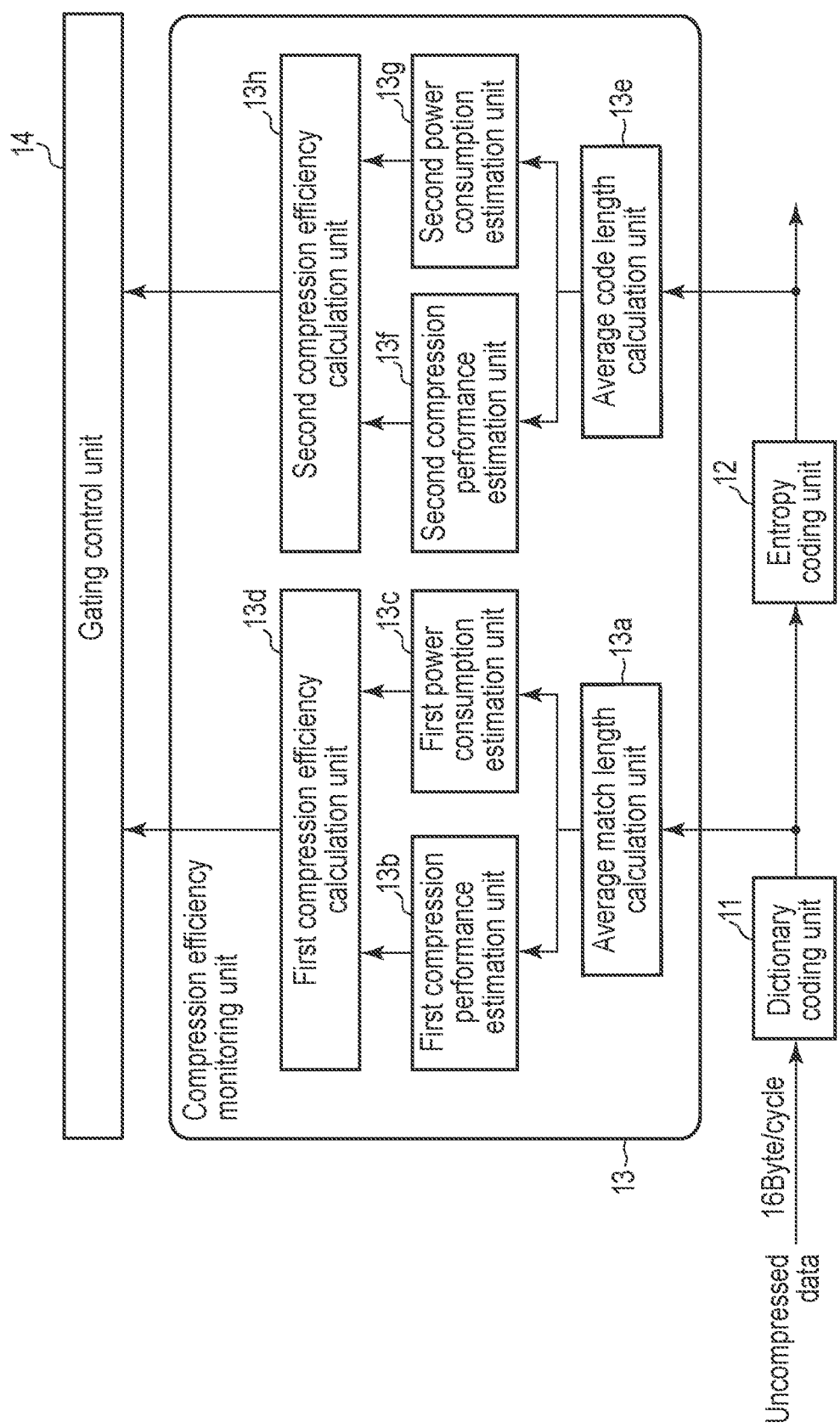
F I G. 3

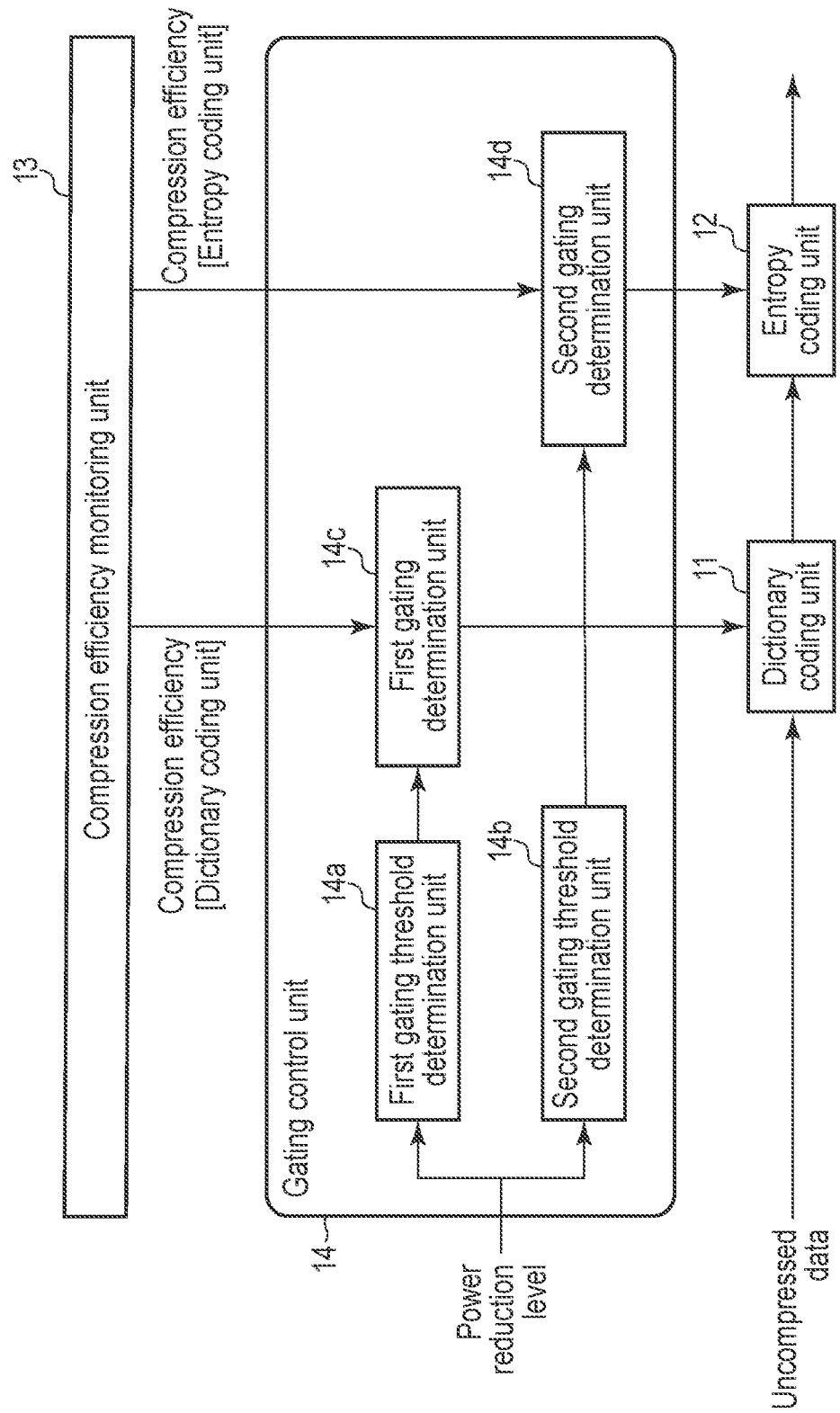
F I G. 4

| Average match length | Estimated value of compression performance |
|---|---|
| 0≦average match length<2 | 1 |
| 2≦average match length<4 | 2 |
| 4≦average match length<8 | 4 |
| 8≦average match length<16 | 8 |

F I G. 6

| Average match length | Estimated value of power consumption |
|---|---|
| 0≦average match length<2 | 100 |
| 2≦average match length< 4 | 90 |
| 4≦average match length<8 | 60 |
| 8≦average match length<16 | 40 |

F I G. 7

| Power reduction level | Threshold of compression efficiency |
|---|---|
| 0 | 0 |
| 1 | 0.03 |
| 2 | 0.1 |
| 3 | 0.15 |
| 4 | 1 |

F I G. 8

| Average code length | Estimated value of compression performance |
|---|---|
| 1≦average code length<2 | 8 |
| 2≦average code length<3 | 4 |
| 3≦average code length<6 | 2 |
| 6≦average code length<10 | 1 |

FIG. 10

| Average code length | Estimated value of power consumption |
|---|---|
| 1≦average code length<2 | 20 |
| 2≦average code length<3 | 30 |
| 3≦average code length<6 | 50 |
| 6≦average code length<10 | 80 |

FIG. 11

| Power reduction level | Threshold of compression performance |
|---|---|
| 0 | 0 |
| 1 | 0.05 |
| 2 | 0.1 |
| 3 | 0.25 |
| 4 | 1 |

FIG. 12

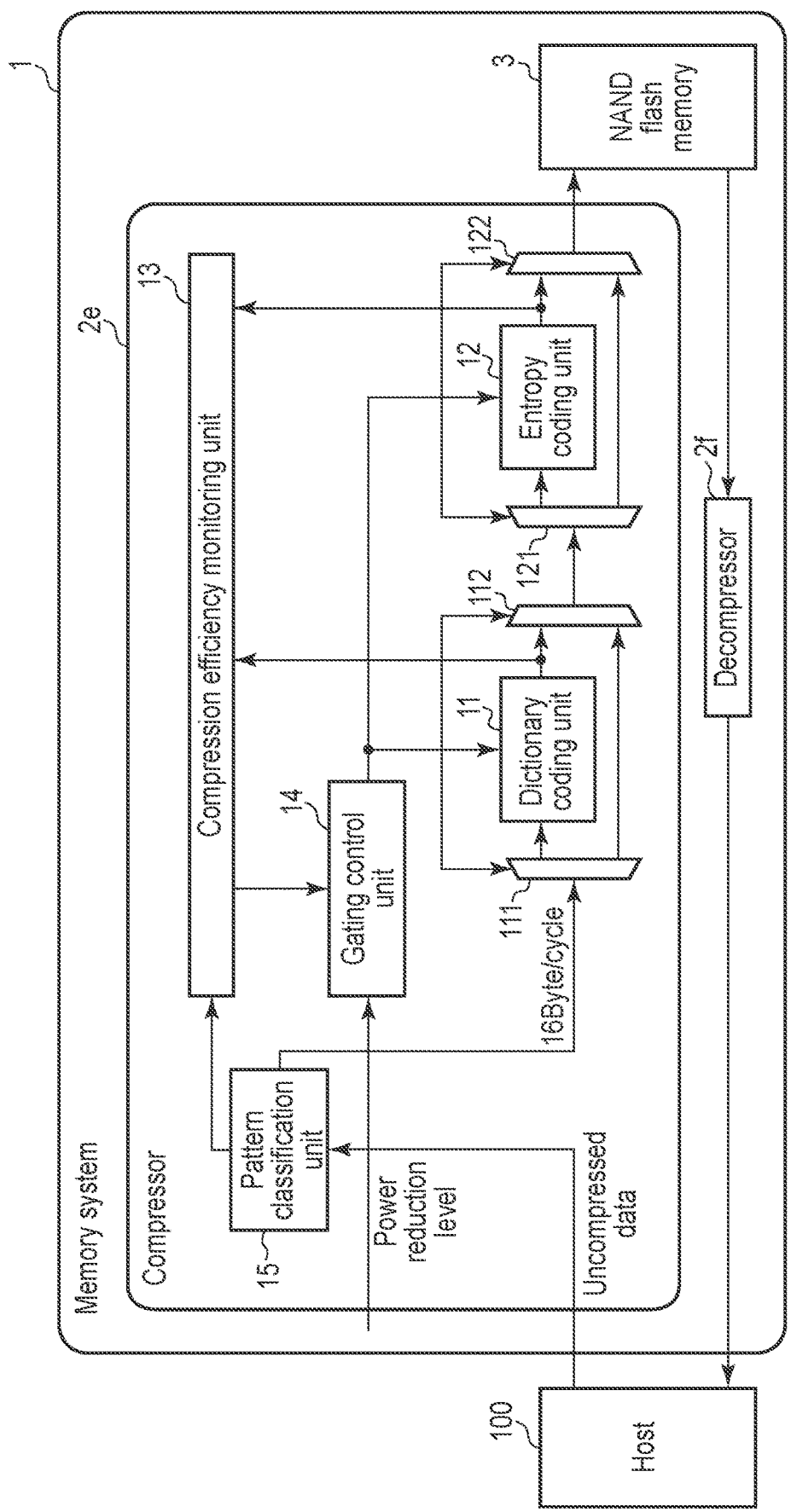
F I G. 13

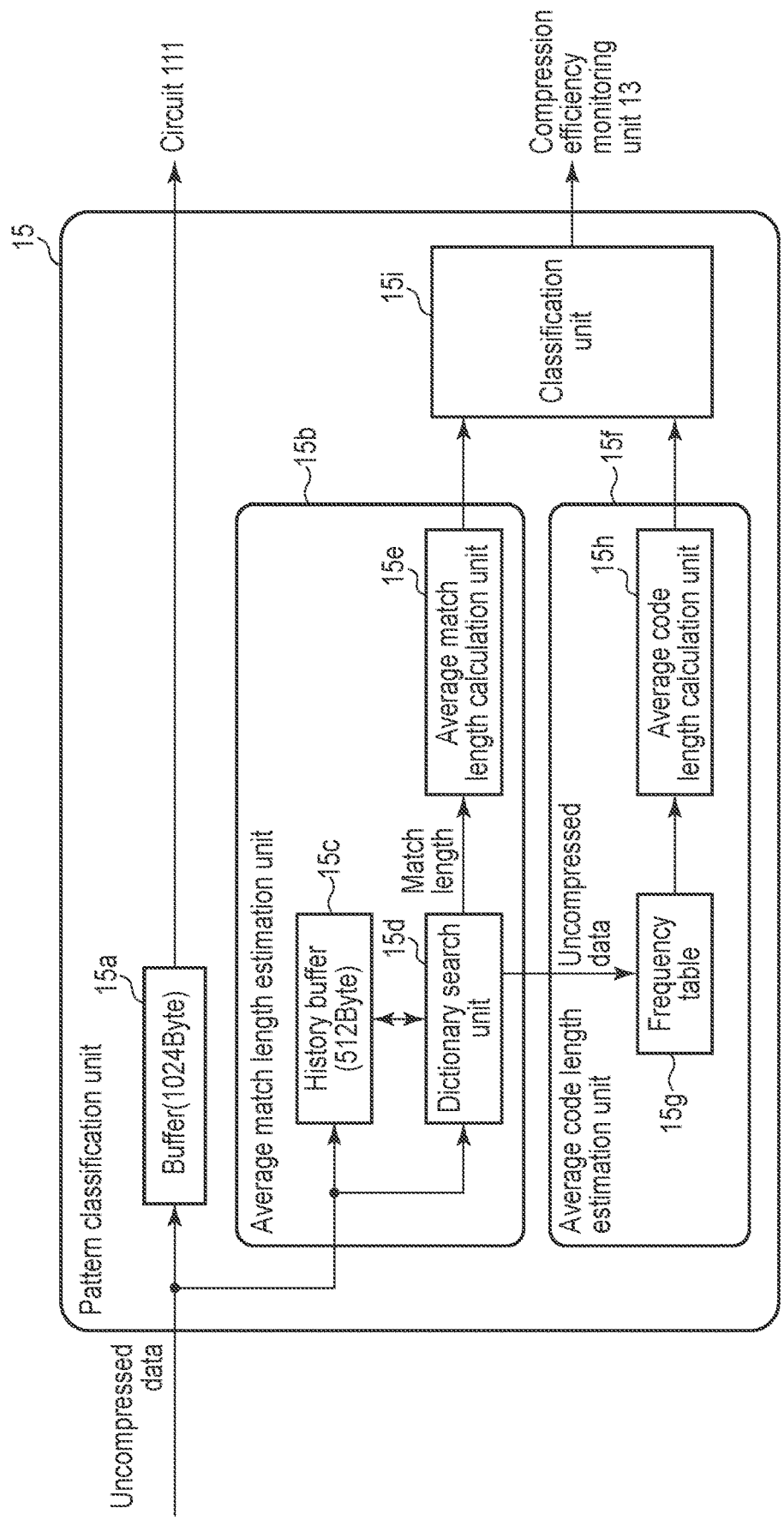
F I G. 14

| Classification conditions | Pattern classification | Tendency of uncompressed data |
|---|---|---|
| 0 ≦ average match length < 4, 6 ≦ average code length < 10 | 0 | Both dictionary coding unit and entropy coding unit have low compression performance and large power consumption. |
| 0 ≦ average match length < 4, 3 ≦ average code length < 6 | 1 | Dictionary coding unit has low compression performance and large power consumption, and entropy coding unit has medium compression performance and medium power consumption. |
| 0 ≦ average match length < 4, 1 ≦ average code length < 3 | 2 | Dictionary coding unit has low compression performance and large power consumption, and entropy coding unit has high compression performance and small power consumption. |
| 4 ≦ average match length < 8, 6 ≦ average code length < 10 | 3 | Dictionary coding unit has medium compression performance and medium power consumption, and entropy coding unit has low compression performance and large power consumption. |
| 4 ≦ average match length < 8, 3 ≦ average code length < 6 | 4 | Dictionary coding unit has medium compression performance and medium power consumption, and entropy coding unit has medium compression performance and medium power consumption. |
| 4 ≦ average match length < 8, 1 ≦ average code length < 3 | 5 | Dictionary coding unit has medium compression performance and medium power consumption, and entropy coding unit has high compression performance and small power consumption. |
| 8 ≦ average match length < 16, 6 ≦ average code length < 10 | 6 | Dictionary coding unit has high compression performance and small power consumption, and entropy coding unit has low compression performance and large power consumption. |
| 8 ≦ average match length < 16, 3 ≦ average code length < 6 | 7 | Dictionary coding unit has high compression performance and small power consumption, and entropy coding unit has medium compression performance and medium power consumption. |
| 8 ≦ average match length < 16, 1 ≦ average code length < 3 | 8 | Dictionary coding unit has high compression performance and small power consumption, and entropy coding unit has high compression performance and small power consumption. |

F I G. 15

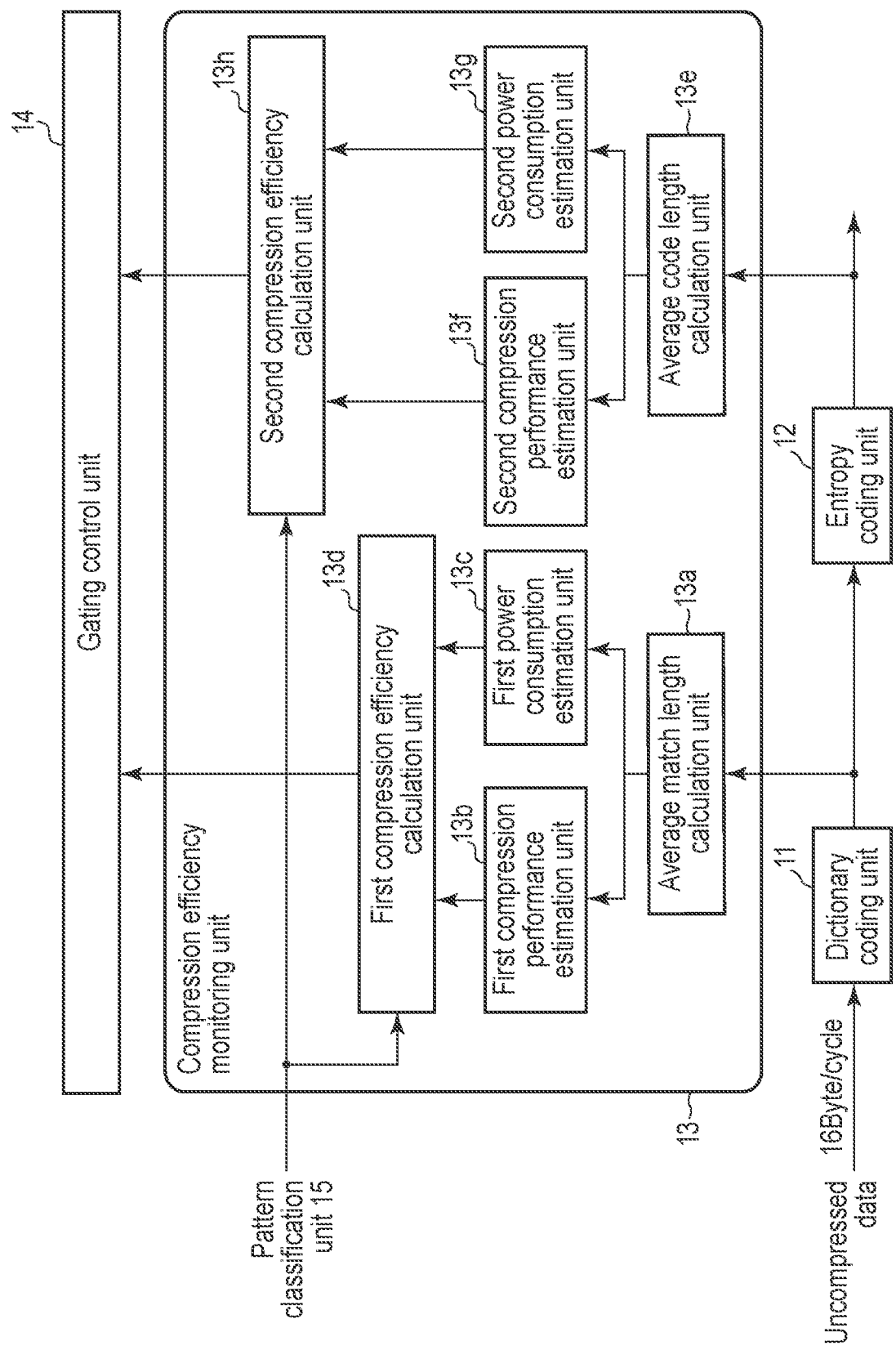
F I G. 16

| Pattern classification result | Addition value |
|---|---|
| 0,1,2 | 1 |
| 3,4,5 | 2 |
| 6,7,8 | 4 |

FIG. 17

| Pattern classification result | Addition value |
|---|---|
| 0,1,2 | 50 |
| 3,4,5 | 25 |
| 6,7,8 | 10 |

FIG. 18

| Pattern classification result | Addition value |
|---|---|
| 0,3,6 | 1 |
| 1,4,7 | 2 |
| 2,5,8 | 4 |

FIG. 19

| Pattern classification result | Addition value |
|---|---|
| 0,1,2 | 40 |
| 3,4,5 | 20 |
| 6,7,8 | 10 |

FIG. 20

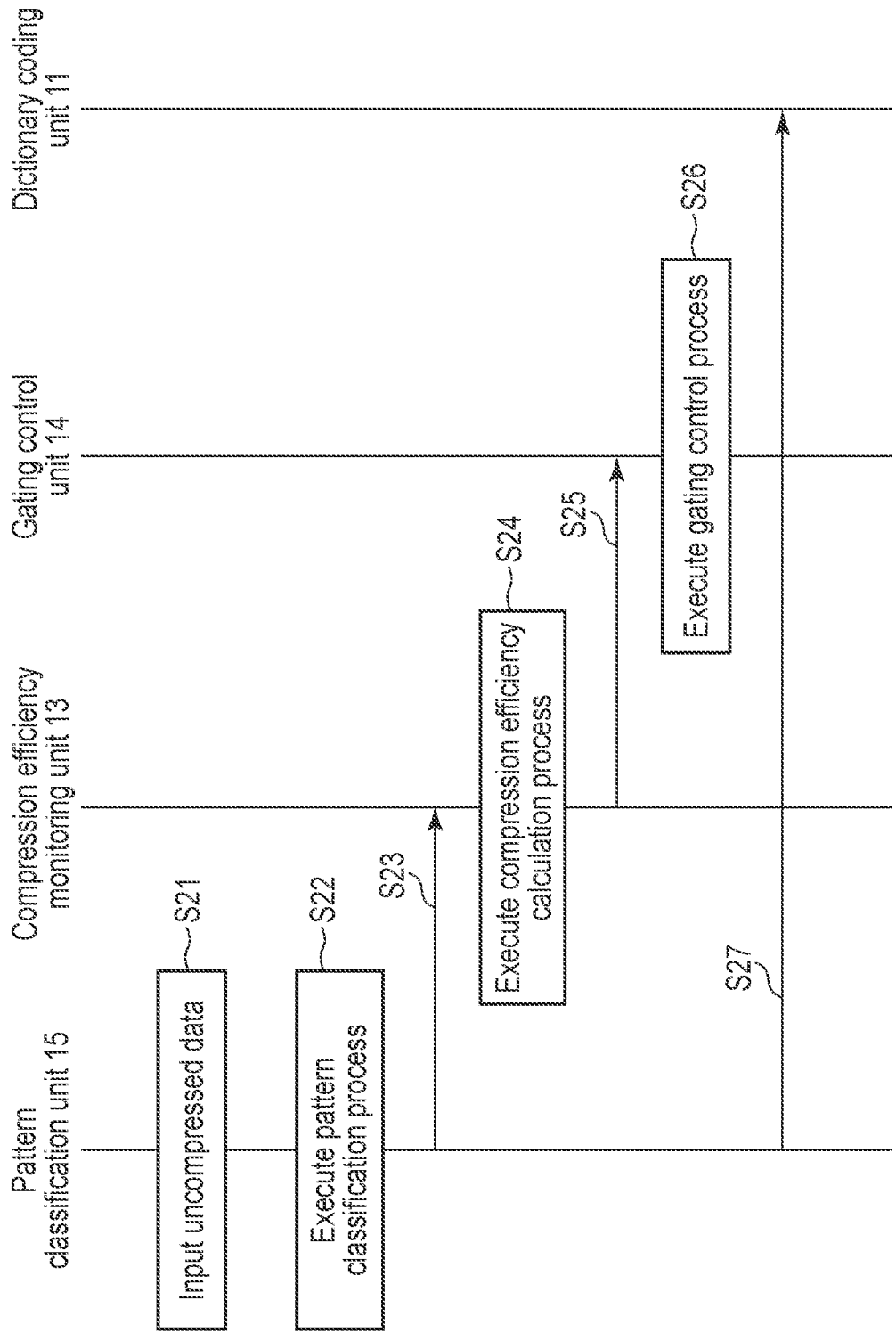
F I G. 21

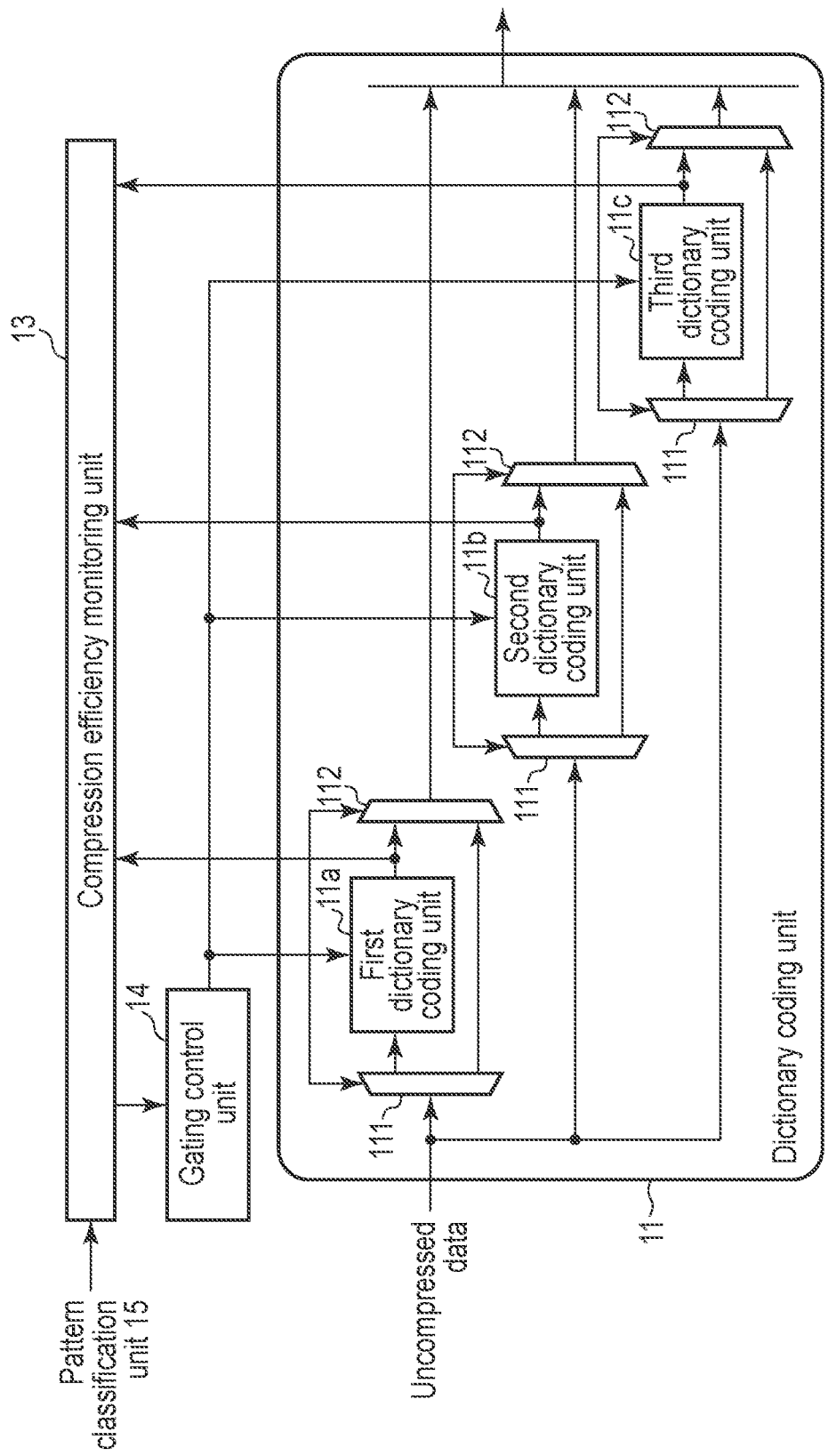
F I G. 22

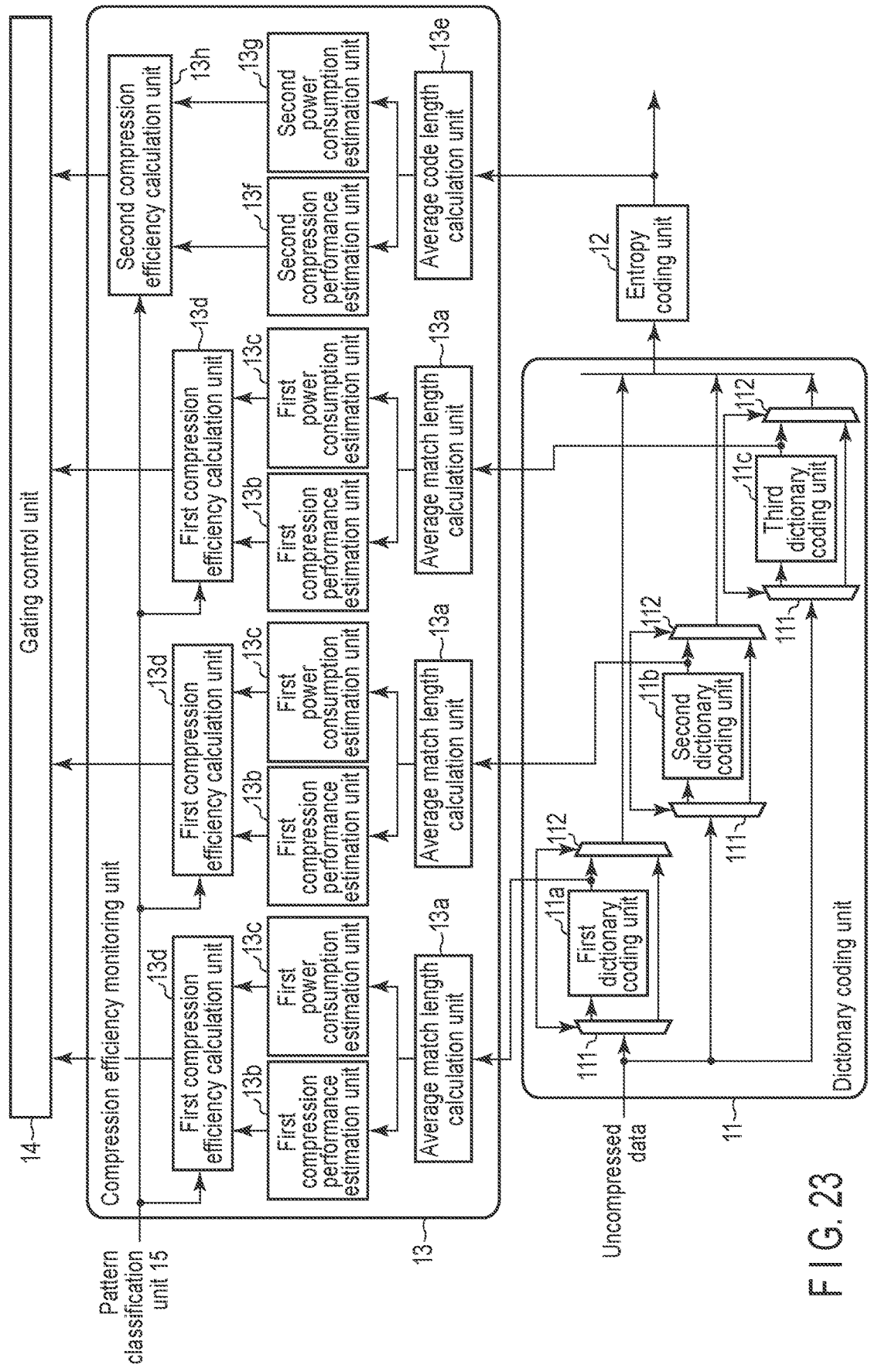
F I G. 23

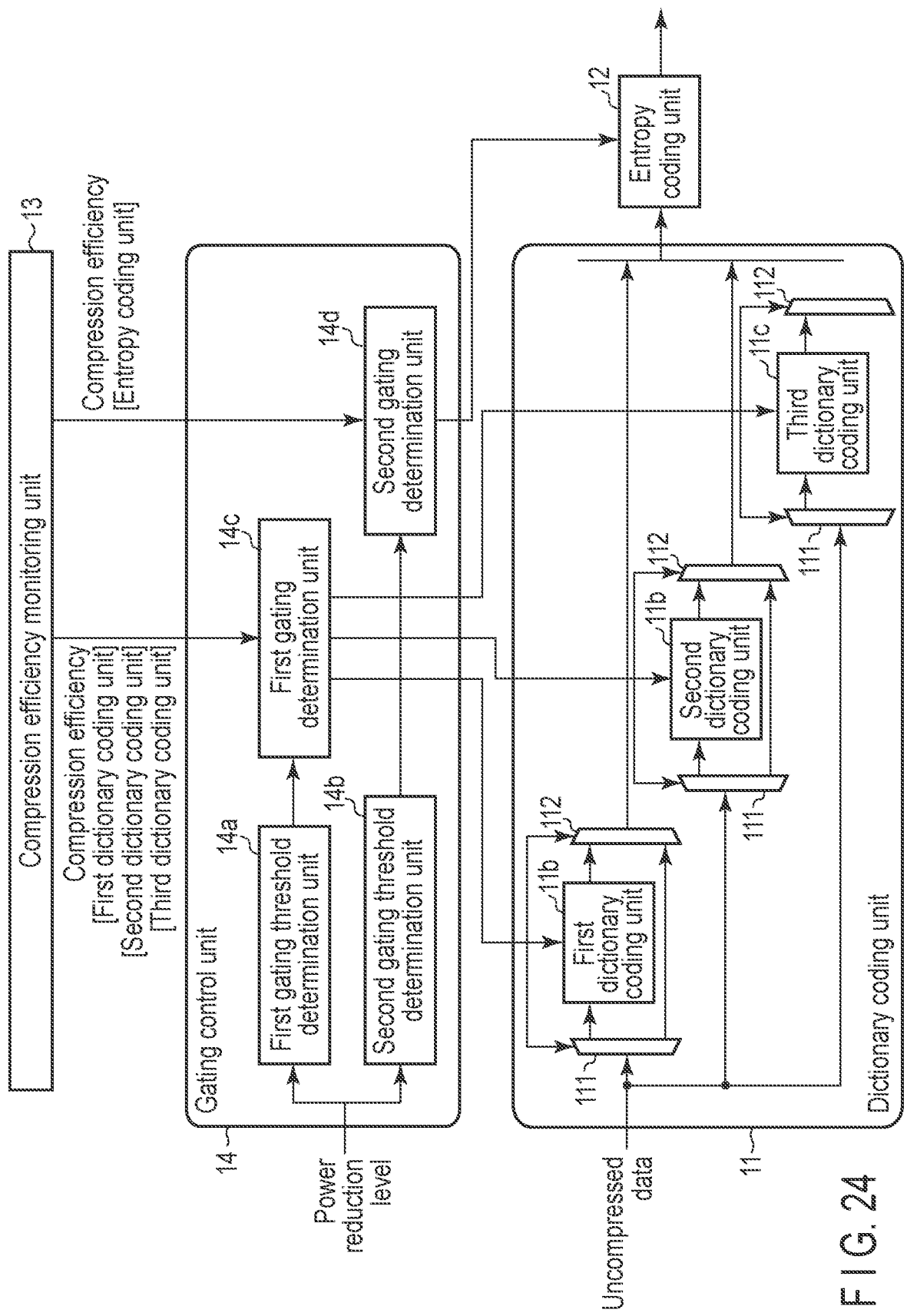
F I G. 24

| Trigger conditions | Clock gating target |
|---|---|
| Compression efficiency of first dictionary coding unit ≧ gating threshold && Compression efficiency of second dictionary coding unit < gating threshold && Compression efficiency of third dictionary coding unit < gating threshold | Second dictionary coding unit Third dictionary coding unit |
| Compression efficiency of second dictionary coding unit ≧ gating threshold && Compression efficiency of first dictionary coding unit < gating threshold && Compression efficiency of third dictionary coding unit < gating threshold | First dictionary coding unit Third dictionary coding unit |
| Compression efficiency of third dictionary coding unit ≧ gating threshold && Compression efficiency of first dictionary coding unit < gating threshold && Compression efficiency of second dictionary coding unit < gating threshold | First dictionary coding unit Second dictionary coding unit |
| Compression efficiency of first dictionary coding unit ≧ gating threshold && Compression efficiency of second dictionary coding unit ≧ gating threshold && Compression efficiency of third dictionary coding unit < gating threshold | Third dictionary coding unit |
| Compression efficiency of first dictionary coding unit ≧ gating threshold && Compression efficiency of third dictionary coding unit ≧ gating threshold && Compression efficiency of second dictionary coding unit < gating threshold | Second dictionary coding unit |
| Compression efficiency of third dictionary coding unit ≧ gating threshold && Compression efficiency of second dictionary coding unit ≧ gating threshold && Compression efficiency of first dictionary coding unit < gating threshold | First dictionary coding unit |
| Compression efficiency of first dictionary coding unit < gating threshold && Compression efficiency of second dictionary coding unit < gating threshold && Compression efficiency of third dictionary coding unit < gating threshold | First dictionary coding unit Second dictionary coding unit Third dictionary coding unit |

FIG. 25

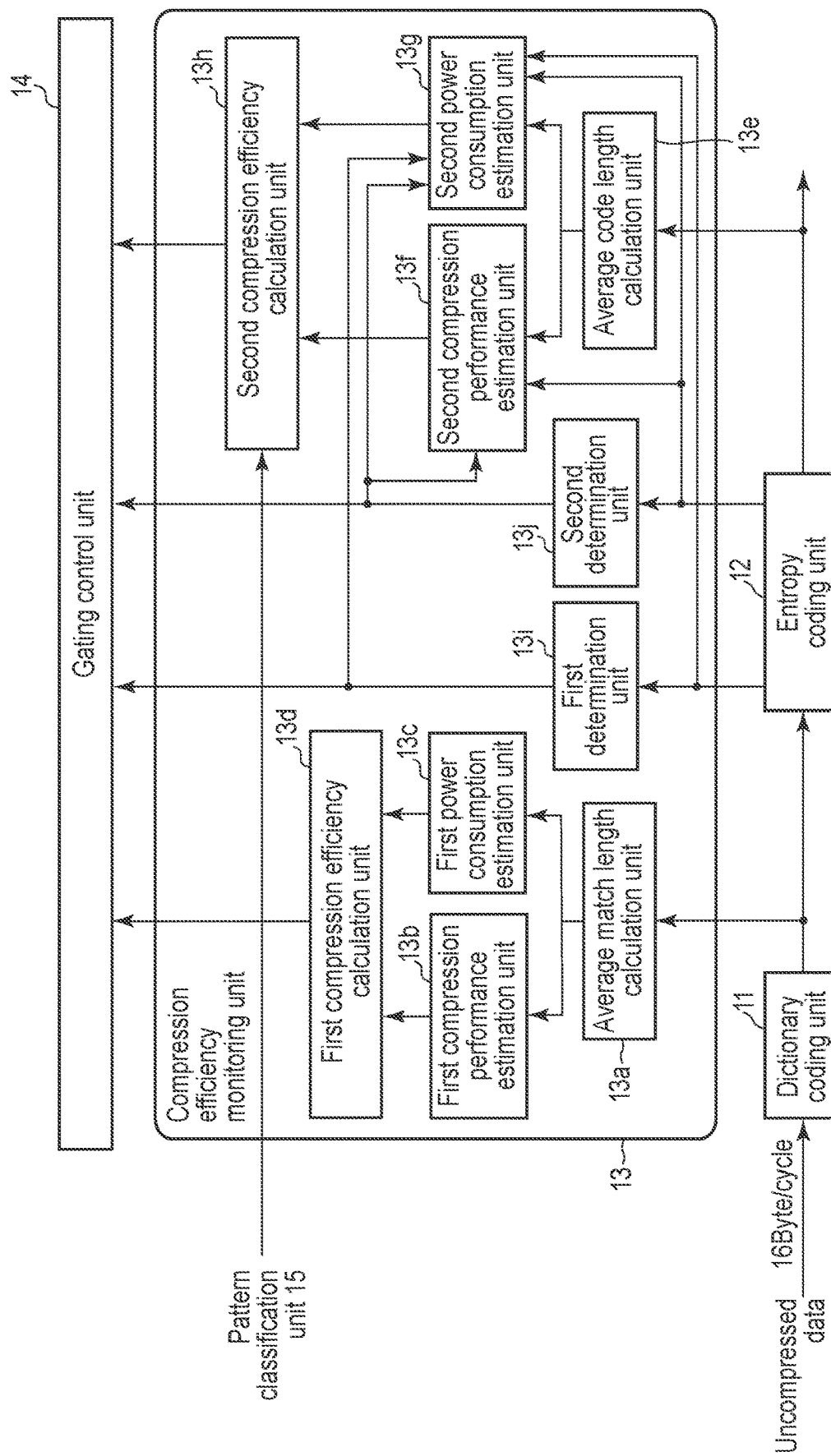
F I G. 27

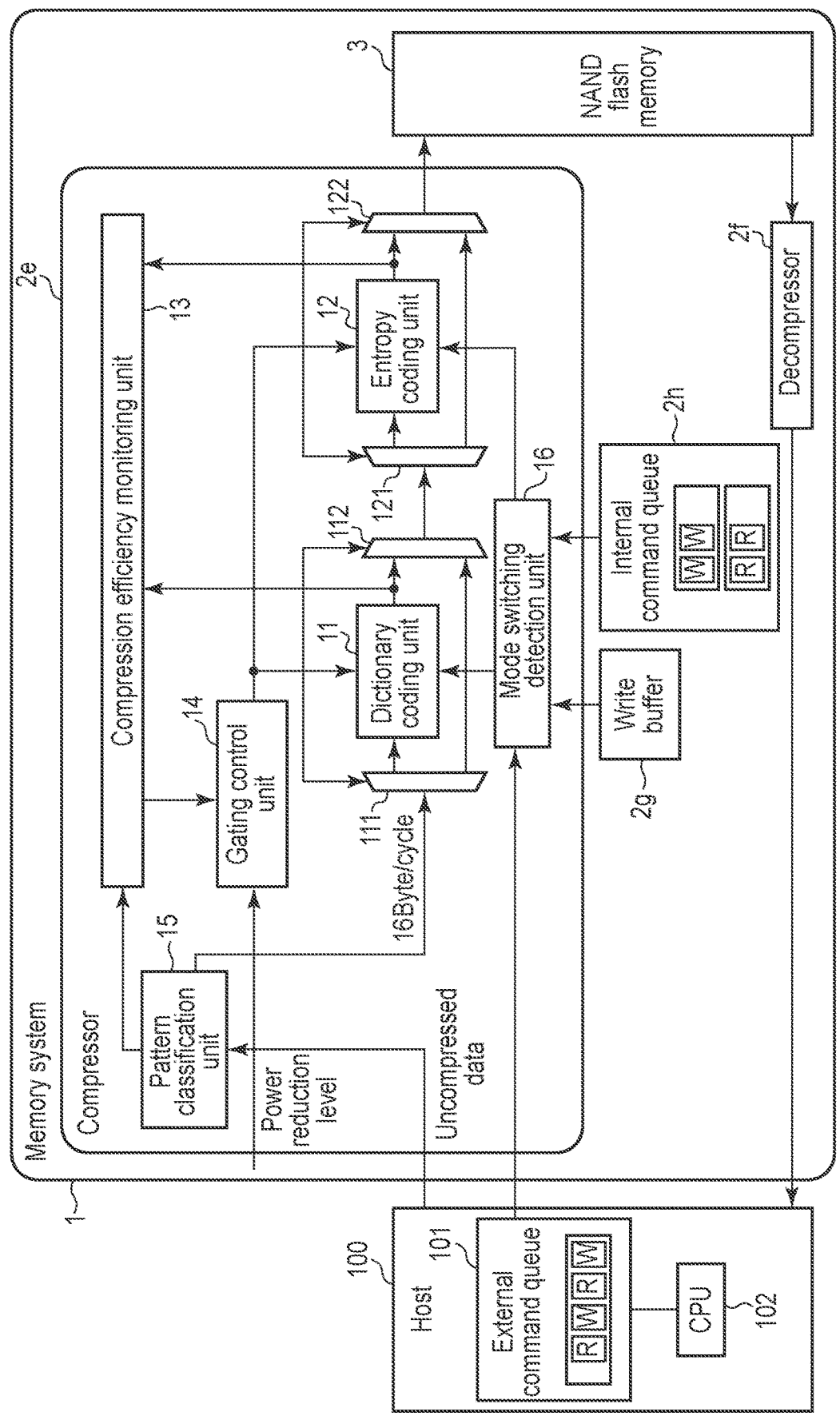
F I G. 29

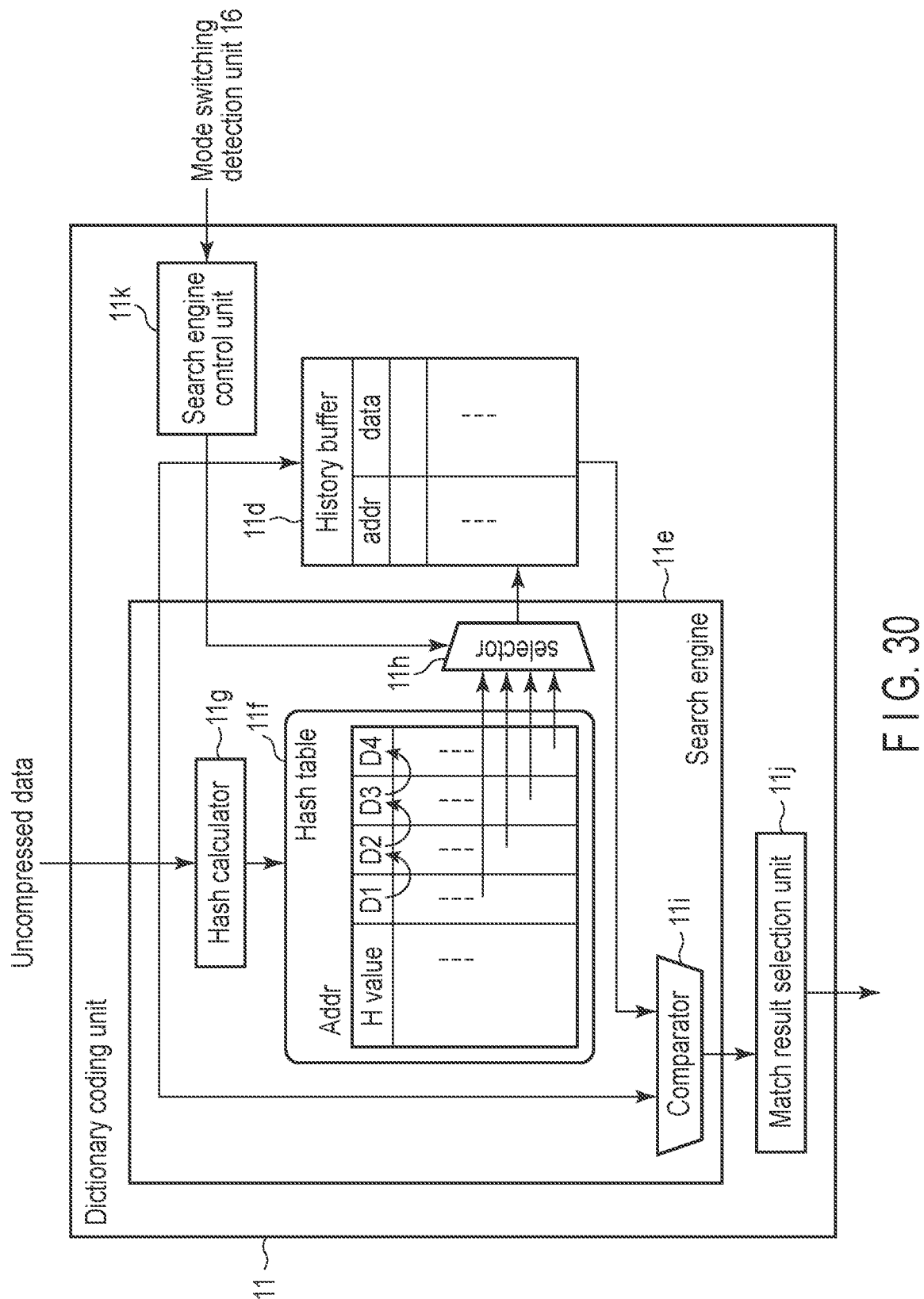
F I G. 30

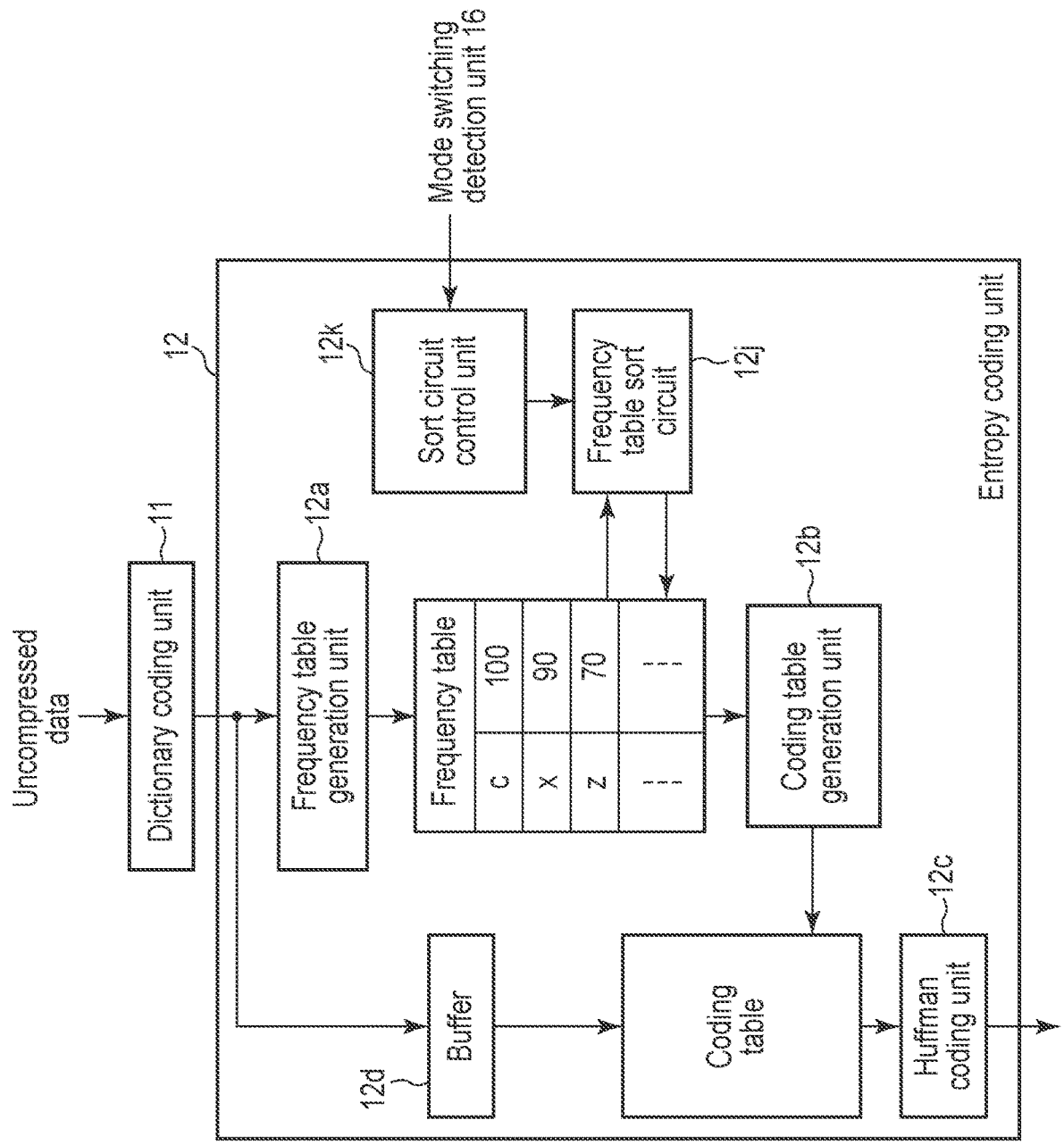
F I G. 31

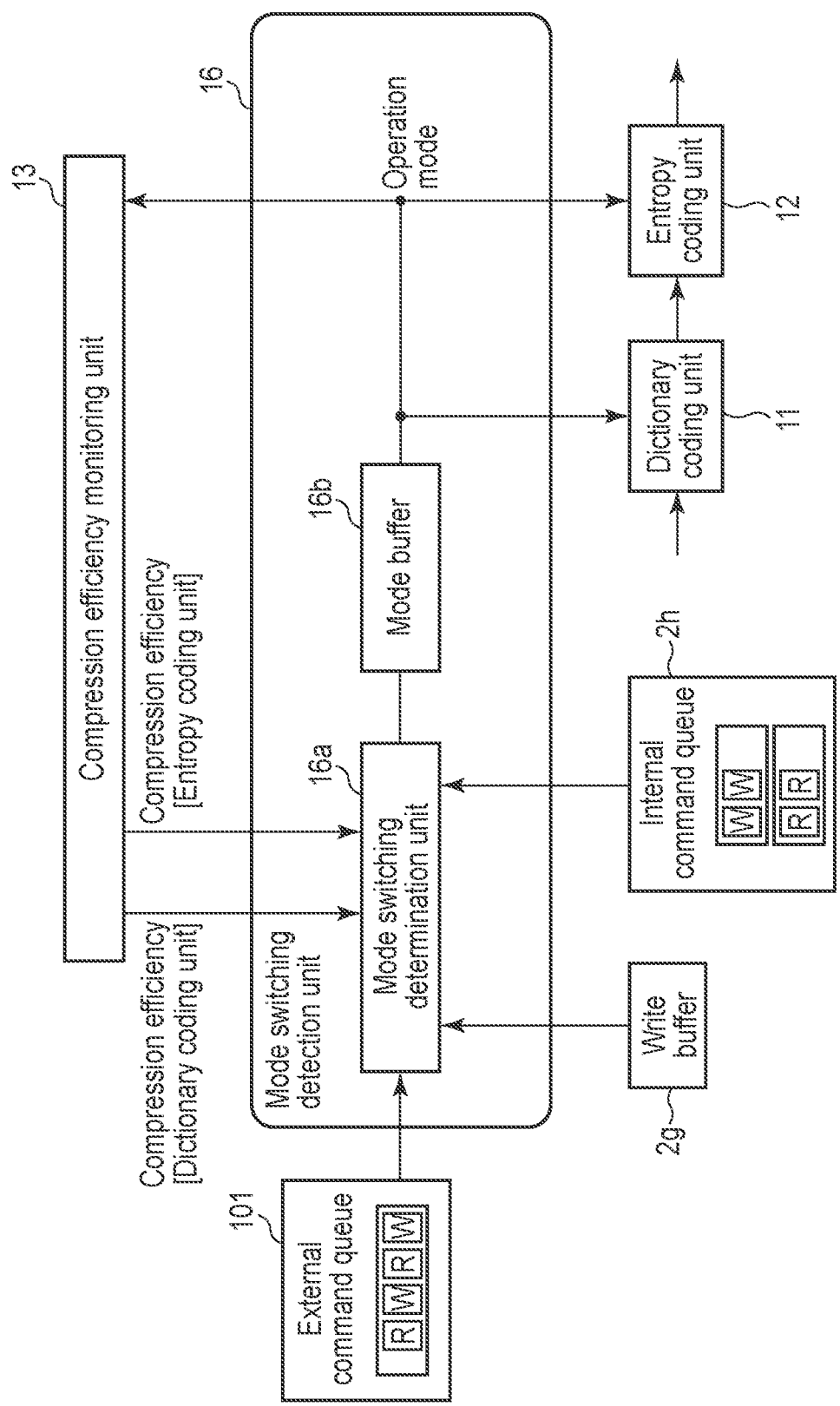
F I G. 33

| Average match length | Estimated value of power consumption | | |
|---|---|---|---|
| | Operation mode =high-speed low-compression mode | Operation mode =low-speed high-compression mode 0 | Operation mode =low-speed high-compression mode 1 |
| 1≦average match length<2 | 100 | 70 | 50 |
| 2≦average match length<4 | 90 | 60 | 40 |
| 4≦average match length<8 | 60 | 40 | 30 |
| 8≦average match length<16 | 40 | 30 | 20 |

FIG. 35

| Average code length | Estimated value of power consumption | | |
|---|---|---|---|
| | Operation mode =high-speed low-compression mode | Operation mode =low-speed high-compression mode 0 | Operation mode =low-speed high-compression mode 1 |
| 1≦average code length<2 | 20 | 10 | 5 |
| 2≦average code length<3 | 30 | 20 | 10 |
| 3≦average code length<6 | 50 | 40 | 20 |
| 6≦average code length<10 | 80 | 60 | 50 |

FIG. 36

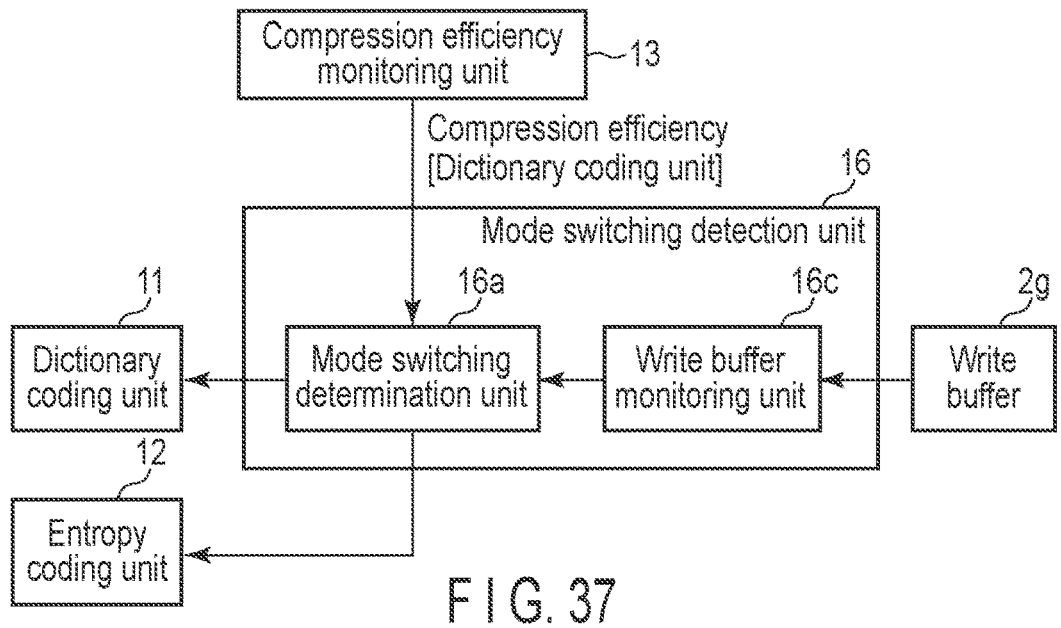

FIG. 37

| Switching condition of operation mode | Operation mode |
|---|---|
| Compressing efficiency of dictionary coding unit≧0.03&& free space of write buffer≧512Byte | Low-speed high-compression mode 0 |
| Compressing efficiency of dictionary coding unit≧0.03&& free space of write buffer≧768Byte | Low-speed high-compression mode 1 |

FIG. 38

| Switching condition of operation mode | Operation mode |
|---|---|
| Compressing efficiency of entropy coding unit≧0.05&& free space of write buffer≧512Byte | Low-speed high-compression mode 0 |
| Compression efficiency of entropy coding unit≧0.05&& free space of write buffer≧768Byte | Low-speed high-compression mode 1 |

FIG. 39

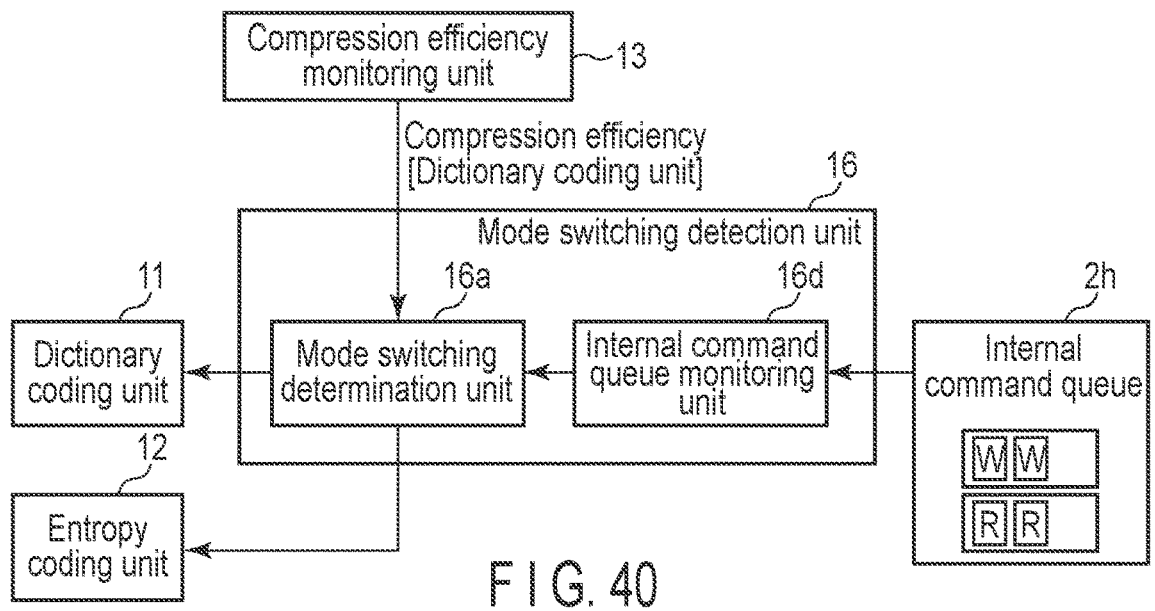

FIG. 40

| Switching condition of operation mode | Operation mode |
|---|---|
| Compressing efficiency of dictionary coding unit≧0.03&& the number of write commands in internal command queue≦32 | Low-speed high-compression mode 0 |
| Compressing efficiency of dictionary coding unit≧0.03&& the number of write commands in internal command queue≦16 | Low-speed high-compression mode 1 |

FIG. 41

| Switching condition of operation mode | Operation mode |
|---|---|
| Compressing efficiency of entropy coding unit≧0.05&& the number of write commands in internal command queue≦32 | Low-speed high-compression mode 0 |
| Compression efficiency of entropy coding unit≧0.05&& the number of write commands in internal command queue≦16 | Low-speed high-compression mode 1 |

FIG. 42

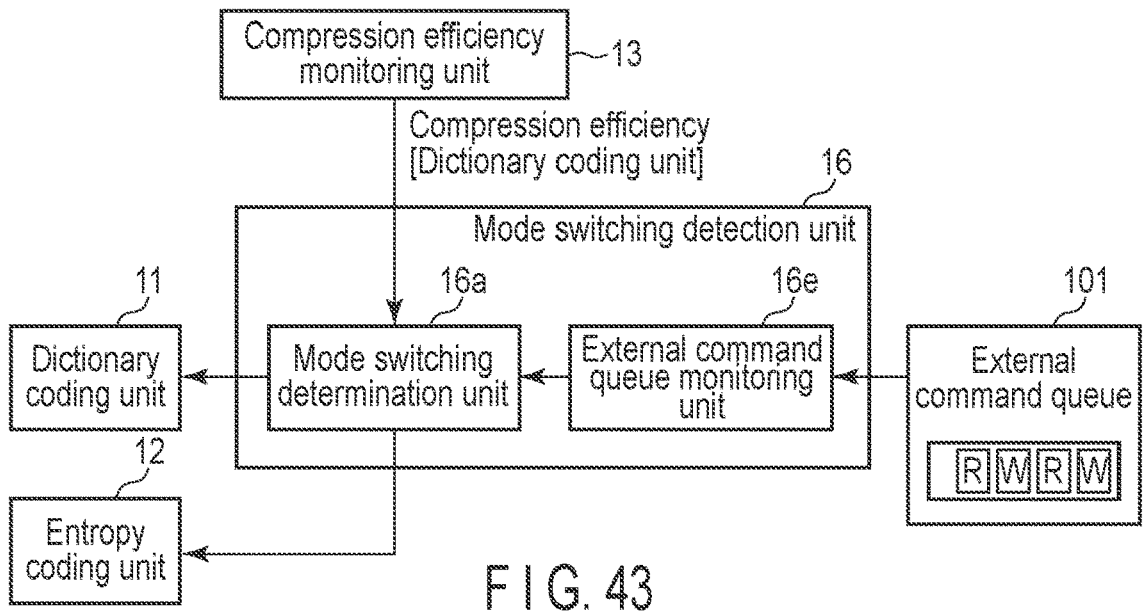

FIG. 43

| Switching condition of operation mode | Operation mode |
|---|---|
| Compressing efficiency of dictionary coding unit≧0.03&& the number of write command in external write command queue≦64 | Low-speed high-compression mode 0 |
| Compressing efficiency of dictionary coding unit≧0.03&& the number of write command in external write command queue≦32 | Low-speed high-compression mode 1 |

FIG. 44

| Switching condition of operation mode | Operation mode |
|---|---|
| Compressing efficiency of entropy coding unit≧0.05&& the number of write command in external write command queue≦64 | Low-speed high-compression mode 0 |
| Compression efficiency of entropy coding unit≧0.05&& the number of write command in external write command queue≦32 | Low-speed high-compression mode 1 |

FIG. 45

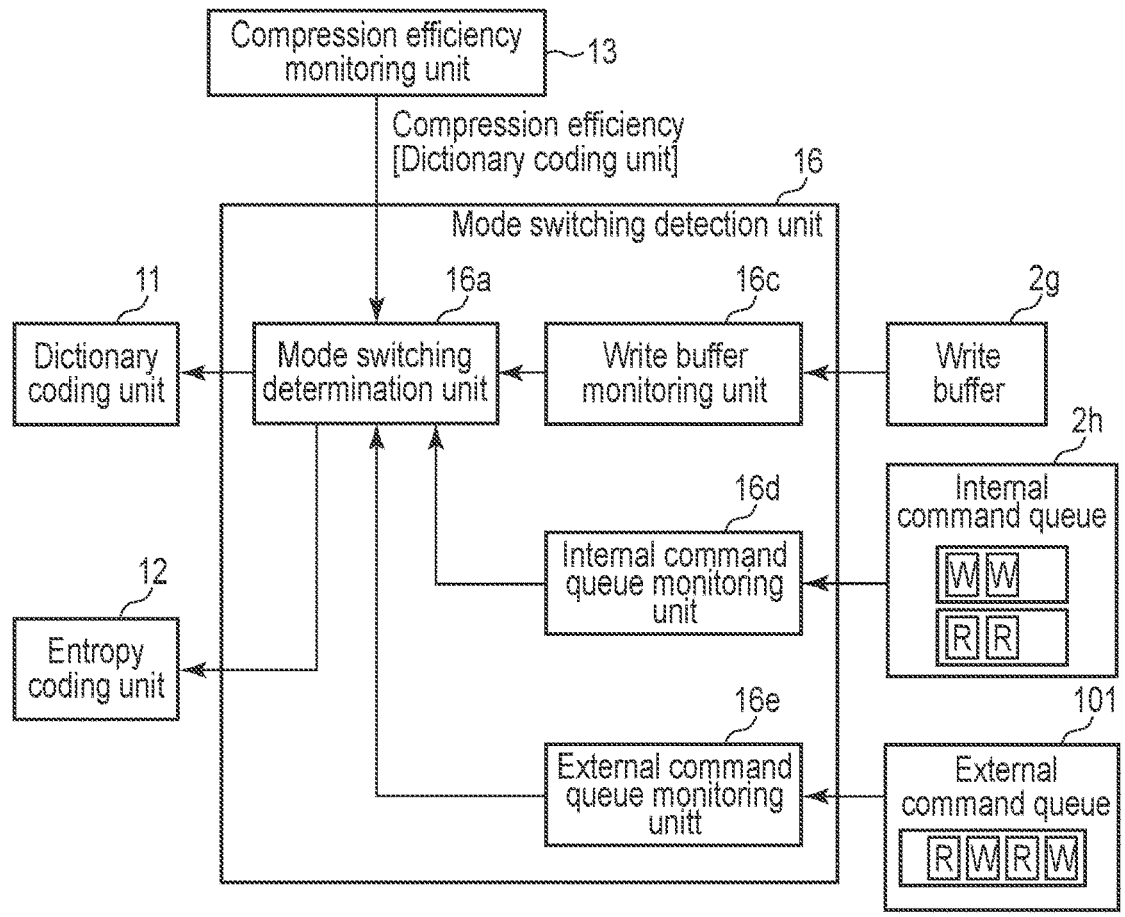

FIG. 46

| Switching condition of operation mode | Operation mode |
|---|---|
| Compressing efficiency of dictionary coding unit $\geq$ 0.03&& free space of write buffer $\geq$ 512Byte&& the number of write commands in internal command queue $\leq$ 32&& the number of write command in external write command queue $\leq$ 64 | Low-speed high-compression mode 0 |
| Compressing efficiency of dictionary coding unit $\geq$ 0.03&& free space of write buffer $\geq$ 768Byte&& the number of write commands in internal command queue $\leq$ 16&& the number of write command in external write command queue $\leq$ 32 | Low-speed high-compression mode 1 |

FIG. 47

| Switching condition of operation mode | Operation mode |
|---|---|
| Compressing efficiency of entropy coding unit≧0.05&& free space of write buffer≧512Byte&& the number of write commands in internal command queue≦32&& the number of write command in external write command queue≦64 | Low-speed high-compression mode 0 |
| Compressing efficiency of entropy coding unit≧0.05&& free space of write buffer≧768Byte&& the number of write commands in internal command queue≦16&& the number of write command in external write command queue≦32 | Low-speed high-compression mode 1 |

FIG. 48

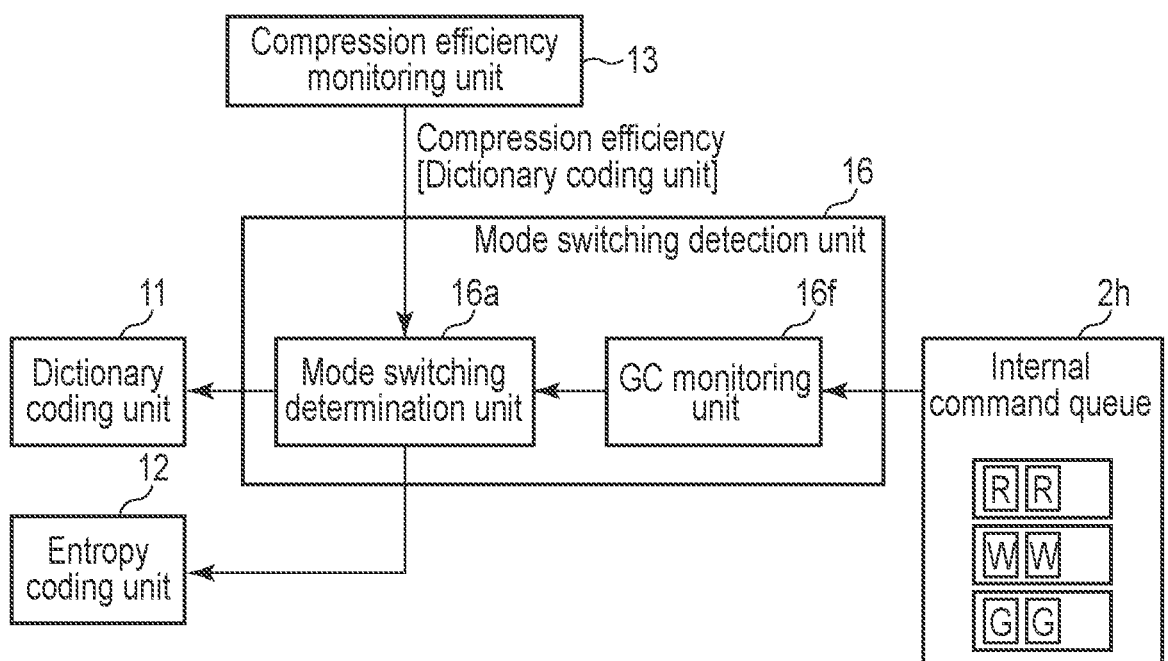

FIG. 49

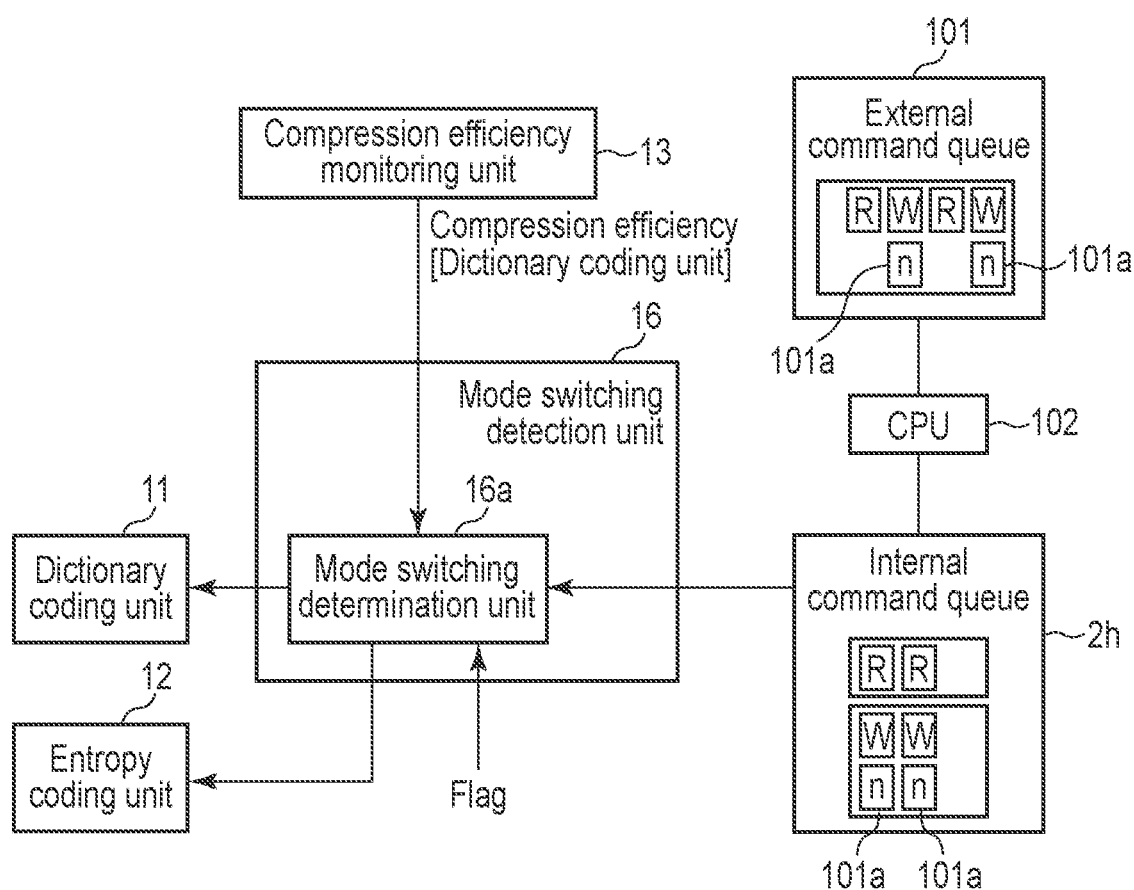
F I G. 50

MEMORY SYSTEM

CROSS-REFERENCE TO RELATED APPLICATIONS

This application is based upon and claims the benefit of priority from Japanese Patent Application No. 2021-026455, filed Feb. 22, 2021, the entire contents of which are incorporated herein by reference.

FIELD

Embodiments described herein relate generally to a memory system.

BACKGROUND

In recent years, there is known a memory system capable of compressing write data specified in a write command issued from a host and then writing the compressed write data to a non-volatile memory (NAND flash memory or the like).

In such a memory system, since a memory area of the non-volatile memory can be effectively used, and the amount of writing to the non-volatile memory due to, for example, garbage collection (GC) can be reduced, it is possible to obtain the effect that amplification can be reduced.

On the other hand, there is a concern that power consumption will increase due to the compression process of the write data described above or the like. In order to optimize the operating cost of the memory system, it is preferable that the efficiency (gain) obtained by compressing the write data exceeds the cost of the power consumption that increases due to the compression of the write data.

BRIEF DESCRIPTION OF THE DRAWINGS

FIG. 1 is a block diagram schematically illustrating an example of a hardware configuration of a memory system according to a first embodiment.

FIG. 2 is a diagram illustrating an example of a configuration of a compressor according to the first embodiment.

FIG. 3 is a diagram illustrating an example of a configuration of a compression efficiency monitoring unit according to the first embodiment.

FIG. 4 is a diagram illustrating an example of a configuration of a gating control unit according to the first embodiment.

FIG. 6 is a diagram illustrating an example of a first compression performance table according to the first embodiment.

FIG. 7 is a diagram illustrating an example of a first power consumption table according to the first embodiment.

FIG. 8 is a diagram illustrating an example of a first threshold table according to the first embodiment.

FIG. 10 is a diagram illustrating an example of a second compression performance table according to the first embodiment.

FIG. 11 is a diagram illustrating an example of a second power consumption table according to the first embodiment.

FIG. 12 is a diagram illustrating an example of a second threshold table according to the first embodiment.

FIG. 13 is a diagram illustrating an example of a configuration of a compressor according to a second embodiment.

FIG. 14 is a diagram illustrating an example of a configuration of a pattern classification unit according to the second embodiment.

FIG. 15 is a diagram illustrating an example of a classification table according to the second embodiment.

FIG. 16 is a diagram illustrating an example of a configuration of a compression efficiency monitoring unit according to the second embodiment.

FIG. 17 is a diagram illustrating an example of a first addition value table according to the second embodiment.

FIG. 18 is a diagram illustrating an example of a second addition value table according to the second embodiment.

FIG. 19 is a diagram illustrating an example of a third addition value table according to the second embodiment.

FIG. 20 is a diagram illustrating an example of a fourth addition value table according to the second embodiment.

FIG. 21 is a sequence chart illustrating an example of a processing procedure of the compressor according to the second embodiment.

FIG. 22 is a diagram illustrating an example of a configuration of a dictionary coding unit according to a third embodiment.

FIG. 23 is a diagram illustrating an example of a configuration of a compression efficiency monitoring unit according to the third embodiment.

FIG. 24 is a diagram illustrating an example of a configuration of a gating control unit according to the third embodiment.

FIG. 25 is a diagram illustrating an example of a gating control table according to the third embodiment.

FIG. 27 is a diagram illustrating an example of a configuration of a compression efficiency monitoring unit according to the fourth embodiment.

FIG. 29 is a diagram illustrating an example of a configuration of a compressor according to a sixth embodiment.

FIG. 30 is a diagram for describing an operation of a dictionary coding unit according to the sixth embodiment.

FIG. 31 is a diagram for describing an operation of an entropy coding unit according to the sixth embodiment.

FIG. 33 is a diagram illustrating an example of a configuration of a mode switching detection unit according to the sixth embodiment.

FIG. 35 is a diagram illustrating an example of a third power consumption table according to the sixth embodiment.

FIG. 36 is a diagram illustrating an example of a fourth power consumption table according to the sixth embodiment.

FIG. 37 is a diagram for describing a first configuration according to a seventh embodiment.

FIG. 38 is a diagram illustrating an example of a first operation mode table according to the seventh embodiment.

FIG. 39 is a diagram illustrating another example of the first operation mode table according to the seventh embodiment.

FIG. 40 is a diagram for describing a second configuration according to the seventh embodiment.

FIG. 41 is a diagram illustrating an example of a second operation mode table according to the seventh embodiment.

FIG. 42 is a diagram illustrating another example of the second operation mode table according to the seventh embodiment.

FIG. 43 is a diagram for describing a third configuration according to the seventh embodiment.

FIG. 44 is a diagram illustrating an example of a third operation mode table according to the seventh embodiment.

FIG. 45 is a diagram illustrating another example of the third operation mode table according to the seventh embodiment.

FIG. 46 is a diagram for describing a configuration in which the first to third configurations according to the seventh embodiment are combined.

FIG. 47 is a diagram illustrating an example of an operation mode table used in the configuration in which the first to third configurations according to the seventh embodiment are combined.

FIG. 48 is a diagram illustrating another example of the operation mode table used in the configuration in which the first to third configurations according to the seventh embodiment are combined.

FIG. 49 is a diagram for describing a fourth configuration according to the seventh embodiment.

FIG. 50 is a diagram for describing a fifth configuration according to the seventh embodiment.

DETAILED DESCRIPTION

Figure 5:
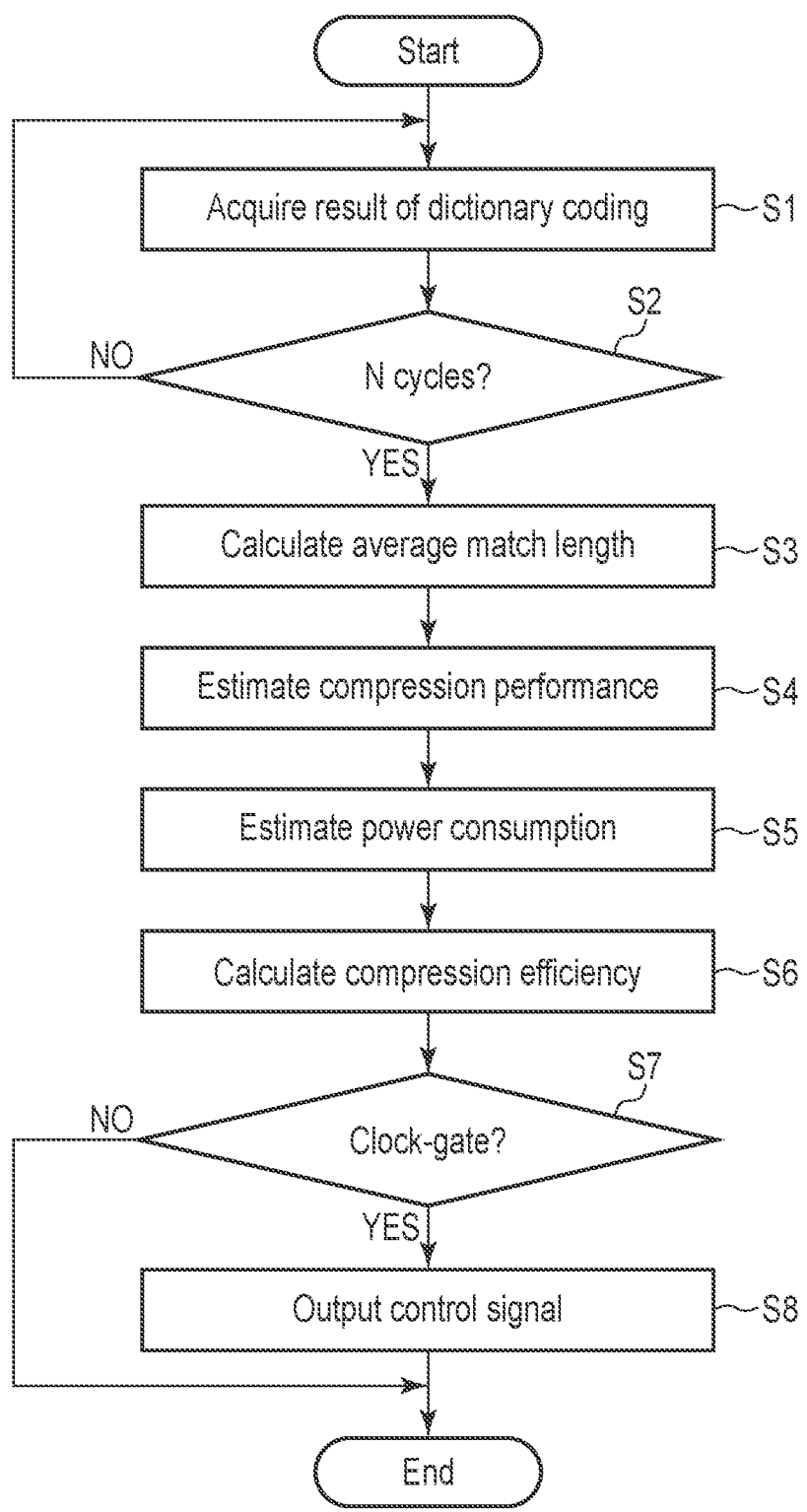
FIG. 5 is a flowchart illustrating an example of a processing procedure of a gating process for a dictionary coding unit according to the first embodiment.

Various embodiments will be described hereinafter with reference to the accompanying drawings.

In general, according to one embodiment, a memory system includes a compressor configured to output second data obtained by compressing input first data and a non-volatile memory to which third data based on the second data output from the compressor is written. The compressor includes a dictionary coding unit configured to perform dictionary coding on the first data and output a result of the dictionary coding, an entropy coding unit configured to perform entropy coding on the result of the dictionary coding and output the result of the entropy coding as the second data, a first calculation unit configured to calculate compression efficiencies of the dictionary coding and the entropy coding, and a first control unit configured to control an operation of at least one of the dictionary coding unit and the entropy coding unit for fourth data input to the compressor based on the calculated compression efficiencies and a power reduction level input to the compressor.

First Embodiment

First, a first embodiment will be described. FIG. 1 is a block diagram schematically illustrating an example of a hardware configuration of a memory system according to a first embodiment.

A memory system 1 illustrated in FIG. 1 is a semiconductor storage device configured to write data to a non-volatile memory and read data from the non-volatile memory. The memory system 1 can be realized as, for example, a solid state drive (SSD).

The memory system 1 is configured to be connectable to a host 100 via a system bus such as a PCI Express bus. As illustrated in FIG. 1, the memory system 1 includes a controller 2, a NAND flash memory 3, and a dynamic random access memory (DRAM) 4.

The controller 2 has a function of controlling an operation of the memory system 1. The controller 2 includes a host interface (I/F) 2a, a CPU 2b, a NAND interface (I/F) 2c, a DRAM interface (I/F) 2d, and the like. Note that the host interface 2a, the CPU 2b, the NAND interface 2c, and the DRAM interface 2d are connected to each other via, for example, a bus.

The host interface 2a is a host interface circuit configured to execute communication with the host 100 arranged outside the memory system 1. The host interface 2a may be, for example, a PCI Express controller or the like. The host interface 2a receives various commands (requests) from the host 100.

The CPU 2b is a processor configured to control the host interface 2a, the NAND interface 2c, and the DRAM interface 2d. The CPU 2b loads a control program (firmware) from a NAND flash memory 3 or a read only memory (not illustrated) into a DRAM 4 in response to power-on of the memory system 1, and executes the control program to perform various processes. Specifically, the CPU 2b executes processes on various commands issued from host 100. Note that some or all of the processes on the command issued from the host 100 may be executed by dedicated hardware in the controller 2.

The NAND interface 2c is a memory control circuit configured to control the NAND flash memory 3 under the control of the CPU 2b.

Further, the controller 2 includes a compressor (compression device) 2e and a decompressor (decompression device) 2f.

The compressor 2e is used to input data (write data) specified in the write command and compress the data when a write command is issued from the host 100, for example. Note that the compressor 2e compresses data by a compression method that combines dictionary coding and entropy coding. The data (hereinafter, referred to as compressed data) compressed in the compressor 2e is output from the compressor 2e, and then predetermined processes such as error correction process and a randomization process is executed. The CPU 2b writes data obtained by executing the predetermined process on the compressed data to the NAND flash memory 3 via the NAND interface 2c. That is, the CPU 2b writes the data based on the compressed data output from the compressor 2e to the NAND flash memory 3.

For example, when reading the compressed data from the NAND flash memory 3 based on a read command received from the host 100 via the host interface 2a, the CPU 2b reads the data based on the read command from the NAND flash memory 3 via the NAND interface 2c. The predetermined process such as the error correction process and randomization cancellation process is executed on the data, and then the read data is input to the decompressor 2f by the CPU 2b as the compressed data, and the decompressor 2f decomposes the input compressed data. That is, the decompressor 2f decompresses the compressed data based on the data read from the NAND flash memory 3.

The NAND flash memory 3 is a non-volatile memory and includes a memory cell array including a plurality of memory cells arranged in a matrix. The NAND flash memory 3 may be a NAND flash memory of a two-dimensional structure or a NAND flash memory of a three-dimensional structure.

A memory cell array of the NAND flash memory 3 includes a plurality of blocks BLK0 to BLKm-1. Each of the blocks BLK0 to BLKm-1 is organized by a plurality of pages (here, pages P0 to Pn-1). The blocks BLK0 to BLKm-1 function as erase units. Each of the pages P0 to Pn-1 includes a plurality of memory cells connected to the same word line. The pages P0 to Pn-1 are units of data write operation and data read operation.

Here, the memory system 1 has been described as including the NAND flash memory 3, but the memory system 1 may be include, for example, a phase change memory (PCM) or a magnetoresistive random access memory (MRAM) as the non-volatile memory.

The DRAM 4 is a volatile memory, and functions as, for example, a temporary buffer for software executed in the controller 2 (CPU 2b) or a temporary buffer for the NAND flash memory 3.

Here, the memory system 1 is described as including the DRAM 4, but the memory system 1 may include, for example, a static random access memory (SRAM) or the like as the volatile memory.

Although the compressor 2e and the decompressor 2f have been described as being incorporated in the controller 2 in FIG. 1, the compressor 2e and the decompressor 2f may be provided outside the controller 2.

Further, in the first embodiment, the compressor 2e and the decompressor 2f are described as being realized by hardware, but a part or all of the compressor 2e and the decompressor 2f may be realized by software, and may be realized by a combination of the software and hardware.

Hereinafter, an example of the configuration of the compressor 2e illustrated in FIG. 1 will be described with reference to FIG. 2. As illustrated in FIG. 2, the compressor 2e includes a dictionary coding unit 11, an entropy coding unit 12, a compression efficiency monitoring unit 13, and a gating control unit 14.

The write data specified in the write command issued from the host 100 is input to the compressor 2e, but in the following description, the write data is referred to as uncompressed data for convenience.

The dictionary coding unit 11 inputs the uncompressed data input to the compressor 2e and performs dictionary coding on the uncompressed data. The dictionary coding is a coding method for converting uncompressed data (byte string) into a relative reference of data (byte string) older than the uncompressed data.

The dictionary coding unit 11 includes a buffer for storing past data (hereinafter, referred to as a history buffer), and in the dictionary coding, when the past data that matches the uncompressed data is searched from the history buffer (dictionary buffer), a set of a position (that is, a distance up to a reference start position) in the history buffer where the past data is stored and a length (hereinafter, referred to as a match length) that matches the past data matching the write data is output from the dictionary coding unit 11 as the result of the dictionary coding. On the other hand, when the past data matching the uncompressed data is not searched from the history buffer, the uncompressed data is output from the dictionary coding unit 11 as the result of the dictionary coding.

In the dictionary coding in the first embodiment, for example, an algorithm called LZ77 can be applied, and when the LZ77 is applied, the uncompressed data output from the dictionary coding unit 11 as the result of the dictionary coding is called a literal when the past data is not searched from the history buffer as described above. The algorithm applied in the dictionary coding is not limited to the LZ77.

Further, in the first embodiment, a throughput of the dictionary coding unit 11 is 16 bytes/cycle. A cycle corresponds to the process (operation) unit of the dictionary coding unit 11. In the case of 16 bytes/cycle, the dictionary coding unit 11 operates to input the uncompressed data by 16 bytes for each cycle, and output the result of the dictionary coding for each cycle.

A size of the history buffer described above is, for example, 4 KiB, but the history buffer may have a size other than 4 KiB. Further, assuming that the above-described uncompressed data is a character string and one character is represented by 1 byte, the match length output as the result of the dictionary coding in the first embodiment has, for example, a minimum value of 4, a maximum value of 16, and the like.

The entropy coding unit 12 performs entropy coding on the result of the dictionary coding output from the dictionary coding unit 11. The result of the dictionary coding includes the distance, the match length, and the uncompressed data, and when these are referred to as a symbol, the entropy coding refers to a coding method of converting the symbol (data) into a code having a code length according to an appearance frequency of the symbol. In other words, the entropy coding refers to a coding method of reducing the code amount as a whole by assigning codes having different code lengths to the data by utilizing the difference in the appearance frequency of the data.

As described above, the symbols such as the distance, the match length, and the uncompressed data are output from the dictionary coding unit 11, and the entropy coding unit 12 outputs the code (code assigned to the symbol) converted from the symbols as the result of the entropy coding for the symbols.

In the entropy coding in the first embodiment, for example, an algorithm called a Huffman code can be applied. According to the Huffman code, the symbols (distance, match length, and uncompressed data) output from the dictionary coding unit 11 as the result of the dictionary coding can be variable-length coded. The Huffman coding may be static Huffman coding in which coding is performed using a pre-constructed coding table (code tree) or dynamic Huffman coding in which a coding table (code tree) is changed based on the input symbol (data). The algorithm applied in the entropy coding is not limited to the Huffman coding.

Further, in the first embodiment, the throughput of the entropy coding unit 12 is 16 bytes/cycle in terms of the uncompressed data. That is, the entropy coding unit 12 operates to input the result (the result of the dictionary coding equivalent to 16 byte uncompressed data) of the dictionary coding for 16 byte uncompressed data for each cycle, and output the result (the code assigned to the symbol) of the entropy coding for each cycle.

The result of the entropy coding is output from the compressor 2e as the compressed data, and is written to the NAND flash memory (memory cell array) 3 after the predetermined process is executed as described above.

Here, the compression efficiency monitoring unit 13 acquires (collects) the result of the dictionary coding and the result of the entropy coding output from the dictionary coding unit 11 and the entropy coding unit 12 for each cycle as described above. The compression efficiency monitoring unit 13 monitors the coding by the dictionary coding unit 11 and the entropy coding unit 12 based on the obtained results of the dictionary coding result and the entropy coding, and calculates (estimates) the compression efficiency of the dictionary coding unit 11 (that is, dictionary coding) and the entropy coding unit 12 (that is, entropy coding). The compression efficiency calculated by the compression efficiency monitoring unit 13 corresponds to the compression performance per power.

The gating control unit 14 inputs, for example, a power reduction level specified outside the compressor 2e (memory system 1), and controls clock gating of the dictionary coding (dictionary coding process) by the dictionary coding unit 11 and the entropy coding (that is, entropy coding process) by the entropy coding unit 12 based on the compression efficiency calculated by the compression efficiency monitoring unit 13 and the power reduction level.

Assuming that the dictionary coding unit 11 and the entropy coding unit 12 operate according to a clock signal corresponding to the cycle, for example, when the dictionary coding unit 11 is clock-gated, the clock signal for the dictionary coding unit 11 is stopped and the operation (dictionary coding process) of the dictionary coding unit 11 is skipped. Similarly, for example, when the entropy coding unit 12 is clock-gated, the clock signal for the entropy coding unit 12 is stopped, and the operation (entropy coding process) of the entropy coding unit 12 is skipped. In this way, according to the gating control unit 14, the operation of at least one of the dictionary coding unit 11 and the entropy coding unit 12 is controlled (clock gating control).

Further, as illustrated in FIG. 2, a front stage of the dictionary coding unit 11 is provided with a circuit 111 for selectively passing the uncompressed data to the dictionary coding unit 11, a rear stage of the dictionary coding unit 11 is provided with a circuit 112 corresponding to a multiplexer, and the clock gating for the above-described dictionary coding unit 11 is realized by outputting a control signal from the gating control unit 14 to the dictionary coding unit 11 and the circuits 111 and 112.

Similarly, a front stage of the entropy coding unit 12 is provided with a circuit 121 for selectively passing the result of the dictionary coding to the entropy coding unit 12, a rear stage of the entropy coding unit 12 is provided with a circuit 122 corresponding to a multiplexer, and the clock gating for the entropy coding unit 12 described above is realized by outputting a control signal from the gating control unit 14 to the entropy coding unit 12 and the circuits 121 and 122.

When the dictionary coding unit 11 is clock-gated by the gating control unit 14 and the entropy coding unit 12 is not clock-gated, since the operation of the dictionary coding unit 11 is skipped (uncompressed data passes through the dictionary coding), the entropy coding unit 12 performs the entropy coding on the uncompressed data (syntax data without the dictionary coding), and the result of the entropy coding is output from the compressor 2e.

On the other hand, when the dictionary coding unit 11 is not clock-gated by the gating control unit 14 and the entropy coding unit 12 is clock-gated, since the operation of the entropy coding unit 12 is skipped (the result of the dictionary coding passes through the entropy coding), the result (syntax data without the entropy coding) of the dictionary coding is output from the compressor 2e.

In addition, when both the dictionary coding unit 11 and the entropy coding unit 12 are clock-gated by the gating control unit 14, the uncompressed data that has passed through both the dictionary coding and the entropy coding is output from the compressor 2e.

The compressed data (the uncompressed data, the result of the dictionary coding result, or the result of the entropy coding) output from the compressor 2e in response to the clock gating by the above-described gating control unit 14 is subjected to the predetermined process as described above, and then written to the NAND flash memory 3.

Although the detailed description is omitted here, the data written to the NAND flash memory 3 is read based on the read command issued from the host 100, decompressed by the decompressor 2f, and then returned to the host.

Next, an example of the configuration of the compression efficiency monitoring unit 13 illustrated in FIG. 2 will be described with reference to FIG. 3. In the first embodiment, the compression efficiency monitoring unit 13 is configured to calculate the compression efficiency of the dictionary coding unit 11 and the entropy coding unit 12, respectively. As illustrated in FIG. 3, the compression efficiency monitoring unit 13 includes an average match length calculation unit 13a, a first compression performance estimation unit 13b, a first power consumption estimation unit 13c, a first compression efficiency calculation unit 13d, an average code length calculation unit 13e, a second compression performance estimation unit 13f, a second power consumption estimation unit 13g, and a second compression efficiency calculation unit 13h.

Here, when the dictionary coding is performed by the dictionary coding unit 11, the set of the distance and the match length or the uncompressed data as the result of the dictionary coding is output from the dictionary coding unit 11 for each cycle. The average match length calculation unit 13a acquires (inputs) the result of dictionary coding output for each cycle, and calculates the average match length based on the result of the dictionary coding. Specifically, the average match length calculation unit 13a calculates, for example, the average value of the results (match lengths) of the dictionary coding corresponding to latest N cycles as the average match length. The number of match lengths input to the average match length calculation unit 13a for each cycle changes depending on how many matches can encode 16 bytes of the input uncompressed data. When 16 bytes of the input uncompressed data can be encoded by one match (match length=16), the number of match lengths per cycle is at least one. When all 16 bytes of the input uncompressed data are encoded by the literal, the number of match lengths per cycle is up to 16 (literal is treated as match length=0). Note that N is, for example, 32.

In this case, an average match length LAVE is calculated by the following Equation (1), where a set of match lengths m output from the dictionary coding unit 11 before t (0 to 31) cycles of the latest 32 cycles is M(t).

$$A_{Ave}[\Sigma_{t=0\sim31}\Sigma_{m\in M(t)}m]/32 \hspace{2em} \text{Equation (1)}$$

Note that when the uncompressed data (literal) is output as the result of the dictionary coding from the dictionary coding unit 11, the literal is treated as match length=0.

The first compression performance estimation unit 13b estimates the compression performance of the dictionary coding unit 11 based on the average match length calculated by the average match length calculation unit 13a.

The first power consumption estimation unit 13c estimates the power consumption of the dictionary coding unit 11 based on the average match length calculated by the average match length calculation unit 13a.

The first compression efficiency calculation unit 13d calculates the compression efficiency of the dictionary coding unit 11 based on the compression performance estimated by the first compression performance estimation unit 13b and the power consumption estimated by the first power consumption estimation unit 13c. The compression efficiency of the dictionary coding unit 11 calculated by the first compression efficiency calculation unit 13d is output from the compression efficiency monitoring unit 13 to the gating control unit 14.

On the other hand, when the entropy coding is performed by the entropy coding unit 12, the code assigned to the result (symbol) of the dictionary coding is output from the entropy coding unit 12 for each cycle as the result of the entropy coding. The average code length calculation unit 13e acquires (inputs) the result of the entropy coding output for each cycle, and calculates the average code length based on the result of the entropy coding. Specifically, the average code length calculation unit 13e calculates, for example, the average value of the results (code lengths of code) of the entropy coding corresponding to latest M cycles as the average code length. The number of code lengths input to the average code length calculation unit 13e for each cycle changes depending on how many matches can encode 16 bytes of the input uncompressed data in the dictionary coding unit. When 16 bytes of the input uncompressed data can be encoded by one match (match length=16), the number of code lengths per cycle is at least one. When all16 bytes of the input uncompressed data is encoded by the literal, the number of code lengths per cycle is up to 16. Note that M is, for example, 16.

In this case, an average code length CAVE is calculated by the following Equation (2), where a set of match lengths c of code output from the entropy coding unit 12 before t (0 to 15) cycles of the latest 16 cycles is C(t).

$$C_{Ave} = [\Sigma_{t=0-15} \Sigma_{c \in C(t)} c]/16 \qquad \text{Equation (2)}$$

The second compression performance estimation unit 13f estimates the compression performance of the entropy coding unit 12 based on the average match length calculated by the average code length calculation unit 13e.

The second power consumption estimation unit 13g estimates the power consumption of the entropy coding unit 12 based on the average code length calculated by the average code length calculation unit 13e.

The second compression efficiency calculation unit 13h calculates the compression efficiency of the entropy coding unit 12 based on the compression performance estimated by the second compression performance estimation unit 13f and the power consumption estimated by the second power consumption estimation unit 13g. The compression efficiency of the entropy coding unit 12 calculated by the second compression efficiency calculation unit 13h is output from the compression efficiency monitoring unit 13 to the gating control unit 14.

Next, an example of the configuration of the gating control unit 14 illustrated in FIG. 2 will be described with reference to FIG. 4. As illustrated in FIG. 4, the gating control unit 14 includes a first gating threshold determination unit 14a, a second gating threshold determination unit 14b, a first gating determination unit 14c, and a second gating determination unit 14d.

Here, in the first embodiment, the gating control unit 14 is configured to input a power reduction level designated externally.

In this case, the first gating threshold determination unit 14a determines a threshold (gating threshold of the dictionary coding unit 11) for clock-gating the dictionary coding unit 11 based on the input power reduction level.

Similarly, the second gating threshold determination unit 14b determines a threshold (gating threshold of the entropy coding unit 12) for clock-gating the entropy coding unit 12 based on the input power reduction level.

The first gating determination unit 14c determines whether to clock-gate the dictionary coding unit 11 (that is, to skip the operation of the dictionary coding unit 11) based on the gating threshold determined by the first gating threshold determination unit 14a and the compression efficiency of the dictionary coding unit 11 output from the compression efficiency monitoring unit 13 as described above.

Similarly, the second gating determination unit 14d determines whether to clock-gate the entropy coding unit 12 (that is, to skip the operation of the entropy coding unit 12) based on the gating threshold determined by the second gating threshold determination unit 14b and the compression efficiency of the entropy coding unit 12 output from the compression efficiency monitoring unit 13 as described above.

The first gating determination unit 14c controls the operation of the dictionary coding unit 11 by transmitting a control signal related to the clock gating to the dictionary coding unit 11 based on the determination result by the first gating determination unit 14c. Similarly, the second gating determination unit 14d controls the operation of the entropy coding unit 12 by transmitting the control signal related to the clock gating to the entropy coding unit 12 based on the determination result by the second gating determination unit 14d.

The control signal related to the above-described clock gating is also transmitted to the circuits 111 and 112 provided in the front and rear stages of the dictionary coding unit 11, but the circuits 111 and 112 are omitted in FIG. 4. The same applies to the circuits 121 and 122 provided in the front and rear stages of the entropy coding unit 12.

Hereinafter, the operation of the compressor 2e in the first embodiment will be described. Here, the process (hereinafter, referred to as the gating process for the dictionary coding unit 11) of the compressor 2e when clock-gating the dictionary coding unit 11 and the process (hereinafter, referred to as the gating process for the entropy coding unit 12) of the compressor 2e when clock-gating the entropy coding unit 12 will be described. In the following, the process of the compression efficiency monitoring unit 13 and the gating control unit 14 included in the compressor 2e will be mainly described.

First, an example of the processing procedure of the gating process for the dictionary coding unit 11 will be described with reference to the flowchart of FIG. 5.

When the dictionary coding is performed in dictionary coding unit 11 as described above, the average match length calculation unit 13a included in the compression efficiency monitoring unit 13 acquires the result of the dictionary coding (step S1). The result of the dictionary coding acquired in step S1 is the result of the dictionary coding corresponding to one cycle, and is held in the compression efficiency monitoring unit 13 (or the average match length calculation unit 13a).

Next, assuming that the average match length is calculated from the match lengths corresponding to the N cycles as described above, the average match length calculation unit 13a determines whether or not the results of the dictionary coding corresponding to the N cycles have been acquired (step S2).

When it is determined that the results of the dictionary coding corresponding to the N cycles have not been acquired (NO in step S2), the process returns to step S1 and the process is repeated.

On the other hand, when it is determined that the results of the dictionary coding corresponding to the N cycles have been acquired (YES in step S2), the average match length calculation unit 13a calculates the average values of the results of the dictionary coding (match length) corresponding to the N cycles held in the compression efficiency monitoring unit 13 as the average match length (step S3). Since the calculation of the average match length is as described above, a detailed description thereof will be omitted here.

Next, the first compression performance estimation unit 13b estimates the compression performance of the dictionary coding unit 11 based on the average match length calculated in step S3 (step S4).

In this embodiment, the compression performance of the dictionary coding unit 11 can be estimated by referring to, for example, the first compression performance table illustrated in FIG. 6. As illustrated in FIG. 6, the first compression performance table stores the estimated value of the compression performance corresponding to the range of the average match length. In the first embodiment, the range of allowable values of the average match length is 0 or more and less than 16. In the first compression performance table, it is defined that the longer the average match length, the higher the compression performance (that is, the higher the estimated value).

The first compression performance estimation unit 13b acquires the estimated value of the compression performance stored in the first compression performance table in which the average match length calculated in step S3 with the range of the average match length by referring to the above-described first compression performance table.

It is assumed that the above-described first compression performance table is prepared in advance in the compression efficiency monitoring unit 13.

Here, the case of estimating the compression performance of the dictionary coding unit 11 using the first compression performance table has been described, but the compression performance may be estimated by another method such as using a predetermined calculation formula (function or the like).

In addition, the first power consumption estimation unit 13c estimates the compression performance of the dictionary coding unit 11 based on the average match length calculated in step S3 (step S5).

In the first embodiment, the power consumption of the dictionary coding unit 11 can be estimated by referring to, for example, the first power consumption table illustrated in FIG. 7. As illustrated in FIG. 7, the first power consumption table stores the estimated value of the power consumption corresponding to the range of the average match length. In the first power consumption table, it is defined that the shorter the average match length, the larger the power consumption (that is, the higher the estimated value).

The first power consumption estimation unit 13c associates the average match length calculated in step S3 with the range of the average match length by referring to the above-described first power consumption table to acquire the estimated value of the power consumption stored in the first power consumption table.

For example, it has been previously obtained from knowledge that the shorter the average match length shown by the above-described first power consumption table, the larger the power consumption, and the first power consumption table is previously prepared in the compression efficiency monitoring unit 13.

Here, the case of estimating the power consumption of the dictionary coding unit 11 using the first power consumption table has been described, but the power consumption may be estimated by another method such as using a predetermined calculation formula (function or the like).

In the example illustrated in FIG. 5, for convenience, the processes are described as being executed in the order of steps S4 and S5, but the processes of steps S4 and S5 may be executed interchangeably (that is, the process of step S5 may be executed before the process of step S4), and the process of steps S4 and S5 may be executed in parallel.

Next, the first compression efficiency calculation unit 13d calculates the compression efficiency of the dictionary coding unit 11 based on the estimated value of the compression performance acquired by the first compression performance estimation unit 13b by executing the process of step S4 and the estimated value of the power consumption acquired by the first power consumption estimation unit 13c by executing the process of step S5 (step S6). In step S6, it is assumed that the calculation is performed by, for example, dividing the estimated value of the compression performance by the estimated value of the power consumption. The compression efficiency of the dictionary coding unit 11 calculated in step S6 is calculated as a value in the range of 0 to 1, for example.

Here, the compression efficiency of the dictionary coding unit 11 calculated in step S6 will be specifically described using the first compression performance table illustrated in FIG. 6 and the first power consumption table illustrated in FIG. 7 described above.

First, assuming that the average match length calculated in step S3 is 2.5, 2 is acquired as the estimated value of the compression performance by referring to the first compression performance table. Similarly, by referring to the first power consumption table, 90 is acquired as the estimated value of the power consumption.

In this case, in step S6, 2/90≈0.0222 is calculated as the compression efficiency of the dictionary coding unit 11.

As described above, the compression efficiency of the dictionary coding unit 11 calculated in step S6 is output from the compression efficiency monitoring unit 13 to the gating control unit 14.

Here, it is assumed that the first gating threshold determination unit 14a included in the above-described gating control unit 14 determines the gating threshold of the dictionary coding unit 11 based on the power reduction level specified externally. It is assumed that the gating threshold of the dictionary coding unit 11 can be determined by referring to, for example, the first threshold table illustrated in FIG. 8. As illustrated in FIG. 8, the first threshold table stores the threshold (that is, the gating threshold of the dictionary coding unit 11) of the compression efficiency corresponding to the power reduction level.

In the first embodiment, the power reduction level is represented by a numerical value from 0 to 4 (that is, set in 5 levels), for example. In the first threshold table, it is defined that the higher the power reduction level, the higher the threshold of compression efficiency.

According to such a first threshold table, the first gating threshold determination unit 14a can determine the threshold of the compression efficiency corresponding to the power reduction level specified externally as the gating threshold of the dictionary coding unit 11.

The first gating determination unit 14c acquires the compression efficiency of the dictionary coding unit 11 output from the compression efficiency monitoring unit 13 by executing the process of step S6 described above, and determines whether to clock-gate the dictionary coding unit 11 by comparing the compression efficiency and the gating threshold of the dictionary coding unit 11 (step S7).

In step S7, when the compression efficiency of dictionary coding unit 11 is less than the gating threshold of the dictionary coding unit 11, it is determined that the dictionary coding unit 11 is clock-gated (that is, the clock gating for the dictionary coding unit 11 is triggered). On the other hand, when the compression efficiency of the dictionary coding unit 11 is equal to or greater than the gating threshold of the dictionary coding unit 11, it is determined that the dictionary coding unit 11 is not clock-gated (that is, the clock gating for the dictionary coding unit 11 is not triggered).

When it is determined that the dictionary coding unit 11 is clock-gated (YES in step S7), the first gating determination unit 14c outputs a control signal for the clock-gating the dictionary coding unit 11 to the dictionary coding unit 11 (and circuits 111 and 112) (step S8). In this case, the dictionary coding unit 11 is clock-gated based on the control signal output in step S8, and the uncompressed data passes through the dictionary coding unit 11 (that is, the operation of the dictionary coding unit 11 is skipped).

On the other hand, when it is determined that the dictionary coding unit 11 is not clock-gated (NO in step S7), the process in step S8 is not executed. In this case, the dictionary coding unit 11 is not clock-gated, and the dictionary coding is performed on the uncompressed data input to the dictionary coding unit 11.

Note that the clock gating (trigger) for the above-described dictionary coding unit 11 is canceled, for example, with the passage of K cycle. In other words, when the clock gating for the dictionary coding unit 11 is triggered, the dictionary coding is not performed during the K cycle. K is, for example, 32. When the clock gating for the dictionary coding unit 11 is canceled, the process illustrated in FIG. 5 described above is executed again. When the process of step S8 is not executed and the dictionary coding unit 11 is not clock-gated, the process illustrated in FIG. 5 is executed again after the process illustrated in FIG. 5 ends.

Here, in the first embodiment, the fact that the dictionary coding unit 11 is clock-gated, the uncompressed data (literal) is the same that the uncompressed data (literal) is output as the result of the dictionary coding regardless of the uncompressed data input to the compressor 2e. Therefore, in the process after the dictionary coding unit 11, it is not necessary to recognize whether or not the dictionary coding unit 11 is clock-gated (that is, the trigger or cancellation of the clock gating).

According to the gating process for the above-described dictionary coding unit 11, when the compression efficiency calculated based on the result (achievement) of the dictionary coding by the dictionary coding unit 11 is less than the gating threshold of the dictionary coding unit 11, the dictionary coding unit 11 can be clock-gated.

Next, an example of the processing procedure of the gating process for the entropy coding unit 12 will be described with reference to the flowchart of FIG. 9.

When the entropy coding is performed in the entropy coding unit 12 as described above, the average code length calculation unit 13e included in the compression efficiency monitoring unit 13 acquires the result of the entropy coding (step S11). The result of the entropy coding acquired in step S11 is the result of the entropy coding for the result of the dictionary coding corresponding to one cycle, and is held in the compression efficiency monitoring unit 13 (or average code length calculation unit 13e).

Next, assuming that the average code length is calculated from the code lengths corresponding to M cycles as described above, the average code length calculation unit 13e determines whether or not the results of the entropy coding corresponding to the M cycles have been acquired. (Step S12).

When it is determined that the results of the dictionary coding corresponding to the M cycles have not been acquired (NO in step S12), the process returns to step S11 and the process is repeated.

On the other hand, when it is determined that the results of the dictionary coding corresponding to the M cycles have been acquired (YES in step S12), the average code length calculation unit 13e calculates the average values of the results of the entropy coding (code length) corresponding to the M cycles held in the compression efficiency monitoring unit 13 as the average code length (step S13). Since the calculation of the average code length is as described above, a detailed description thereof will be omitted here.

Next, the second compression performance estimation unit 13f estimates the compression performance of the entropy coding unit 12 based on the average match length calculated in step S13 (step S14).

In the first embodiment, the compression performance of the entropy coding unit 12 can be estimated by referring to, for example, the second compression performance table illustrated in FIG. 10. As illustrated in FIG. 10, the second compression performance table stores the estimated value of the compression performance corresponding to the range of the average code length. In the first embodiment, the range of allowable values of the average code length is 1 or more and less than 10. In the second compression performance table, it is defined that the shorter the average match length, the higher the compression performance (that is, the higher the estimated value).

The second compression performance estimation unit 13f associates the average match length calculated in step S13 with the range of the average match length by referring to the above-described second compression performance table to acquire the estimated value of the compression performance stored in the second compression performance table.

It is assumed that the above-described second compression performance table is prepared in advance in the compression efficiency monitoring unit 13.

Here, the case of estimating the compression performance of the entropy coding unit 12 using the second compression performance table has been described, but the compression performance may be estimated by another method such as using a predetermined calculation formula (function or the like).

Further, the second power consumption estimation unit 13g estimates the power consumption of the entropy coding unit 12 based on the average code length calculated in step S13 (step S15).

In the first embodiment, the power consumption of the entropy coding unit 12 can be estimated by referring to, for example, the second power consumption table illustrated in FIG. 11. As illustrated in FIG. 11, the second power consumption table stores the estimated value of the compression performance corresponding to the range of the average code length. In the first power consumption table, it is defined that the longer the average code length, the larger the power consumption (that is, the higher the estimated value).

The second power consumption estimation unit 13g associates the average match length calculated in step S13 with the range of the average match length by referring to the above-described second power consumption table to acquire the estimated value of the power consumption stored in the second power consumption table.

For example, it has been previously obtained from knowledge that the longer the average code length shown by the above-described first power consumption table, the larger the power consumption, and the first power consumption table is previously prepared in the compression efficiency monitoring unit 13.

Here, the case of estimating the power consumption of the entropy coding unit 12 using the second power consumption table has been described, but the power consumption may be estimated by another method such as using a predetermined calculation formula (function or the like).

Figure 9:
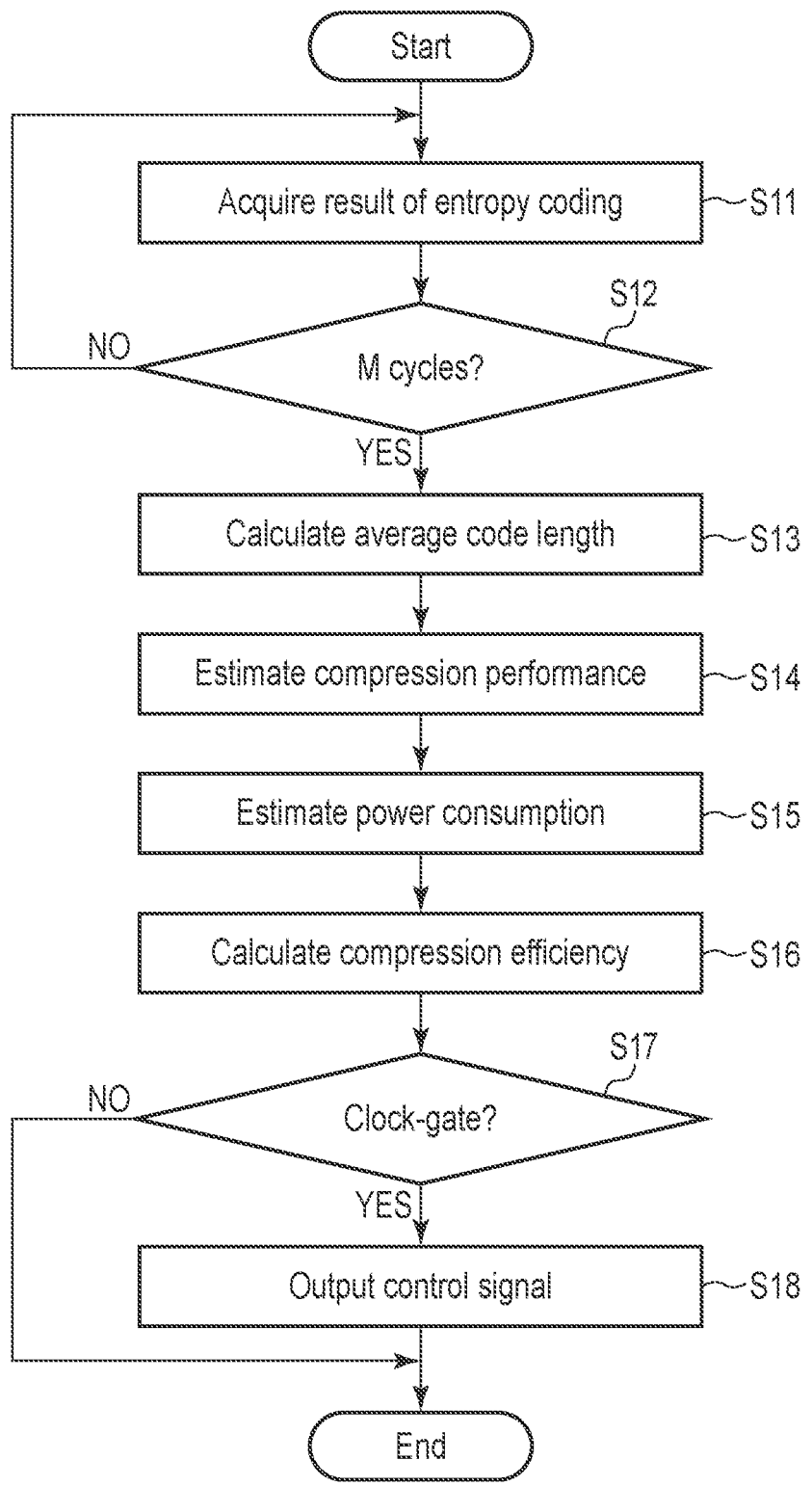
FIG. 9 is a diagram illustrating an example of a processing procedure of a gating process for an entropy coding unit according to the first embodiment.

In the example illustrated in FIG. 9, for convenience, the processes are described as being executed in the order of steps S14 and S15, but the processes of steps S14 and S15 may be executed interchangeably (that is, the process of step S15 may be executed before the process of step S14), and the process of steps S14 and S15 may be executed in parallel.

Next, the second compression efficiency calculation unit 13h calculates the compression efficiency of the entropy coding unit 12 based on the estimated value of the compression performance acquired by the second compression performance estimation unit 13f by executing the process of step S14 and the estimated value of the power consumption acquired by the second power consumption estimation unit 13g by executing the process of step S15 (step S16). In step S16, it is assumed that the calculation is performed by, for example, dividing the estimated value of the compression performance by the estimated value of the power consumption. The compression efficiency of the entropy coding unit 12 calculated in step S16 is calculated as a value in the range of 0 to 1, for example, as in the compression efficiency of the dictionary coding unit 11 described above.

As described above, the compression efficiency of the entropy coding unit 12 calculated in step S16 is output from the compression efficiency monitoring unit 13 to the gating control unit 14.

Here, it is assumed that the second gating threshold determination unit 14b included in the above-described gating control unit 14 determines the gating threshold of the entropy coding unit 12 based on the power reduction level specified externally. It is assumed that the gating threshold of the entropy coding unit 12 can be determined by referring to, for example, the second threshold table illustrated in FIG. 12. As illustrated in FIG. 12, the second threshold table stores the threshold (that is, the gating threshold of the entropy coding unit 12) of the compression efficiency in association with the power reduction level.

As described above, the power reduction level is represented by a numerical value of 0 to 4, and in the second threshold table, it is defined that the higher the power reduction level, the higher the threshold of the compression efficiency. The second threshold is the same as the above-described first threshold table in that the higher the power reduction level, the higher the threshold of the compression efficiency. However, considering the difference between the dictionary coding and the entropy coding, for example, the threshold of the compression efficiency stored in the second threshold table in association with the power reduction levels "2" and "4" is higher than that of the first threshold table.

According to such a second threshold table, the second gating threshold determination unit 14b can determine the threshold of the compression efficiency corresponding to the power reduction level specified externally as the gating threshold of the entropy coding unit 12.

The second gating determination unit 14d acquires the compression efficiency of the entropy coding unit 12 output from the compression efficiency monitoring unit 13 by executing the process of step S16 described above, and determines whether to clock-gate the entropy coding unit 12 by comparing the compression efficiency and the gating threshold of the entropy coding unit 12 (step S17).

In step S17, when the compression efficiency of the entropy coding unit 12 is less than the gating threshold of the entropy coding unit 12, it is determined that the entropy coding unit 12 is clock-gated (that is, the clock gating to the entropy coding unit 12 is triggered). On the other hand, when the compression efficiency of the entropy coding unit 12 is the gating threshold or more of the entropy coding unit 12, it is determined that the entropy coding unit 12 is not clock-gated (that is, the clock gating to the entropy coding unit 12 is not triggered).

When it is determined that the entropy coding unit 12 is clock-gated (YES in step S17), the second gating determination unit 14d outputs a control signal for the clock-gating the entropy coding unit 12 to the entropy coding unit 12 (and circuits 121 and 122) (step S18). In this case, the entropy coding unit 12 is clock-gated based on the control signal output in step S18, and the result of the entropy coding passes through the entropy coding unit 12 (that is, the operation of the entropy coding unit 12 is skipped).

On the other hand, when it is determined that the entropy coding unit 12 is not clock-gated (YES in step S17), the process in step S18 is not executed. In this case, the entropy coding unit 12 is not clock-gated, and the dictionary coding is performed on the result of the dictionary coding input to the entropy coding unit 12.

Note that the clock gating (trigger) for the above-described entropy coding unit 12 is canceled, for example, with the passage of K' cycle. In other words, when the clock gating for the entropy coding unit 12 is triggered, the entropy coding is not performed during the K cycle. K' is, for example, 64. When the clock gating for the entropy coding unit 12 is canceled, the process illustrated in FIG. 9 described above is executed again. When the process of step S18 is not executed and the entropy coding unit 12 is not clock-gated, the process illustrated in FIG. 9 is executed again after the process illustrated in FIG. 9 ends.

Here, in the first embodiment, when the entropy coding unit 12 is not clock-gated, the result of the entropy coding is output from the compressor 2e as the compressed data, and when the entropy coding unit 12 is clock-gated, the result of the dictionary coding is output from the compressor 2e as the compressed data. That is, when the decompressor 2f decompresses (decodes) the compressed data (compressed data read from the NAND flash memory 3) output from the compressor 2e in this way, the process executed in the decompressor 2f is different according to whether the entropy coding unit 12 is clock-gated. Therefore, when the trigger and cancellation of the clock gating are switched, the code indicating the switching (syntax switching) is added to the compressed data (compressed stream). The decompressor 2f can appropriately decompress the compressed data by referring to such a code.

According to the gating process for the above-described entropy coding unit 12, when the compression efficiency calculated based on the result (achievement) of the entropy coding by the entropy coding unit 12 is less than the gating threshold of the entropy coding unit 12, the entropy coding unit 12 can be clock-gated.

The first embodiment was described as determining the gating threshold of the dictionary coding unit 11 using the first threshold table illustrated in FIG. 8, and in the first threshold table, the threshold "0" of the compression efficiency is stored in association with the power reduction level "0". In addition, the compression efficiency of the dictionary coding unit 11 is a value in the range of 0 to 1 as described above. That is, when the power reduction level is 0, the compression efficiency of the dictionary coding unit 11 always exceeds the gating threshold, so that it is determined that the clock gating is not always triggered in step S7. On the other hand, in the first threshold table illustrated in FIG. 8, the compression efficiency threshold "1" is stored in association with the power reduction level "4". As a result, when the power reduction level is 4, the compression efficiency of the dictionary coding unit 11 is always less than the gating threshold, so it is determined that the clock gating is always triggered in step S7. Here, the gating threshold of the dictionary coding unit 11 has been described, but the same applies to the gating threshold of the entropy coding unit 12 determined by using the second threshold table illustrated in FIG. 12.

That is, the first embodiment has the configuration in which the dictionary coding unit 11 and the entropy coding unit 12 are always clock-gated or the dictionary coding unit 11 and the entropy coding unit 12 are always not clock-gated by adjusting the power reduction level, for example.

The gating thresholds of the dictionary coding unit 11 and the entropy coding unit 12 may be determined according to the power reduction level, and may be determined by, for example, the method that does not use the first threshold table and the second threshold table.

The first embodiment assumes that the gating process for the dictionary coding unit 11 (the process illustrated in FIG. 5) and the gating process for the entropy coding unit 12 (the process illustrated in FIG. 9) are executed independently, but the processes may be synchronized with each other, and the clock gating for the dictionary coding unit 11 and the entropy coding unit 12 may be controlled at the same timing, for example.

In addition, the first embodiment describes that the average match length calculation unit 13a calculates the average match length from the result of the dictionary coding corresponding to N cycles, and the average code length calculation unit 13e calculates the average code length from the result of the entropy coding corresponding to M cycles, but N may be the same value as M or may be a different value from M. The same applies to the number (K and K') of cycles until the clock gating for the dictionary coding unit 11 and the entropy coding unit 12 described above is canceled.

As described above, the memory system 1 according to the first embodiment includes the compressor 2e that outputs the compressed data (second data) obtained by compressing the input uncompressed data (first data) and the NAND flash memory 3 (non-volatile memory) in which data is written based on the compressed data (third data) output from the compressor 2e, and the compressor 2e includes the dictionary coding unit 11 that performs the dictionary coding on the uncompressed data (first data) and outputs the result of the dictionary coding, and the entropy coding unit 12 that performs the entropy coding on the result of the dictionary coding and outputs the result of the entropy coding as the compressed data. Further, in the first embodiment, the compressor 2e calculates the compression efficiency of the dictionary coding (dictionary coding unit 11) and the entropy coding (entropy coding unit 12), and controls the operation of at least one of the dictionary coding unit 11 and the entropy coding unit 12 for the uncompressed data (fourth data) based on the calculated compression efficiency and the power reduction level (power reduction level specified externally) input to the compressor 2e.

Specifically, in the first embodiment, when the operation of the dictionary coding unit 11 is skipped based on the control (that is, the dictionary coding unit 11 is clock-gated), the result of the entropy coding for the uncompressed data is output from the compressor 2e as the compressed data. Also, when the operation of the entropy coding unit 12 is skipped based on the control (that is, the entropy coding unit 12 is clock-gated), the result of the dictionary coding unit is output from the compressor 2e as the compressed data. Furthermore, when the operations of the dictionary coding unit 11 and the entropy coding unit 12 are skipped (that is, the dictionary coding unit 11 and the entropy coding unit 12 are clock gated), the uncompressed data is output from the compressor 2e.

In addition, in the first embodiment, the compression efficiency of the dictionary coding unit 11 is calculated from the result (achievement) of the dictionary coding by the dictionary coding unit 11, and the compression efficiency of the entropy coding unit 12 is calculated from the result (achievement) of the entropy coding by the entropy coding unit 12.

Specifically, the dictionary coding is the coding method of converting uncompressed data into a relative reference to data older than the data, the result of the dictionary coding includes the match length as the relative reference, and the compression efficiency of the dictionary coding unit 11 is calculated based on the match length (compression performance and power consumption based on the match length).

In addition, the entropy coding is a coding method of converting data (for example, the result of the dictionary coding) into a code having a code length according to an appearance frequency of the data, and the compression efficiency of the entropy coding unit 12 is calculated based on the code length (the compression performance and the power consumption based on the code length).

In the first embodiment, with such a configuration, the compression efficiency is calculated at any time from the dictionary coding and the result of the entropy coding, and when the compression efficiency is less than the threshold determined from the power reduction level, since the dictionary coding unit 11 and the entropy coding unit 12 are clock-gated, it is possible to avoid executing (consuming power) the compression process (dictionary coding process and entropy coding process) even though the compression efficiency is low. Therefore, in the first embodiment, the gain per power (compression performance) can be improved, and as a result, the power consumption can be suppressed and the data can be compressed efficiently.

For example, the configuration in which the compression process is simply skipped based on the input uncompressed data can be considered, but in the case of such a configuration, there is a possibility that the accuracy of the determination to skip the compression process is low, and the necessary compression process is skipped or the unnecessary compression process is not skipped.

On the other hand, since the first embodiment has a configuration of controlling (determining the skip of the compression process) the clock gating using the coding result (that is, the information of the achievement of the actual compression process) by the dictionary coding unit 11 and the entropy coding unit 12, it is possible to improve the determination accuracy (that is, the accuracy of the clock gating control) regarding the skip of the compression process as compared with the configuration in which the compression process is simply skipped based on the uncompressed data input as described above.

The first embodiment describes that separate compression efficiencies are calculated for the dictionary coding unit 11 and the entropy coding unit 12 as described in FIGS. 5 and 9 and the operations of each of the dictionary coding unit 11 and the entropy coding unit 12 are controlled based on the separately calculated compression efficiencies, but the compression efficiency monitoring unit 13 may be configured to calculate one compression efficiency, and collectively control the operations of the dictionary coding unit 11 and the entropy coding unit 12 based on the one compression efficiency. The compression efficiency in such a configuration may be calculated from, for example, the compression efficiencies of the dictionary coding unit 11 and the compression efficiency of the entropy coding unit 12 described above, and may be calculated, for example, "α×the compression efficiency of the dictionary coding unit 11+β× entropy compression efficiency of entropy coding unit 12". When the compression efficiency calculated in this way is less than the gating threshold, both the dictionary coding unit 11 and the entropy coding unit 12 can be clock-gated. When the compression efficiency calculated in this way is equal to or greater than the gating threshold, both the dictionary coding unit 11 and the entropy coding unit 12 are not clock-gated. With such a configuration, the dictionary coding unit 11 and the entropy coding unit 12 can be comprehensively clock-gated. Further, in the case of such a configuration, the threshold table other than the above-described first and second threshold tables may be used to determine the gating threshold.

In addition, the first embodiment describes that the compression efficiency is calculated using the coding result (that is, the information of the achievement of the actual compression process) by the dictionary coding unit 11 and the entropy coding unit 12, but the compression efficiency may be calculated using other information.

Second Embodiment

Next, a second embodiment will be described. In the second embodiment, a detailed description of the same parts as those of the first embodiment above described will be omitted, and parts different from the first embodiment will be mainly described. Further, a hardware configuration of a memory system in the second embodiment is the same as that in the first embodiment described above, and therefore, will be described with reference to FIG. 1 as appropriate.

First, an example of a configuration of a compressor 2e provided in a memory system 1 according to the second embodiment will be described with reference to FIG. 13. In FIG. 13, the same parts as those in FIG. 2 described above are designated by the same reference numerals, a detailed description thereof will be omitted, and parts different from those in FIG. 2 will be described.

The compressor 2e in the second embodiment is different from the first embodiment described above in that the compressor 2e further includes a pattern classification unit 15.

The pattern classification unit 15 analyzes a data pattern of uncompressed data input to the memory system 1 (compressor 2e) to classify the uncompressed data. A classification result by the pattern classification unit 15 is output to a compression efficiency monitoring unit 13 and used to calculate compression efficiencies of a dictionary coding unit 11 and an entropy coding unit 12.

Further, in the first embodiment described above, the uncompressed data input to the compressor 2e is selectively passed to the dictionary coding unit 11 via a circuit 111, but in the second embodiment, the uncompressed data input to the compressor 2e is input to the pattern classification unit 15 and the data classified by the pattern classification unit 15 is selectively passed to the dictionary coding unit 11 via the circuit 111.

Next, an example of the configuration of the pattern classification unit 15 illustrated in FIG. 13 will be described with reference to FIG. 14.

In the second embodiment, the pattern classification unit 15 executes a classification process with the uncompressed data corresponding to P cycles as one unit. That is, when the uncompressed data is input to the compressor 2e by 16 bytes for each cycle as described above, the pattern classification unit 15 analyzes the uncompressed data having a size of 16 bytes×P cycles to classify the uncompressed data. Note that P is, for example, 64.

The pattern classification unit 15 has a buffer 15a for sequentially storing the uncompressed data (16 bytes) input for each cycle. The uncompressed data (for example, 16×64=1024 bytes) corresponding to P cycles is stored in the buffer 15a.

Further, the uncompressed data (16 bytes) input to the pattern classification unit 15 for each cycle is passed to an average match length estimation unit 15b. The average match length estimation unit 15b includes a history buffer 15c, a dictionary search unit 15d, and an average match length calculation unit 15e. The history buffer 15c and the dictionary search unit 15d correspond to a circuit (dictionary coding circuit) that performs the same dictionary coding as the above-described dictionary coding unit 11. However, while a size of the history buffer included in the above-described dictionary coding unit 11 is 4 KiB, the size of the history buffer 15c is, for example, 512 bytes. That is, in the average match length estimation unit 15b, the dictionary coding, which is simpler than the dictionary coding unit 11, is performed.

512 bytes of past data (uncompressed data) is stored in the history buffer 15c, and the dictionary search unit 15d executes a process (dictionary search process) of searching the uncompressed data, which is passed to the average match length estimation unit 15b, from the history buffer 15c.

When the past data matching the uncompressed data is searched from the history buffer 15c, a match length of the uncompressed data and the searched past data is output from the dictionary search unit 15d to the average match length calculation unit 15e. When the past data that matches the uncompressed data is not searched from the history buffer 15c, the match length=0 is output from the dictionary search unit 15d to the average match length calculation unit 15e.

Since the match length is output from the dictionary search unit 15d to the average match length calculation unit 15e for each cycle, the average match length calculation unit 15e outputs the average value (average match length) of the match lengths output for each cycle. The average match length calculated by the average match length calculation unit 15e is output from the average match length calculation unit 15e to a classification unit 15i.

That is, assuming that there is a relative relationship between a result of the dictionary coding for neighborhood past data (512 bytes) and a result of the dictionary decoding for all the past data (4 KiB of past data stored in the history buffer included in the dictionary coding unit 11), the average match length estimation unit 15b estimates the average match length of the uncompressed data corresponding to P cycles (1 unit).

On the other hand, when the past data matching the uncompressed data is not searched from the history buffer 15c by the above-described dictionary search unit 15d, the uncompressed data (literal) is output from the dictionary search unit 15d to the average code length estimation unit 15f. The average code length estimation unit 15f includes a frequency table 15g and an average code length calculation unit 15h.

The frequency table 15g is used to count an appearance frequency of the uncompressed data output from the dictionary search unit 15d. In the frequency table 15g, among the uncompressed data corresponding to P cycles described above, the appearance frequency of each of the uncompressed data output from the dictionary search unit 15d to the average code length estimation unit 15f is counted.

The average code length calculation unit 15h calculates the average code length based on the appearance frequency of each of the uncompressed data counted in the frequency table 15g. In the second embodiment, the entropy calculated from the appearance frequency of each of the uncompressed data is used as the average code length.

The entropy is calculated by the following Equation (3), where L is a set of uncompressed data (literal) l and P(l) is an appearance probability based on the appearance frequency of the uncompressed data 1.

$$\text{Entropy} = -\Sigma Z_{l \in L} P(l) \log_2 P(l) \quad \text{Equation (3)}$$

The average code length calculation unit 15h estimates the entropy calculated by the above Equation (3) as the average code length.

Compared with the case where the entropy coding is performed on the uncompressed data, the code length of the code when the entropy coding is performed on the distance and the match length as the result of the dictionary coding tends to occupy a small proportion of the total compressed data, and therefore, is not taken into account in the estimation of the average code length by the average code length estimation unit 15f (that is, the code length is not counted in the appearance frequency in the frequency table 15g).

The average code length calculated by the average code length calculation unit 15h is output from the average code length calculation unit 15h to the classification unit 15i.

The classification unit 15i classifies the uncompressed data (that is, 1024 bytes of the uncompressed data stored in the buffer 15a) corresponding to P cycles based on the average match length output from the average match length calculation unit 15e and the average code length output from the average code length calculation unit 15h.

The uncompressed data is classified by referring to the classification table illustrated in FIG. 15, for example. As illustrated in FIG. 15, the classification table stores the pattern classification (that is, the classification result) of the uncompressed data and the tendency of the uncompressed data in association with a combination (that is, classification conditions) of a range of the average match length and a range of the average code length. That is, according to the classification table illustrated in FIG. 15, the uncompressed data can be classified into any of nine patterns.

Specifically, the classification table stores, for example, the pattern classification "0" and the tendency "low compression performance and high power consumption for both the dictionary coding unit and the entropy coding unit" of the uncompressed data in association with "0≤average match length<4, 6≤average code length<10". As a result, when the average match length is 0 or more and less than 4 and the average code length is 6 or more and less than 10, since it is estimated that both the dictionary coding unit 11 and the entropy coding unit 12 have low compression performance and has large power consumption, it is shown to be classified into the pattern classification "0". Here, the classification condition of "0≤average match length<4, 6≤average code length<10" has been described, but the same applies to other classification conditions.

In FIG. 15, for convenience of description, it is assumed that the tendency of the uncompressed data is stored in the classification table. However, since the classification is possible if there are the classification conditions and the pattern classification, the tendency of the uncompressed data may be omitted from the classification table.

The classification result (the pattern classification specified from the average match length and the average code length) by the classification unit 15i is output from the pattern classification unit 15 to the compression efficiency monitoring unit 13.

Note that FIG. 16 illustrates an example of the configuration of the compression efficiency monitoring unit 13 in the second embodiment. The compression efficiency monitoring unit 13 in the second embodiment includes the respective units 13a to 13h in the first embodiment described above, but the second embodiment is different from the first embodiment in that the first compression efficiency calculation unit 13d and the second compression efficiency calculation unit 13h calculates the compression efficiency of the dictionary coding unit 11 and the compression efficiency of the entropy coding unit 12 in consideration of the classification result (pattern classification result) output from the pattern classification unit 15.

Specifically, the first embodiment described above calculates the compression efficiency of the dictionary coding unit 11 from the estimated value of the compression performance and the estimated value of the power consumption of the dictionary coding unit 11, but in the second embodiment, the first compression efficiency calculation unit 13d calculates the compression efficiency of the dictionary coding unit 11 after adding the additional value according to the above-described pattern classification result to the estimated value of the compression performance and the estimated value of the power consumption.

The additional value to be added to the estimated value of the compression performance of the dictionary coding unit 11 is determined by referring to, for example, the first addition value table illustrated in FIG. 17. As illustrated in FIG. 17, the first addition value table stores the additional value to be added to the estimated value of the compression performance of the dictionary coding unit 11 in association with the pattern classification result. According to the first addition value table illustrated in FIG. 17, in the case of the pattern classification result associated with the tendency of the uncompressed data that the dictionary coding unit 11 has low compression performance in the classification table illustrated in FIG. 15 described above, the relatively low additional value associated with the pattern classification result is added to the estimated value of the compression performance of the dictionary coding unit 11. On the other hand, in the case of the pattern classification result associated with the tendency of the uncompressed data that the dictionary coding unit 11 has high compression performance in the classification table illustrated in FIG. 15 described above, the relatively high additional value associated with the pattern classification result is added to the estimated value of the compression performance of the dictionary coding unit 11.

In addition, the additional value to be added to the estimated value of the power consumption of the dictionary coding unit 11 is determined by referring to, for example, the second addition value table illustrated in FIG. 18. As illustrated in FIG. 18, the second addition value table stores the additional value to be added to the estimated value of the power consumption of the dictionary coding unit 11 in association with the pattern classification result. According to the second addition value table illustrated in FIG. 18, in the case of the pattern classification result associated with the tendency of the uncompressed data that the dictionary coding unit 11 has large power consumption in the classification table illustrated in FIG. 15 described above, the relatively high addition value associated with the pattern classification result is added to the estimated value of the power consumption of the dictionary coding unit 11. On the other hand, in the case of the pattern classification result associated with the tendency of the uncompressed data that the dictionary coding unit 11 has low power consumption in the classification table illustrated in FIG. 15 described above, the relatively low addition value associated with the pattern classification result is added to the estimated value of the power consumption of the dictionary coding unit 11.

The compression efficiency of the dictionary coding unit 11 in the second embodiment may calculated by dividing the estimated value of the compression performance to which the addition value determined by referring to the above-described first addition value table is added by the estimated value of the power consumption to which the additional value determined by referring to the second additional value table is added.

Further, the first embodiment described above calculates the compression efficiency of the entropy coding unit 12 from the estimated value of the compression performance and the estimated value of the power consumption of the entropy coding unit 12, but in the second embodiment, the second compression efficiency calculation unit 13h calculates the compression efficiency of the entropy coding unit 12 after adding the addition value according to the above-described pattern classification result to the estimated value of the compression performance and the estimated value of the power consumption.

The additional value to be added to the estimated value of the compression performance of the entropy coding unit 12 is determined by referring to, for example, a third addition value table illustrated in FIG. 19. As illustrated in FIG. 19, the third addition value table stores the additional value to be added to the estimated value of the compression performance of the entropy coding unit 12 in association with the pattern classification result. According to the third addition value table illustrated in FIG. 19, in the case of the pattern classification result associated with the tendency of the uncompressed data that the entropy coding unit 12 has low compression performance in the classification table illustrated in FIG. 15 described above, the relatively low additional value associated with the pattern classification result is added to the estimated value of the compression performance of the entropy coding unit 12. On the other hand, in the case of the pattern classification result associated with the tendency of the uncompressed data that the entropy coding unit 12 has high compression performance in the classification table illustrated in FIG. 15 described above, the relatively high additional value associated with the pattern classification result is added to the estimated value of the compression performance of the entropy coding unit 12.

In addition, the additional value to be added to the estimated value of the power consumption of the entropy coding unit 12 is determined by referring to, for example, the fourth addition value table illustrated in FIG. 20. As illustrated in FIG. 20, the fourth addition value table stores the additional value to be added to the estimated value of the power consumption of the entropy coding unit 12 in association with the pattern classification result. According to the fourth addition value table illustrated in FIG. 20, in the case of the pattern classification result associated with the tendency of the uncompressed data that the entropy coding unit 12 has large power consumption in the classification table illustrated in FIG. 15 described above, the relatively high addition value associated with the pattern classification result is added to the estimated value of the power consumption of the entropy coding unit 12. On the other hand, in the case of the pattern classification result associated with the tendency of the uncompressed data that the entropy coding unit 12 has low power consumption in the classification table illustrated in FIG. 15 described above, the relatively low addition value associated with the pattern classification result is added to the estimated value of the power consumption of the entropy coding unit 12.

The compression efficiency of the entropy coding unit 12 in the second embodiment may be calculated by dividing the estimated value of the compression performance to which the addition value determined by referring to the above-described third addition value table is added by the estimated value of the power consumption to which the additional value determined by referring to a fourth additional value table is added.

In addition, the additional value stored in the second addition value table illustrated in FIG. 18 and the additional value stored in the fourth addition value table illustrated in FIG. 20 may be partially different according to the actual power consumption of the dictionary coding unit 11 and the entropy coding unit 12 and the like, but may completely be the same.

Next, an example of the processing procedure of the compressor 2e in the second embodiment will be described with reference to the sequence chart of FIG. 21.

First, the pattern classification unit 15 inputs the uncompressed data (step S21). In step S21, 16 bytes of the uncompressed data corresponding to P cycles are sequentially input. The uncompressed data (for example, 1024 bytes) input in step S21 is stored in the buffer 15a included in the pattern classification unit 15.

Next, the pattern classification unit 15 executes the pattern classification process on the uncompressed data input in step S21 (step S22). The pattern classification process is a process of classifying the uncompressed data input in step S21. The pattern classification process (process executed by the pattern classification unit 15) is as described above, so a detailed description thereof will be omitted here.

When the process of step S22 is executed, the pattern classification result is output from the pattern classification unit 15 to the compression efficiency monitoring unit 13 (step S23).

The compression efficiency monitoring unit 13 executes the compression efficiency calculation process based on the pattern classification result output from the pattern classification unit 15 in step S23 (step S24).

In the compression efficiency calculation process, the compression efficiencies of the dictionary coding unit 11 and the entropy coding unit 12 are calculated based on the estimated value of the compression performance and the estimated value of the power consumption to which the additional value is added according to the pattern classification result as described above. As described in the first embodiment described above, the result of the dictionary coding (for example, the result of the dictionary coding corresponding to N cycles) and the result of the entropy coding (for example, the result of the entropy coding corresponding to M cycles) are necessary for the calculation of the estimated value of the compression performance and the estimated value of the power consumption and the result of the dictionary coding and the result of the entropy coding are acquired (collected) from the dictionary coding unit 11 and the entropy coding unit 12 in the compression efficiency monitoring unit 13 at the time of executing the process of step S24.

When the process of step S24 is executed, the compression efficiencies of the dictionary coding unit 11 and the entropy coding unit 12 are output from the compression efficiency monitoring unit 13 to the gating control unit 14 (step S25).

The gating control unit 14 executes the gating control process based on the compression efficiency output from the compression efficiency monitoring unit 13 in step S25 (step S26). The gating control process is a process of controlling clock gating for the dictionary coding unit 11 and the entropy coding unit 12. The gating control process (process executed by the gating control unit 14) is as described in the first embodiment described above, and therefore a detailed description thereof will be omitted here.

When the process of step S26 is executed, the uncompressed data (uncompressed data classified by the pattern classification unit 15) stored in the buffer 15*a* included in the pattern classification unit 15 is output from the pattern classification unit 15 to the dictionary coding unit 11 (circuit 111) (step S27).

According to the process illustrated in FIG. 21 described above, the uncompressed data input to the compressor 2*e* in the second embodiment is compressed (encoded) by the dictionary coding unit 11 and the entropy coding unit 12 whose clock gating is controlled in consideration of the classification result of the uncompressed data.

As described above, the second embodiment has the configuration in which the uncompressed data input to the compressor 2*e* is classified, the compression efficiency is calculated based on the classification result, and the uncompressed data is compressed (encoded) by the dictionary coding unit 11 and the entropy coding unit 12 whose clock gating is controlled based on the compression efficiency, the operations of the dictionary coding unit 11 or the entropy coding unit 12 can be skipped (that is, the coding by the dictionary coding unit 11 or the entropy coding unit 12 passes through) for the uncompressed data whose compression efficiency is predicted to be low. As a result, it is possible to further improve the compression efficiency as compared with the first embodiment described above.

Furthermore, in the second embodiment, in addition to the uncompressed data input to the compressor 2*e*, the clock gating is controlled using the result of the dictionary coding and the result of the entropy coding (that is, the processing achievements of the dictionary coding unit 11 and the entropy coding unit 12), so it is possible to improve the accuracy of the determination process (clock gating control) related to the skip of the compression process. As a result, it is possible to appropriately improve the compression efficiency and suppress the power consumption.

In the second embodiment describes that the compression efficiency is calculated by adding the additional value according to the pattern classification result to the estimated value of the compression performance (that is, the compression efficiency is calculated based on the compression performance based on the classification result), but may be configured to calculate the compression efficiency based on an indicator (for example, the average match length and the average code length) that correlates with the compression performance adjusted based on the pattern classification result, for example.

Similarly, the second embodiment describes that the compression efficiency is calculated by adding the additional value according to the pattern classification result to the estimated value of the compression performance (that is, the compression efficiency is calculated based on the compression performance based on the classification result), but may be configured to calculate the compression efficiency based on an indicator (for example, the average match length and the average code length) that correlates with the power consumption adjusted based on the pattern classification result, for example.

The second embodiment assumes that the gating threshold of the dictionary coding unit 11 and the gating threshold of the entropy coding unit 12 are determined by referring to the first threshold table illustrated in FIG. 8 and the second threshold table illustrated in FIG. 12 described above, but may be configured to adjust the thresholds stored in the first threshold table and the second threshold table, for example, in consideration of the additional value (for example, lower the thresholds) according to the pattern classification result in the second embodiment.

Third Embodiment

Next, a third embodiment will be described. In the third embodiment, a detailed description of the same parts as those of each embodiment described above will be omitted, and parts different from each of the embodiments will be mainly described. Further, a hardware configuration of a memory system in the third embodiment is the same as that in each of the embodiments described above, and therefore, will be described with reference to FIG. 1 as appropriate.

In each of the embodiments described above, the entire dictionary coding unit 11 has been described as being clock-gated, but the third embodiment is different from each of the embodiments described above in that a clock-gating domain of the dictionary coding unit 11 is subdivided.

The third embodiment describes the configuration in which the dictionary coding unit 11 in the second embodiment described above is subdivided and clock-gated, and the configuration of the compressor 2*e* will be described with reference to FIG. 13 as appropriate.

FIG. 22 illustrates an example of a configuration of a dictionary coding unit 11 in the third embodiment. As illustrated in FIG. 22, the dictionary coding unit 11 includes a first dictionary coding unit 11*a*, a second dictionary coding unit 11*b*, and a third dictionary coding unit 11*c*.

Here, in each of the embodiments described above, the dictionary coding unit 11 performs the dictionary coding that converts uncompressed data into a relative reference of 4 KiB of past data stored in a history buffer, but the first dictionary coding unit 11*a* performs dictionary coding that converts uncompressed data into a relative reference of, for example, 256 bytes of past data (latest past data) of 4 KiB past data. That is, the first dictionary coding unit 11*a* corresponds to a neighborhood dictionary coding unit that performs dictionary coding by referring to 256 bytes of latest past data (relatively close past data).

On the other hand, the second dictionary coding unit 11*b* and the third dictionary coding unit 11*c* correspond to distant dictionary coding that performs dictionary coding by referring to the past data (relatively distant past data) that is not referenced by the first dictionary coding unit 11*a*.

Specifically, the second dictionary coding unit 11b converts uncompressed data into a relative reference to a part (data) of relatively distant past data (past data not referenced by the first dictionary coding unit 11a).

On the other hand, the third dictionary coding unit 11c performs dictionary coding that converts uncompressed data into a relative reference of another part (past data not referenced by the second dictionary coding unit 11b) of the relatively distant past data. For example, the past data referenced by the second dictionary coding unit 11b is newer than the past data referenced by the third dictionary coding unit 11c, but a size of the past data referenced by the second dictionary coding unit 11b and a size of the past data referenced by the third dictionary coding unit 11c may be the same and may be different.

In the third embodiment, the first dictionary coding unit 11a, the second dictionary coding unit 11b, and the third dictionary coding unit 11c described above all operate, and thus, in each of the embodiments described above, the operation is the same as the case where the dictionary coding is performed by referring to 4 KiB of past data stored in the history buffer.

When all of the first dictionary coding unit 11a, the second dictionary coding unit 11b, and the third dictionary coding unit 11c operate, the result (that is, the result that match length is maximum) that the coding efficiency is highest among the results of the dictionary coding performed by the first dictionary coding unit 11a, the second dictionary coding unit 11b, and the third dictionary coding unit 11c is output from the dictionary coding unit 11.

Here, in the third embodiment, the result of the dictionary coding performed by each of the first dictionary coding unit 11a, the second dictionary coding unit 11b, and the third dictionary coding unit 11c is output to the compression efficiency monitoring unit 13, and the compression efficiency monitoring unit 13 calculates the compression efficiencies of each of the first dictionary coding unit 11a, the second dictionary coding unit 11b, and the third dictionary coding unit 11c. As a result, the gating control unit 14 can control the clock gating for each of the first dictionary coding unit 11a, the second dictionary coding unit 11b, and the third dictionary coding unit 11c based on the compression efficiency calculated by the compression efficiency monitoring unit 13.

Therefore, the above-described circuit 111 is provided in the front stage of each of the first dictionary coding unit 11a, the second dictionary coding unit 11b, and the third dictionary coding unit 11c illustrated in FIG. 22, and the above-described circuit 112 is provided in the rear stage.

FIG. 23 illustrates an example of the configuration of the compression efficiency monitoring unit 13 in the third embodiment, and FIG. 24 illustrates an example of the configuration of the gating control unit 14 in the third embodiment. In FIGS. 23 and 24, the same reference numerals are given to the same parts as those in FIGS. 3 and 4 described above, and a detailed description thereof will be omitted. Here, parts different from each of the above-described embodiments will be mainly described.

As illustrated in FIG. 23, the compression efficiency monitoring unit 13 includes an average match length calculation unit 13a for a first dictionary coding unit 11a, a second dictionary coding unit 11b, and a third dictionary coding unit 11c, respectively, a first compression performance estimation unit 13b, a first power consumption estimation unit 13c, and first compression efficiency calculation unit 13d. With such a configuration, the compression efficiency monitoring unit 13 can calculate the compression efficiencies of each of the first dictionary coding unit 11a, the second dictionary coding unit 11b, and the third dictionary coding unit 11c and output the compression efficiencies to the gating control unit 14.

Since the details of the average match length calculation unit 13a, the first compression performance estimation unit 13b, the first power consumption estimation unit 13c, and the first compression efficiency calculation unit 13d are as described above, a detailed description thereof will be omitted here. Further, the above-described first embodiment describes that the compression performance is estimated with reference to the first compression performance table illustrated in FIG. 6, and the power consumption is estimated with reference to the first power consumption table illustrated in FIG. 7, but in the third embodiment, a table referenced by the first compression performance estimation unit 13b and the first power consumption estimation unit 13c for each of the first dictionary coding unit 11a, the second dictionary coding unit 11b, and the third dictionary coding unit 11c to estimate the compression performance and the power consumption from the average match length may be different from those illustrated in FIGS. 6 and 7.

Further, as illustrated in FIG. 24, the gating control unit 14 is configured to clock-gate each of the first dictionary coding unit 11a, the second dictionary coding unit 11b, and the third dictionary coding unit 11c based on the compression efficiencies of each of the first dictionary coding unit 11a, the second dictionary coding unit 11b, and the third dictionary coding unit 11c output from the above-described compression efficiency monitoring unit 13.

The third embodiment can clock-gate each of the first dictionary coding unit 11a, the second dictionary coding unit 11b, and the third dictionary coding unit 11c, and the target of the clock gating is determined by referring to the gating control table illustrated in FIG. 25, for example. As illustrated in FIG. 25, the gating control table stores the clock gating trigger conditions including the relationship between the compression efficiency and the gating threshold of the dictionary coding unit 11 by associating the clock gating trigger with the clock gating target when the trigger conditions are satisfied. The gating control table illustrated in FIG. 25 is defined so that the first to third dictionary coding units 11a to 11c whose compression efficiencies are less than the gating threshold are defined as clock gating targets (that is, the operation is skipped).

As described above, the third embodiment includes the first dictionary coding unit 11a (first dictionary coding unit) in which the dictionary coding unit 11 converts the uncompressed data into the relative reference of the relatively close past data, the second dictionary coding unit 11b (third dictionary coding unit) which converts the uncompressed data into a relative reference of a part of the relatively distant past data, and the third dictionary coding unit (fourth dictionary coding unit) that converts the uncompressed data into a relative reference of another part of the relatively distant past data, and the compression efficiencies of the first dictionary coding unit 11a, the second dictionary coding unit 11b, and the third dictionary coding unit 11c are calculated, and the first dictionary coding unit 11a, the second dictionary coding unit 11b, and the third dictionary coding unit 11c are each clock-gated based on the calculated compression efficiencies (the operation of at least one of the first dictionary coding unit 11a, the second dictionary coding unit 11b, and the third dictionary coding unit 11c is controlled).

In the third embodiment, with such a configuration, compared with the configuration in which the entire dictionary coding unit 11 is clock-gated, it is possible to suppress the power consumption with finer granularity and improve the compression efficiency.

The third embodiment describes that the first dictionary coding unit 11a, the second dictionary coding unit 11b, and the third dictionary coding unit 11c are clock-gated, but can be configured so that for example, the first dictionary coding unit 11a always operates and the operation of at least one of the second dictionary coding unit 11b and the third dictionary coding unit 11c is controlled (skipped). Furthermore, the second dictionary coding unit 11b and the third dictionary coding unit 11c may be configured as one dictionary coding unit (second dictionary coding unit), and may be configured to control the operation of at least one of the first dictionary coding unit 11a and the dictionary coding units.

The third embodiment describes the configuration in which the dictionary coding unit 11 in the second embodiment is subdivided and clock-gated, but the configuration of the third embodiment may also be applied to the first embodiment described above.

Fourth Embodiment

Next, a fourth embodiment will be described. In the third embodiment, a detailed description of the same parts as those of each embodiment described above will be omitted, and parts different from each of the embodiments will be mainly described. Further, a hardware configuration of a memory system in the third embodiment is the same as that in each of the embodiments described above, and therefore, will be described with reference to FIG. 1 as appropriate.

In each of the embodiments described above, the entire entropy coding unit 12 has been described as being clock-gated, but the fourth embodiment is different from each of the embodiments described above in that a clock-gating domain of the entropy coding unit 12 is subdivided.

The fourth embodiment describes the configuration in which the entropy coding unit 12 in the second embodiment described above is subdivided and clock-gated, and the configuration of the compressor 2e will be described with reference to FIG. 13 as appropriate.

Figure 26:
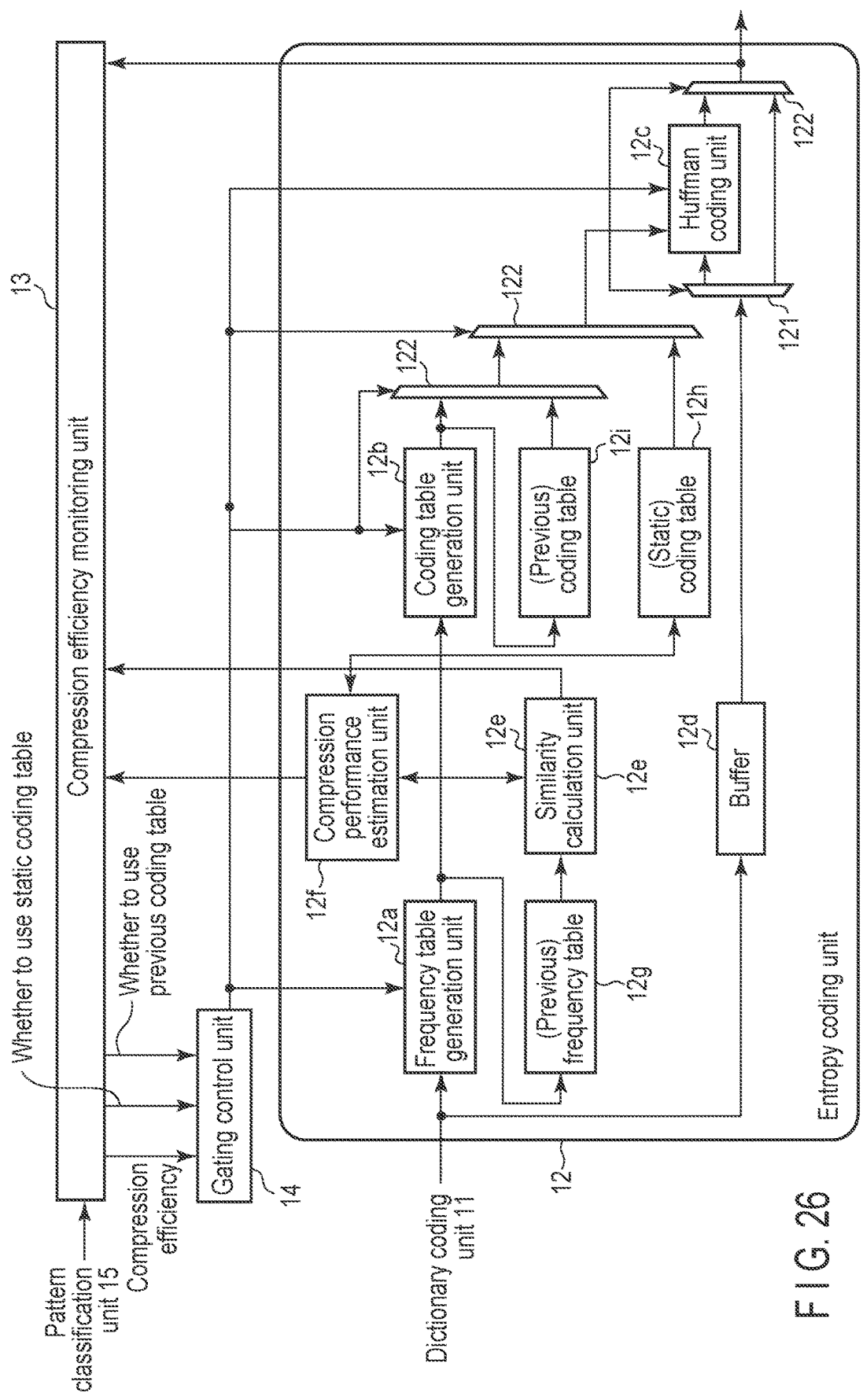
FIG. 26 is a diagram illustrating an example of a configuration of the entropy coding unit according to a fourth embodiment.

FIG. 26 illustrates an example of a configuration of an entropy coding unit 12 in the fourth embodiment. Here, it is assumed that entropy coding (Huffman coding) performed by the entropy coding unit 12 according to the fourth embodiment is dynamic Huffman coding. In this case, the entropy coding unit 12 includes a frequency table generation unit 12a, a coding table generation unit 12b, a Huffman coding unit 12c, and a buffer 12d.

First, an operation of the entropy coding unit 12 when the entropy coding unit 12 is not clock-gated will be briefly described.

The result of the dictionary coding is input to the entropy coding unit 12, and uncompressed data (literals), a distance, and a match length are included in the result of the dictionary coding. Each of the uncompressed data, the distance, and the match length included in the result of the dictionary coding is referred to as a symbol for convenience.

In this case, the frequency table generation unit 12a counts appearance frequencies of each symbol included in the result of the dictionary coding for each unit of a predetermined size (for example, 1024 bytes in terms of uncompressed data) to generate a frequency table. The result of the dictionary coding, which corresponds to 1024 bytes in terms of the uncompressed data, is stored in the buffer 12d.

The coding table generation unit 12b generates a coding table (Huffman coding table) based on the frequency table generated by the frequency table generation unit 12a. In the coding table generated by the coding table generation unit 12b, the code assigned to each symbol is defined.

The Huffman coding unit 12c uses the coding table generated by the coding table generation unit 12b to encode each of the symbols included in the result of the dictionary coding stored in the above-described buffer 12d.

In the entropy coding unit 12, the frequency table generation unit 12a, the coding table generation unit 12b, the Huffman coding unit 12c, and the buffer 12d operate as described above, so that the entropy coding (Huffman coding) for the result of the dictionary coding (each symbol) can be performed.

Here, in the fourth embodiment, the domain of the clock gating is divided into a frequency table generation unit 12a, a coding table generation unit 12b, and a Huffman coding unit 12c, and each domain is controlled separately. In order to realize such control, the entropy coding unit 12 in the fourth embodiment further includes a similarity calculation unit 12e and the compression performance estimation unit 12f in addition to the frequency table generation unit 12a, the coding table generation unit 12b, the Huffman coding unit 12c, and the buffer 12d described above.

The similarity calculation unit 12e holds a frequency table (that is, past frequency table) 12g used (generated) in a previous unit, and calculates similarity between the frequency table generated by the frequency table generation unit 12a (hereinafter, referred to as a current frequency table) and the frequency table 12g.

Hereinafter, the similarity calculated by the similarity calculation unit 12e will be described. First, when all the symbols whose appearance frequency>0 in the current frequency table have the appearance frequency>0 even in one previous frequency table 12g, if a set of the symbols s is S, an appearance frequency of the symbol s in the current frequency table is Fcur(s), and the appearance frequency in the one previous frequency table 12g is Fprev(s), the similarity is calculated by the following Equation (4).

$$\text{Similarity} = \Sigma_{s \in S} |F_{cur}(s)| \quad \text{Equation (4)}$$

On the other hand, if there is at least one symbol whose appearance frequency is >0 in the current frequency table and whose appearance frequency is 0 in the one previous frequency table 12g, the similarity is set to $\infty$.

That is, in the fourth embodiment, the smaller the similarity, the more similar the current frequency table and the one previous frequency table 12g are. The similarity calculated by the above-described similarity calculation unit 12e is output from the entropy coding unit 12 to the compression efficiency monitoring unit 13.

The compression performance estimation unit 12f holds a coding table (hereinafter, referred to as a static coding table) 12h that is statically generated (that is, prepared in advance independently of a plurality of symbols included in the result of the dictionary coding) offline rather than dynamically, and estimates the compression performance when the static coding table 12h is used instead of the dynamically generated coding table (coding table generated by the coding table generation unit 12b). In the static coding table 12h, a code assigned to each symbol is defined as in the coding table generated by the above-described coding table generation unit 12b.

An estimated code amount when the static coding table 12h is used is used to estimate the compression performance when the static coding table 12h is used.

The estimated code amount is calculated by the following Equation (5) when the set of symbols s included in the result of the dictionary coding corresponding to the unit (1024 bytes in terms of the uncompressed data) is S, the appearance frequency of the symbols s in the current frequency table is F(s), the code length of the symbol s in the static coding table 12*h* is 1 (s).

$$\text{Estimated code amount} = \Sigma_{s \in S}[1(s) \times F(s)] \quad \text{Equation (5)}$$

The compression performance (that is, the estimated code amount calculated by the compression performance estimation unit 12*f*) estimated by the compression performance estimation unit 12*f* is output from the entropy coding unit 12 to the compression efficiency monitoring unit 13.

In the fourth embodiment, the entropy coding unit 12 (coding table generation unit 12*b*) holds the coding table (that is, the past coding table) 12*h* corresponding to the one previous frequency table 12*g*.

Further, in the fourth embodiment, the above-described circuit 122 is provided in the rear stage of the coding table generation unit 12*b*, and the circuit 122 is provided in the rear stage of the circuit 122 and the static coding table 12*h*. Further, the above-described circuit 121 is provided in the front stage of the Huffman coding unit 12*c*, and the circuit 122 is provided in the rear stage of the Huffman coding unit 12*c*.

FIG. 27 illustrates an example of the configuration of the compression efficiency monitoring unit 13 in the fourth embodiment. In FIG. 27, the same reference numerals are given to the same parts as those in FIGS. 3 and 23 described above, and a detailed description thereof will be omitted. Here, parts different from each of the above-described embodiments will be mainly described.

As illustrated in FIG. 27, the compression efficiency monitoring unit 13 includes a first determination unit 13*i* and a second determination unit 13*j*.

Whether the first determination unit 13*i* determines whether to use the one previous frequency table 12*g* based on the similarity (similarity between the current frequency table and the one previous frequency table 12*g*) output from the entropy coding unit 12. The first determination unit 13*i* estimates that the compression efficiency does not decrease more than necessary even if the frequency table 12*g* is used, for example, when the similarity is equal to or greater than a predetermined threshold, and determines that the frequency table 12*g* is used. On the other hand, the first determination unit 13*i* determines not to use the frequency table 12*g*, for example, when the similarity is less than a predetermined threshold.

The determination result by the first determination unit 13*i* is output from the compression efficiency monitoring unit 13 to the gating control unit 14.

The second determination unit 13*j* determines whether or not to use the static coding table 12*h* based on the estimated code amount output from the entropy coding unit 12. The second determination unit 13*j* estimates that the compression efficiency does not decrease more than necessary even if the static coding table 12*h* is used, for example, when the estimated code amount is equal to or greater than a predetermined threshold, and determines that the static coding table 12*h* is used. On the other hand, the second determination unit 13*j* determines not to use the static coding table 12*h*, for example, when the estimated code amount is equal to or greater than the predetermined threshold.

The determination result by the second determination unit 13*j* is output from the compression efficiency monitoring unit 13 to the gating control unit 14.

In the second compression performance estimation unit 13*f*, the compression performance of the entropy coding unit 12 is estimated, and in the estimation of the compression performance, the determination result by the second determination unit 13*j* is taken into consideration.

Specifically, when the second determination unit 13*j* determines to use the static coding table 12*h*, the compression performance of the entropy coding unit 12 is estimated based on the above-described estimated code amount. In this case, it is assumed that the smaller the estimated code amount, the larger the estimated value of the compression performance of the entropy coding unit 12, and the larger the estimated code amount, the smaller the estimated value of the compression performance of the entropy coding unit 12.

On the other hand, when the second determination unit 13*j* determines not to use the static coding table 12*h*, the compression performance of the entropy coding unit 12 is estimated based on the average code length and the second compression performance table as in each of the above-described embodiments.

In addition, the power consumption of the entropy coding unit 12 is estimated by the second power consumption estimation unit 13*g*, and the determination result by the first determination unit 13*i* and the determination result by the second determination unit 13*j* are taken into consideration in the estimation of the power consumption.

Specifically, when the first determination unit 13*i* determines to use the one previous frequency table 12*g*, the power consumption of the entropy coding unit 12 is estimated based on the above-described similarity and average code length. In this case, the estimated value of the power consumption of the entropy coding unit 12 is adjusted so that, for example, the smaller the similarity value, the closer to the estimated value of the power consumption stored in the second power consumption table illustrated in FIG. 11, and the larger the similarity, the greater the estimated value of the power consumption stored in the second power consumption table.

In addition, when the second determination unit 13*j* determines to use the static coding table 12*h*, the power consumption of the entropy coding unit 12 is estimated based on the above-described estimated code amount. In this case, it is assumed that for example, the smaller the estimated code amount, the smaller the estimated value of the power consumption of the entropy coding unit 12, and the larger the estimated code amount, the larger the estimated value of the power consumption of the entropy coding unit 12.

When the first determination unit 13*i* determines to use the one previous frequency table, and the second determination unit 13*j* determines to use the static coding table 12*h*, the first determination unit 13*i* estimates the power consumption of the entropy coding unit 12 as in the case where the first determination unit 13*i* determines to use the one previous frequency table.

Further, when the first determination unit 13*i* determines not to use the one previous frequency table 12*g* and the second determination unit 13*j* determines not to use the static coding table 12*h*, the power consumption of the entropy coding unit 12 is estimated based on the average code length as in each of the above-described embodiments.

The compression efficiency of the entropy coding unit 12 in the fourth embodiment is calculated by the second compression efficiency calculation unit 13*h* based on (estimated value of) the compression performance and (estimated value of) the power consumption estimated as described above.

Further, in the fourth embodiment, the gating control unit 14 (second gating determination unit 14*d*) controls the clock gating for the entropy coding unit 12 based on the compression efficiency of the entropy coding unit 12, the determination result by the first determination unit 13*i*, and the determination result by the second determination unit 13*j* as described above.

Specifically, the clock gating in the fourth embodiment is controlled according to the following first to fifth conditions.

The first condition includes that the compression efficiency of the entropy coding unit 12 is less than the gating threshold of the entropy coding unit 12 according to the power reduction level. When the first condition is satisfied, the frequency table generation unit 12*a*, the coding table generation unit 12*b*, and the Huffman coding unit 12*c* are clock-gated over a K' cycle, and are released as the K' cycle elapses. In other words, when the first condition is satisfied, the entropy coding by the entropy coding unit 12 is not performed during the K' cycle. K' is, for example, 64.

The second condition includes that the compression efficiency of the entropy coding unit 12 is equal to or greater than the gating threshold of the entropy coding unit 12 according to the power reduction level, and it is determined to use the one previous frequency table 12*g* at a unit head (timing when the dictionary coding stored in buffer 12*d* is output from the buffer 12*d*), and it is determined to use the static coding table 12*h*. When the second condition is satisfied, the coding table generation unit 12*b* is clock-gated, and then the Huffman coding (entropy coding) using the one previous coding table 12*i* is performed over one unit.

The third condition includes that the compression efficiency of the entropy coding unit 12 is equal to or greater than the gating threshold of the entropy coding unit 12 according to the power reduction level, and it is determined to use the one previous frequency table 12*g* at the unit head, and it is not determined to use the static coding table 12*h*. When the third condition is satisfied, the coding table generation unit 12*b* is clock-gated, and then the Huffman coding (entropy coding) using the one previous coding table 12*i* is performed over one unit.

The fourth condition includes that the compression efficiency of the entropy coding unit 12 is equal to or greater than the gating threshold of the entropy coding unit 12 according to the power reduction level, and it is not determined to use the one previous frequency table 12*g* at the unit head, and it is determined to use the static coding table 12*h*. When the fourth condition is satisfied, the coding table generation unit 12*b* is clock-gated, and then the entropy coding (Huffman coding) using the static coding table 12*h* is performed over one unit.

The fifth condition includes that the compression efficiency of the entropy coding unit 12 is equal to or greater than the gating threshold of the entropy coding unit 12 according to the power reduction level, and it is not determined to use the one previous frequency table 12*g* at the unit head, and it is not determined to use the static coding table 12*h*. When the fifth condition is satisfied, the coding table is dynamically generated based on the current frequency table, and then Huffman coding (entropy coding) is performed using the coding table.

The above-described first to fifth conditions are preferentially applied in the order of the first to fifth conditions. That is, the first condition is the condition to be applied with the highest priority, and the fifth condition is the condition to be applied when the other first to fourth conditions are not satisfied.

As described above, in the fourth embodiment, the similarity between the frequency table (first frequency table) generated by the frequency table generation unit 12*a* and the past frequency table 12*g* (second frequency table) is calculated, the compression efficiency of the entropy coding unit 12 is calculated based on the similarity, the coding table generation unit 12*b* (second generation unit) is clock-gated based on the calculated compression efficiency (skipping the operation of the coding table generation unit 12*b*), and the entropy coding (Huffman coding) is performed using the past coding table 12*i* (second coding table).

Furthermore, in the fourth embodiment, the estimated code amount is calculated when the entropy coding is performed using the static coding table 12*h* (third coding table) prepared in advance independently of the plurality of symbols included in the result of the dictionary decoding, the compression efficiency of the entropy coding unit 12 is calculated based on the calculated estimated code amount, the coding table generation unit 12*b* is clock gated based on the calculated compression efficiency (skip the operation of the coding table generation unit 12*b*), and the entropy coding (Huffman coding) is performed using the static coding table 12*h*.

In the fourth embodiment, with such a configuration, compared with the configuration in which the entire entropy coding unit 12 is clock-gated, it is possible to suppress the power consumption with finer granularity and improve the compression efficiency.

The fourth embodiment describes the configuration in which it is determined whether to use each of the one previous frequency table 12*g* and the static coding table 12*h*, and at least a part of the entropy coding unit 12 is clock-gated based on the determination result, but may have, for example, a configuration in which when the entropy coding is performed using each of the current coding table (first coding table), the one previous coding table 12*i* (second coding table), and the static coding table 12*h*, the compression efficiencies of the entropy coding unit 12 are calculated individually, and at least a part of the entropy coding unit 12 is clock-gated to use the coding table that can perform the most efficiency compression (entropy coding).

In addition, the fourth embodiment has been described as having a configuration in which both the one previous coding table 12*i* and the static coding table 12*h* are held, but may have a configuration in which only one of the previous coding table 12*i* and the static coding table 12*h* is held.

The fourth embodiment describes the configuration in which the entropy coding unit 12 in the second embodiment is subdivided and clock-gated, but the configuration of the fourth embodiment may also be applied to other embodiments described above.

Fifth Embodiment

Next, a fifth embodiment will be described. In the third embodiment, a detailed description of the same parts as those of each embodiment described above will be omitted, and parts different from each of the embodiments will be mainly described. Further, a hardware configuration of a memory system in the third embodiment is the same as that in each of the embodiments described above, and therefore, will be described with reference to FIG. 1 as appropriate.

In each of the above-described embodiments, the compression efficiencies of the dictionary coding unit 11 and the entropy coding unit 12 are calculated from the estimated value of the compression performance and the estimated value of the power consumption of the compressor 2*e* (of dictionary coding unit 11 and the entropy coding unit 12), but the fifth embodiment is different from each of the above-described embodiments in that the power consumption of (of at least a part of) the decompressor 2*f* is taken into consideration in the calculation of the compression efficiency.

The fifth embodiment describes the configuration for calculating the compression efficiency in consideration of the power consumption of the decompressor 2*f* in the above-described second embodiment will be described, and the configuration of the compressor 2*e* will be described with reference to FIG. 13 as appropriate.

Figure 28:
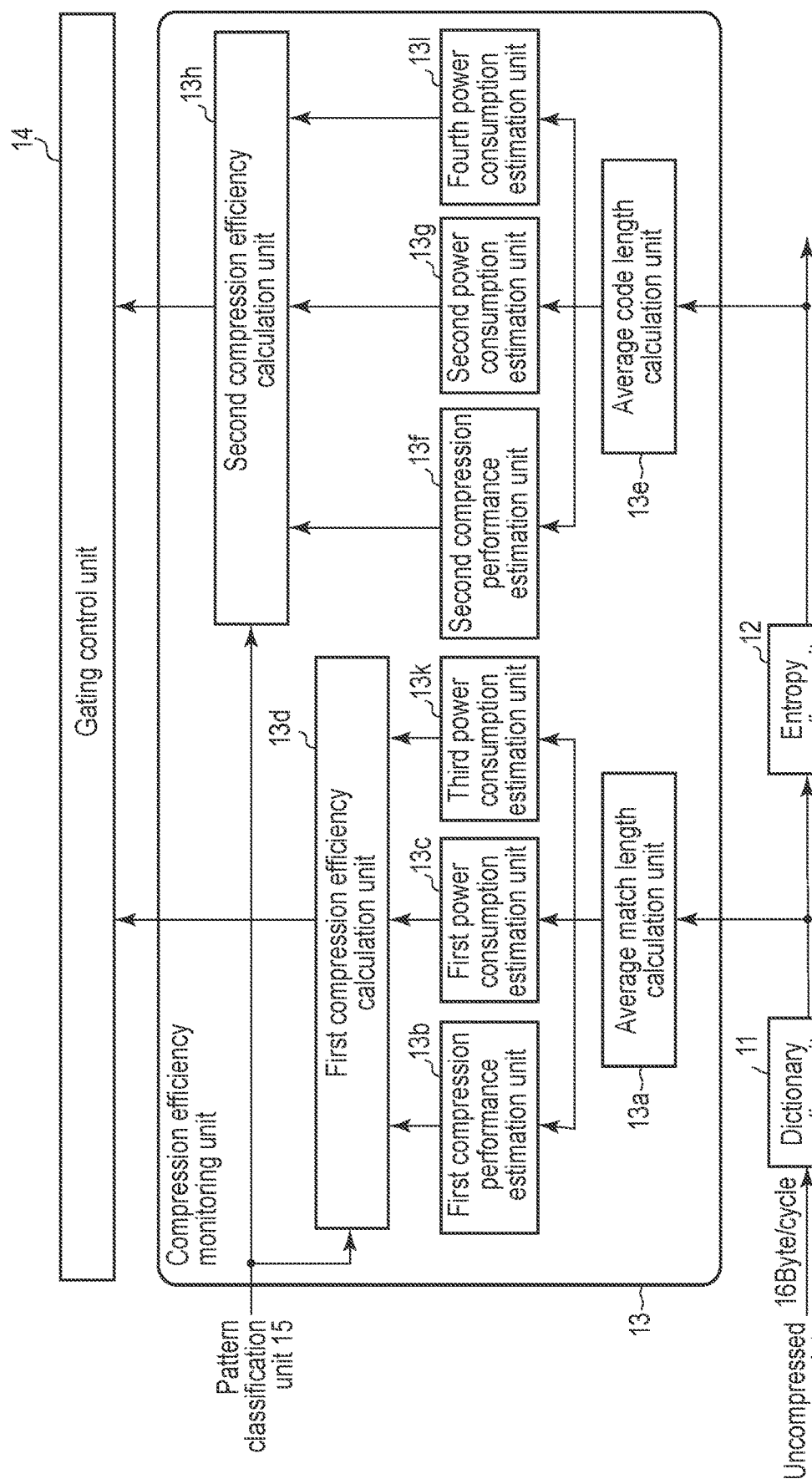
FIG. 28 is a diagram illustrating an example of a configuration of a compression efficiency monitoring unit according to a fifth embodiment.

FIG. 28 illustrates an example of the configuration of the compression efficiency monitoring unit 13 in the fifth embodiment. As illustrated in FIG. 28, the compression efficiency monitoring unit 13 includes a third power consumption estimation unit 13*k* and a fourth power consumption estimation unit 13*l*.

The third power consumption estimation unit 13*k* estimates the power consumption of the decompressor 2*f* (dictionary decoding unit that decodes the result of the dictionary coding) based on the average match length calculated by the average match length calculation unit 13*a*.

As described in the first embodiment described above, the first power consumption estimation unit 13*c* estimates the power consumption of the dictionary coding unit 11 with reference to the first power consumption table illustrated in FIG. 7. In the fifth embodiment, the third power consumption estimation unit 13*k* estimates the power consumption of the decompressor 2*f* with reference to the power consumption table corresponding to the first power consumption table. The estimated value of the power consumption of the decompressor 2*f* is stored in the power consumption table referenced by the third power consumption estimation unit 13*k* in association with the range of the average match length.

In the fifth embodiment, the first compression efficiency calculation unit 13*d* calculates the compression efficiency by dividing the estimated value of the compression performance of the dictionary coding unit 11 by the estimated value of the power consumption obtained by adding the estimated value of the power consumption of the dictionary coding unit 11 and the estimated value of the power consumption of the decompressor 2*f* (dictionary decoding unit).

In addition, the fourth power consumption estimation unit 13*l* estimates the power consumption of the decompressor 2*f* (entropy decoding unit that decodes the result of the entropy coding) based on the average code length calculated by the average code length calculation unit 13*e*.

As described in the first embodiment described above, the second power consumption estimation unit 13*g* estimates the power consumption of the entropy coding unit 12 with reference to the second power consumption table illustrated in FIG. 11. In the fifth embodiment, the fourth power consumption estimation unit 13*l* estimates the power consumption of the decompressor 2*f* with reference to the power consumption table corresponding to the second power consumption table. The estimated value of the power consumption of the decompressor 2*f* is stored in the power consumption table referenced by the fourth power consumption estimation unit 13*l* in association with the range of the average match length.

In the fifth embodiment, the second compression efficiency calculation unit 13*h* calculates the compression efficiency by dividing the estimated value of the compression performance of the entropy coding unit 12 by the estimated value of the power consumption obtained by adding the estimated value of the power consumption of the entropy coding unit 12 and the estimated value of the power consumption of the decompressor 2*f* (entropy decoding unit).

Since the fifth embodiment is the same as the second embodiment described above except that the compression efficiency is calculated in consideration of the power consumption of the decompressor 2*f* as described above, a detailed description thereof will be omitted here.

The fifth embodiment describes the configuration which includes the third power consumption estimation unit 13*k* and the fourth power consumption estimation unit 13*l*, but may have, for example, the configuration in which one of the third power consumption estimation unit 13*k* and the fourth power consumption estimation unit 13*l* is omitted.

As described above, the fifth embodiment is configured to calculate the compression efficiency based on (estimated value of) the power consumption at least a part of the decompressor 2*f* (for example, the dictionary decoding unit or the entropy decoding unit) that outputs the uncompressed data obtained by decompressing the compressed data based on the data written to the NAND flash memory 3, so it is possible to control the clock gating in consideration of the power consumption of the decompressor 2*f*.

The fifth embodiment assumes that the gating threshold of the dictionary coding unit 11 and the gating threshold of the entropy coding unit 12 are determined by referring to the first threshold table illustrated in FIG. 8 and the second threshold table illustrated in FIG. 12 described above, but may be configured to adjust the thresholds (for example, lower the thresholds) stored in the first threshold table and the second threshold table, for example, in consideration of the power consumption of the decompressor 2*f* in the fifth embodiment.

Further, the fifth embodiment describes the configuration for calculating the compression efficiency in consideration of the power consumption of the decompressor 2*f*, but is configured to calculate the compression efficiency, in consideration of, for example, the power consumption of at least a part of the NAND flash memory 3 (non-volatile memory) instead of the power consumption of the decompressor 2*f* or the power consumption of the entire memory system 1. The power consumption of at least a part of the NAND flash memory 3 or (estimated value of) the power saving of the entire memory system 1 may be estimated by referring to the power consumption table prepared in advance in the same manner as the power consumption of the decompressor 2*f*.

Furthermore, the fifth embodiment describes the compression efficiencies of the dictionary coding unit 11 and the entropy coding unit 12 based on the power consumption of the compressor 2*e* (dictionary coding unit 11 and entropy coding unit 12) and the power consumption of the decompressor 2*f* (dictionary decoding unit and entropy decoding unit), but the compression efficiency may be calculated based at least one of the power consumption of the compressor 2*e*, the decompressor 2*f*, the NAND flash memory 3, and the entire memory system 1 described above.

The fifth embodiment describes the configuration for calculating the compression efficiency in consideration of the power consumption of the decompressor 2*f* in the second embodiment, but the configuration of the fifth embodiment is applied to other embodiments described above.

Sixth Embodiment

Next, a sixth embodiment will be described. In the third embodiment, a detailed description of the same parts as those of each embodiment described above will be omitted, and parts different from each of the embodiments will be mainly described. Further, a hardware configuration of a memory system in the third embodiment is the same as that in each of the embodiments described above, and therefore, will be described with reference to FIG. 1 as appropriate.

The sixth embodiment is different from each of the above-described embodiments in that an operation mode of a compressor 2e is dynamically switched.

In the sixth embodiment, the configuration for dynamically switching the operation mode of the compressor 2e in the second embodiment described above will be described.

FIG. 29 illustrates an example of the configuration of the compressor 2e in the sixth embodiment. As illustrated in FIG. 29, the compressor 2e includes a mode switching detection unit 16.

The mode switching detection unit 16 monitors, for example, a state of various resources (write buffer 2g or internal command queue 2h) inside a memory system 1 (SSD), a state of an external command queue 101 on a DRAM included in a host 100, or an operational situation of garbage collection (GC) to detect the switching of the operation mode of the compressor 2e (that is, determine the operation mode after the switching).

Here, the operations of the write buffer 2g, the internal command queue 2h, and the external command queue 101 described above will be briefly described. First, the external command queue 101 is an area reserved on the DRAM of the host 100, and stores a write command and a read command for the memory system 1. The addition of the command to the external command queue 101 is performed by CPU 102 provided in the host 100. On the other hand, the deletion of the command from the external command queue 101 is performed when the memory system 1 notifies the host 100 of the completion of the command. Note that "W" and "R" marked in the external command queue 101 illustrated in FIG. 29 each represent the write command and the read command stored in the external command queue 101.

The internal command queue 2h copies and stores some or all of the commands stored in the external command queue 101 (that is, the commands issued from the host 100) into the memory system 1. A controller 2 provided in the memory system 1 sequentially processes the commands (write command and read command) stored in the internal command queue 2h, deletes the processed commands from the internal command queue 2h, and completes the command, and notifies the host 100 of the completion of the commands. Note that the "W" and "R" marked in the internal command queue 2h illustrated in FIG. 29 each represent the write command and the read command stored in the internal command queue 2h.

The write buffer 2g temporarily buffers the write data specified in the write command when processing the write command in the internal command queue 2h. The write data (uncompressed data) on the write buffer 2g is sequentially read and input to the compressor 2e.

In the sixth embodiment, the compressor 2e operates in three modes: high-speed low-compression mode, low-speed high-compression mode 0, and low-speed high-compression mode 1, and the compressor 2e normally operates in high-speed low-compression mode. Therefore, in the sixth embodiment, when it is determined that there is no problem of reducing the throughput of the compressor 2e, the switching of the operation mode is detected by the mode switching detection unit 16, and the operation mode is switched from the high-speed low-compression mode to the low-speed high-compression mode 0 or the low-speed high-compression mode 1 based on the detection result.

It is assumed that when the compressor 2e operates in the low-speed high-compression mode 0, the throughput for the uncompressed data input to the dictionary coding unit 11 decreases to ½ of the throughput in the high-speed low-compression mode. In addition, it is assumed that when the compressor 2e operates in the low-speed high-compression mode 1, the throughput for the uncompressed data input to the dictionary coding unit 11 decreases to ¼ of the throughput in the high-speed low-compression mode.

Similarly, it is assumed that when the compressor 2e operates in the low-speed high-compression mode 0, the throughput for the result of the dictionary coding input to the entropy coding unit 12 decreases to ½ of the throughput in the high-speed low-compression mode. In addition, it is assumed that when the compressor 2e operates in the low-speed high-compression mode 1, the throughput for the result of the dictionary coding input to the entropy coding unit 12 decreases to ¼ of the throughput in the high-speed low-compression mode.

Hereinafter, an example of the operation of the dictionary coding unit 11 and the entropy coding unit 12 for each operation mode in the sixth embodiment will be described.

First, an operation of the dictionary coding unit 11 will be described with reference to FIG. 30. In the sixth embodiment, it is assumed that dictionary coding unit 11 is configured to operate to search (retrieve) past data stored in a history buffer using a hash value.

Specifically, as illustrated in FIG. 30, the dictionary coding unit 11 includes a history buffer 11d that stores past uncompressed data (uncompressed data input in the past) in a ring buffer policy and a search engine 11e that searches the past data from the history buffer 11d.

In addition, the search engine 11e also includes a hash table 11f, a hash calculator 11g, a selector 11h, and a comparator 11i.

The hash table 11f is addressed by a hash value (H value) calculated by first few bytes (for example, 4 bytes) of the uncompressed data, and an entry corresponding to the hash value (address) stores a read pointer for the past data on the history buffer 11d in which the uncompressed data and the first few bytes match.

When the uncompressed data is input to the dictionary coding unit 11, the hash value of the first few bytes of the uncompressed data is calculated by a hash calculator 11g, and the read pointer is read from the hash table 11f based on the hash value. The past uncompressed data is read from the history buffer 11d based on the read pointer read in this way, and the comparison of the read uncompressed data with the uncompressed data input to the dictionary coding unit 11 is performed by the comparator 11i.

The match length is calculated based on such a comparison result, and a match result selection unit 11j selects the largest match length from the match lengths calculated in this way and outputs the selected match length as the result of the dictionary coding.

The uncompressed data (that is, the uncompressed data on which the dictionary coding has been performed) input to the dictionary coding unit 11 as described above is stored in the history buffer 11d as the past uncompressed data. When the uncompressed data is stored in the history buffer 11d in this way, the read pointer of the uncompressed data is registered in the hash table 11f in association with the hash value.

Here, when performing dictionary coding using the hash table 11f as described above, it may not be possible to perform appropriate coding due to a hash collision, but in order to cope with this hash collision, the hash table 11f can hold up to four read pointers D1, D2, D3, and D4 for the same address (hash value). The read pointer in the hash table 11f is updated by a FIFO policy. That is, for example, when a new read pointer is registered in the hash table 11f, the oldest read pointer (D4) is discarded.

According to such a configuration, only the past data on the history buffer 11d that is highly likely to match the uncompressed data (that is, the hash value of the first few bytes matches) is selected and read from the history buffer 11d, so it is possible to execute an efficient search process.

In order to reduce a logic for reading the past data from the history buffer 11d and a comparison logic for calculating the match length, only one of the four read points D1, D2, D3, and D4 that are registered in hash table 11f in association with one hash value in each cycle where 16 bytes of the uncompressed data is processed is selected by the selector 11h, and the past data is read from the history buffer 11d based on the selected read pointer, and the match length is calculated based on the past data.

That is, in the sixth embodiment, when the compressor 2e operates in the high-speed low-compression mode, the dictionary coding unit 11 is configured to read the history buffer and calculate the match length using one read pointer in each cycle.

Here, in the sixth embodiment, a search engine control unit 11k controls the operation of the above-described dictionary coding unit 11 (search engine 11e) according to the operation mode of the compressor 2e. In this case, the search engine control unit 11k is configured to increase a search amount of the history buffer 11d by the search engine 11e as the throughput required for the dictionary coding unit 11 decreases in the low-speed high-compression mode 0 and the low-speed high-compression mode 1.

Specifically, when the compressor 2e operates in the high-speed low-compression mode, the search engine control unit 11k controls the selector 11h to select one read pointer (newest read pointer D1) that corresponds to the hash value of the first few bytes of the uncompressed data in each cycle as described above. As a result, when the compressor 2e operates in the high-speed low-compression mode, the result of the dictionary coding is output once per cycle.

On the other hand, when the compressor 2e operates in the low-speed high-compression mode 0, the search engine control unit 11k controls the selector 11h to select the first read pointer (newest read pointer D1) corresponding to the hash value of the first few bytes of the uncompressed data in the first cycle and the second read pointer (new read pointer D2 followed by D1) corresponding to the hash value in the second cycle. As a result, when the compressor 2e operates in the low-speed high-compression mode 0, the result of the dictionary coding is output once every 2 cycles. In this case, the throughput decreases to ½ compared to the high-speed low-compression mode described above, but the match length is calculated based on the past data read using each of the two read pointers, and therefore it is possible to output the result of the dictionary coding more appropriate than in high-speed low-compression mode.

In addition, when the compressor 2e operates in the low-speed high-compression mode 1, the search engine control unit 11k controls the selector 11h to select the first read pointer (newest read pointer D1) corresponding to the hash value of the first few bytes of the uncompressed data in the first cycle, select the second read pointer (new read pointer D2 followed by D1) corresponding to the hash value in the second cycle, select the third read pointer (D3 followed by the new read pointer D2) corresponding to the hash value in the third cycle, and select the fourth read pointer (oldest read pointer D4) corresponding to the hash value in the fourth cycle. As a result, when the compressor 2e operates in the low-speed high-compression mode 1, the result of the dictionary coding is output once every 4 cycles. In this case, the throughput decreases to ¼ compared to the high-speed low-compression mode described above, but the match length is calculated based on the past data read using each of the four read pointers, and therefore it is possible to output the result of the dictionary coding more appropriate than in high-speed low-compression mode and the low-speed high-compression mode 0.

That is, in the sixth embodiment, in the low-speed high-compression mode 0 and the low-speed high-compression mode 1, the throughput of the uncompressed data decreases to ½ and ¼, and the number of cycles allocated for reading the past data from the history buffer 11d and calculating the match length increases to double and quadruple, so it is possible to improve the performance of the dictionary coding unit 11.

Next, an operation of the entropy coding unit 12 will be described with reference to FIG. 31. In the sixth embodiment, the entropy coding unit 12 includes a frequency table generation unit 12a, a coding table generation unit 12b, a Huffman coding unit 12c, a buffer 12d, a frequency table sort circuit 12j, and a sort circuit control unit 12k, as illustrated in FIG. 31.

The frequency table generation unit 12a, the coding table generation unit 12b, the Huffman coding unit 12c, and the buffer 12d illustrated in FIG. 31 are the same as the frequency table generation unit 12a, the coding table generation unit 12b, the Huffman coding unit 12c, and the buffer 12d described in FIG. 26, a detailed description thereof is omitted here.

Here, in the entropy coding unit 12, the frequency table generation unit 12a generates the frequency table by counting the appearance frequency of the symbol for each symbol included in the result of the dictionary coding, and at the same time, the frequency table sort circuit 12j executes the process (hereinafter referred to as the sort process) of sorting the symbols of the frequency table based on the appearance frequency.

The coding table generation unit 12b generates a coding table such that a short code is allocated to a symbol (that is, a symbol having a high appearance frequency) located at a higher position in the frequency table in which the above-described sort process is executed.

The Huffman coding unit 12c encodes the result of the dictionary coding (each symbol) stored in the buffer 12d based on the coding table generated by the coding table generation unit 12b.

In this way, in the entropy coding unit 12, it is possible to improve the coding efficiency by allocating the short code to the symbol with a high appearance frequency.

However, the sort process executed by the frequency table sort circuit 12j described above is an in-place sort process for the frequency table, and as the cycle progresses, it gradually approaches a completely sorted state, so the complete sort result is not always guaranteed in the stage where the cycle is not progressing.

Therefore, when the sufficient sort process is not executed and a symbol with a low appearance frequency is located at the top of the frequency table, the short code is allocated to the symbol with the low appearance frequency, and the efficient coding cannot be performed. Similarly, when a symbol with a high appearance frequency is located at the bottom of the frequency table, a long code is allocated to the symbol with the high appearance frequency, and the efficient coding cannot be performed.

Therefore, in the sixth embodiment, the sort circuit control unit 12k controls the operation of the frequency table sort circuit 12j according to the operation mode of the compressor 2e. In this case, the sort circuit control unit 12k operates to increase the number of sorts in the frequency table sort circuit 12j as the throughput required for the entropy coding unit 12 decreases in the low-speed high-compression mode 0 and the low-speed high-compression mode 1.

Figure 32:
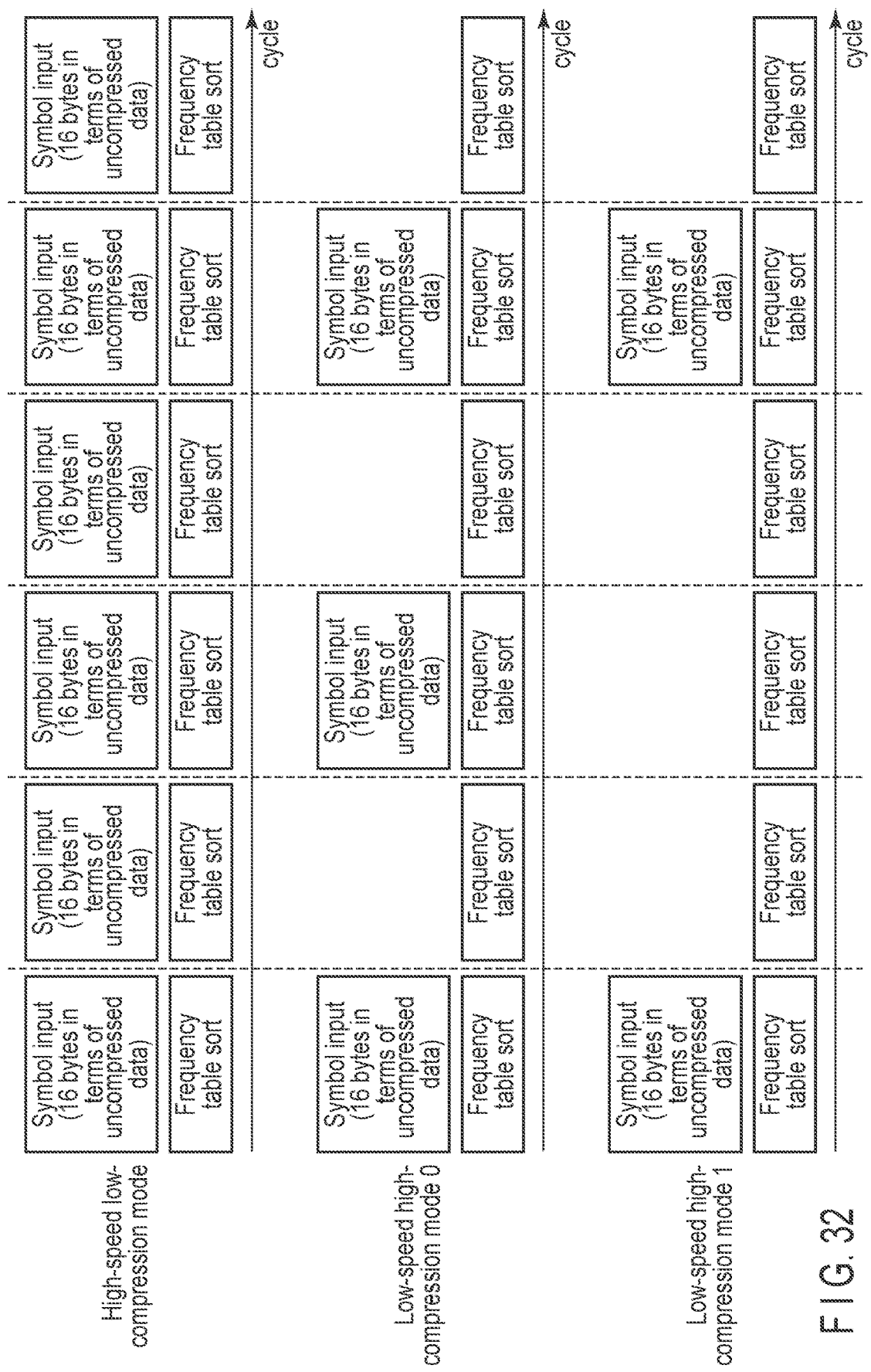
FIG. 32 is a diagram illustrating an example of the number of times a frequency table is sorted according to an operation mode according to the sixth embodiment.

Specifically, the sort circuit control unit 12k controls the frequency table sort circuit 12j according to the operation mode as illustrated in FIG. 32.

In this case, when the compressor 2e operates in the high-speed low-compression mode, one sort process is executed each time the symbol is input once, but when the compressor 2e operates in the low-speed high-compression mode 0, the sort process is executed twice each time the symbol is input once. Also, when the compressor 2e operates in the low-speed high-compression mode 1, the sort process is executed four times each time the symbol is input.

That is, in the sixth embodiment, in the low-speed high-compression mode 0 and the low-speed high-compression mode 1, the throughput of the uncompressed data decreases to ½ and ¼, and the number of cycles that is allocated to the sort process per symbol increases to double and quadruple. This makes it possible to sort the frequency table more correctly and improve the performance of the entropy coding unit 12.

In the sixth embodiment, the search engine control unit 11k and the sort circuit control unit 12k described above correspond to the operation mode control unit for switching the operation mode of the compressor 2e (the dictionary coding unit 11 and the entropy coding unit 12).

Next, a configuration of the mode switching detection unit 16 will be described with reference to FIG. 33. As illustrated in FIG. 33, the mode switching detection unit 16 includes a mode switching determination unit 16a and a mode buffer 16b.

The mode switching determination unit 16a determines whether to switch the operation mode of the compressor 2e based on the state of various resources (write buffer 2g or internal command queue 2h) inside the memory system 1 (SSD), the state of the external command queue 101 on the DRAM included in the host 100, or the operational situation of the garbage collection (GC). In this case, the mode switching determination unit 16a uses, for example, the state of various resources (write buffer 2g or internal command queue 2h) inside the memory system 1 (SSD), the state of the external command queue 101 on the DRAM included in the host 100, or the operational state of the garbage collection (GC) satisfy predetermined conditions, it can be determined that the high-speed low-compression mode is switched to the low-speed high-compression mode 0 or the low-speed high-compression mode 1.

When the mode switching determination unit 16a determines that the operation mode of the compressor 2e is switched, the operation mode after the switching is output from the mode switching determination unit 16a to the mode buffer 16b. The operation mode stored in the mode buffer 16b is output to the dictionary coding unit 11 and the entropy coding unit 12 as described above. As a result, the dictionary coding unit 11 and the entropy coding unit 12 operate according to the operation mode stored in the mode buffer 16b.

The mode buffer 16b is realized by, for example, a flip-flop (F/F) circuit, and the operation mode stored in the mode buffer 16b is referenced by the compression efficiency monitoring unit 13 per cycle. The operating mode referenced by the compression efficiency monitoring unit 13 in this way is taken into account when calculating the compression efficiency. The mode buffer 16b (F/F) operates in, for example, the low-speed high-compression mode 0 or the low-speed high-compression mode 1 for a predetermined cycle period, and then is initialized in the high-speed low-compression mode.

On the other hand, the compression efficiency calculated by the compression efficiency monitoring unit 13 may be taken into consideration in the determination process by the mode switching determination unit 16a. In this case, the compression efficiency calculated in the compression efficiency monitoring unit 13 is stored in the compression efficiency storage unit (not illustrated) provided in the compression efficiency monitoring unit 13, and the mode switching determination unit 16a may refer to the compression efficiency stored in the compression efficiency storing unit, for example, per cycle. The compression efficiency buffer may be realized by a FlipFlop (F/F) circuit as in the mode buffer 16b described above.

That is, in the sixth embodiment, the compression efficiency monitoring unit 13 and the mode switching detection unit 16 (mode switching determination unit 16a) can be configured to refer to the operation mode and the compression efficiency output from the F/F per cycle with each other.

When the mode switching detection unit 16 is configured to refer to the compression efficiency, the compression efficiency is a predetermined threshold or greater, and when the state of various resources (write buffer 2g or internal command queue 2h) inside the memory system 1 (SSD), the state of the external command queue 101 on the DRAM included in the host 100, or the operational state of the garbage collection (GC) satisfy predetermined conditions, it can be determined that for example, the high-speed low-compression mode is switched to the low-speed high-compression mode 0 or the low-speed high-compression mode 1.

Figure 34:
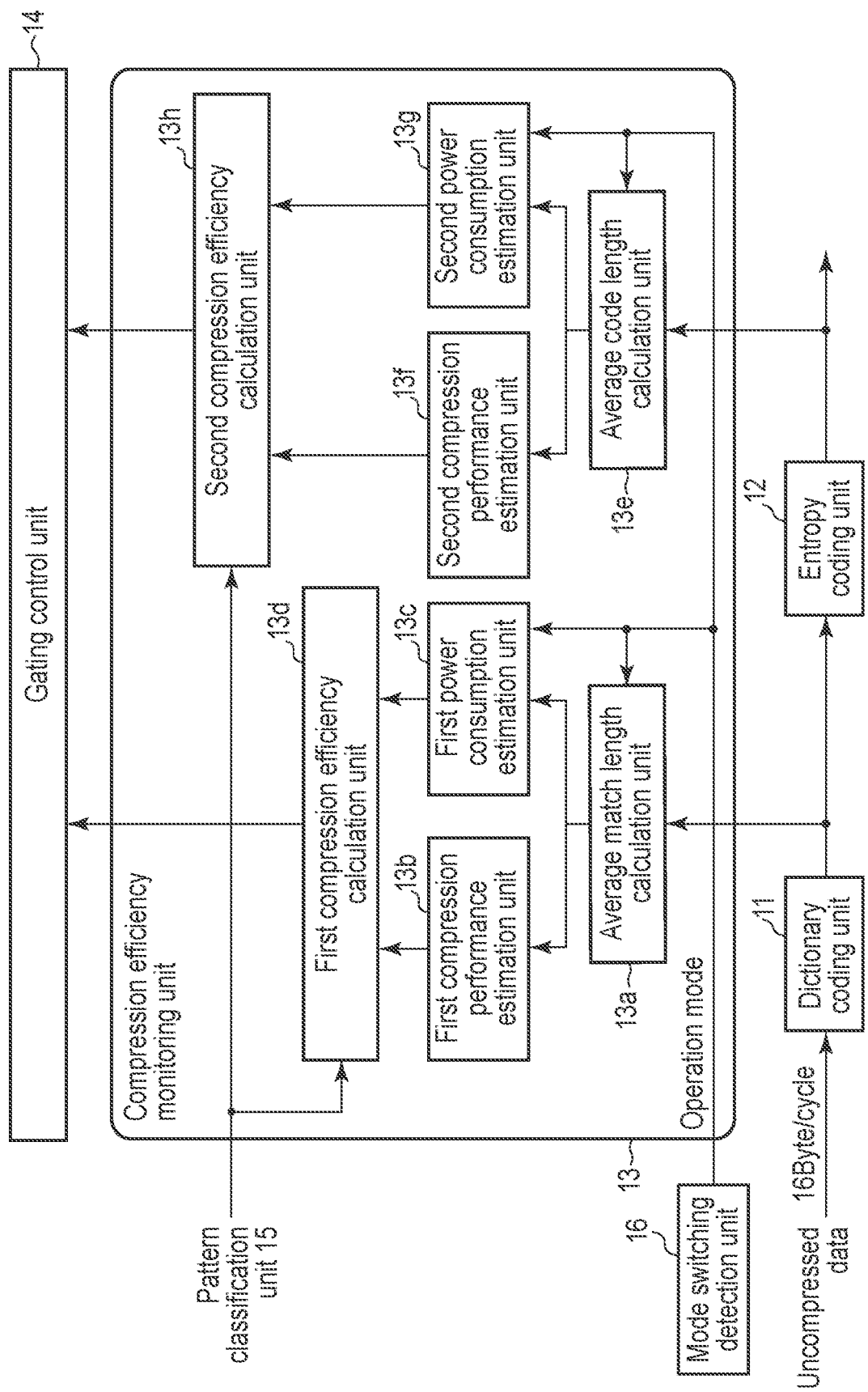
FIG. 34 is a diagram illustrating an example of a configuration of a compression efficiency monitoring unit according to the sixth embodiment.

FIG. 34 illustrates an example of the configuration of the compression efficiency monitoring unit 13 in the sixth embodiment. In the sixth embodiment, when the operating mode of the compressor 2e is considered when estimating the power consumption of the dictionary coding unit 11 and the entropy coding unit 12.

First, when the operation mode of the compressor 2e is switched, the amount of uncompressed data input within the same cycle period changes. In this case, the average match length calculation unit 13a calculates the average match length by the above Equation (1) when the operation mode of the compressor 2e is the high-speed low-compression mode. On the other hand, when the operating mode of the compressor 2e is the low-speed high-compression mode 0, the dictionary coding unit 11 operates to output one match length (the result of the dictionary coding) every 2 cycles due to the decrease in the throughput, the average match length calculation unit 13a calculates the average match length by the following Equation (6).

$$L_{Ave} = [\Sigma_{t=0-31}\Sigma_{m \in M(t)} m]16 \qquad \text{Equation (6)}$$

In addition, when the operating mode of the compressor 2e is the low-speed high-compression mode 1, the dictionary coding unit 11 operates to output one match length (the result of the dictionary coding) every 4 cycles due to the further decrease in the throughput, the average match length calculation unit 13a calculates the average match length by the following Equation (7).

$$L_{Ave} = [\Sigma_{t=0-31}\Sigma_{m \in M(t)} m]/8 \qquad \text{Equation (7)}$$

In this case, the first power consumption estimation unit 13c refers to the third power consumption table illustrated in FIG. 35 in which the operation mode is taken into consideration, instead of the first power consumption table illustrated in FIG. 7 described above to estimate the power consumption of the dictionary coding unit 11. In the third power consumption table illustrated in FIG. 35, the power consumption in the low-speed high-compression mode 0 and the low-speed high-compression mode 1 is lower than the power consumption in the high-speed low-compression mode, but such a decrease in power consumption reflects the decrease in switching power of some logics due to the decrease in the input throughput of the uncompressed data.

In the sixth embodiment, the compression efficiency of the dictionary coding unit 11 may be calculated based on the estimated value of the compression performance of the dictionary coding unit 11 described in the first embodiment and the like described above and the estimated value of the power consumption estimated by referring to the third power consumption table illustrated in FIG. 35 described above.

On the other hand, the average code length calculation unit 13e calculates the average code length by the above Equation (2) when the operation mode of the compressor 2e is the high-speed low-compression mode. On the other hand, when the operating mode of the compressor 2e is the low-speed high-compression mode 0, the entropy coding unit 12 operates to output one code length (the result of the dictionary coding) every 2 cycles due to the decrease in the throughput, so the average code length calculation unit 13e calculates the average code length by the following Equation (8).

$$C_{Ave} = [\Sigma_{t=0-15} \Sigma_{c \in C(t)} c]/8 \quad \text{Equation (8)}$$

In addition, when the operating mode of the compressor 2e is the low-speed high-compression mode 1, the entropy coding unit 12 operates to output one code length (the result of the dictionary coding) every 4 cycles due to the further decrease in the throughput, so the average code length calculation unit 13e calculates the average code length by the following Equation (9).

$$C_{Ave} = [\Sigma_{t=0-15} \Sigma_{c \in C(t)} c]/4 \quad \text{Equation (9)}$$

In this case, the second power consumption estimation unit 13g refers to the fourth power consumption table illustrated in FIG. 36 in which the operation mode is taken into consideration, instead of the second power consumption table illustrated in FIG. 11 described above to estimate the power consumption of the entropy coding unit 12. In the fourth power consumption table illustrated in FIG. 36, the power consumption in the low-speed high-compression mode 0 and the low-speed high-compression mode 1 is lower than the power consumption in the high-speed low-compression mode, but such a decrease in power consumption reflects the decrease in switching power of some logics due to the decrease in the input throughput of the result of the dictionary coding.

In the sixth embodiment, the compression efficiency of the entropy coding unit 12 may be calculated based on the estimated value of the compression performance of the entropy coding unit 12 described in the first embodiment and the like described above and the estimated value of the power consumption estimated by referring to the fourth power consumption table illustrated in FIG. 36 described above.

The sixth embodiment refers to the third power consumption table illustrated in FIG. 35 when estimating the power consumption of the dictionary coding unit 11, and the fourth power consumption table illustrated in FIG. 36 when estimating the power consumption of the entropy coding unit 12. Since the coding performance changes when the operation mode is switched (that is, the switching of the operation mode affects the coding performance), the switching (change) of the operation mode is considered to be reflected in the average match length and the average code length. Therefore, for the compression performance, the first compression performance table illustrated in FIG. 6 and the first compression performance table illustrated in FIG. 10 can be used (that is, the compression performance table does not have to change).

As described above, in the sixth embodiment, with the configuration in which the switching of the operation mode of the compressor 2e is detected, and the operation mode of the compressor 2e is switched based on the detection result, it is possible to appropriately adjust the coding performance and throughput according to, for example, the state of various resources (write buffer 2g or internal command queue 2h) inside the memory system 1 (SSD), the state of the external command queue 101 on the DRAM included in the host 100, the operational situation of the garbage collection (GC), or the like.

Further, in the sixth embodiment, with the configuration in which the compression efficiency is calculated based on the operation mode of the compressor 2e (that is, the detection result of switching the operation mode), it is possible to realize the clock gating control according to the operation mode.

Further, in the sixth embodiment, with the configuration in which the number of searches (retrievals) for the history buffer 11d (fifth buffer) for the dictionary coding is controlled based on the detection result of switching the operation mode, for example, when the switching from the high-speed low-compression mode to the low-speed high-compression mode 0 or the low-speed high-compression mode 1 is made, it is possible to improve the coding performance of the dictionary coding unit 11.

Further, in the sixth embodiment, with the configuration that the number of times the symbols are sorted is controlled based on the appearance frequency stored in the frequency table (first table) based on the detection result of switching the operation mode, for example, when the switching from the high-speed low-compression mode to the low-speed high-compression mode 0 or the low-speed high-compression mode 1 is made, it is possible to improve the coding performance of the entropy coding unit 12.

In the sixth embodiment, the configuration for dynamically switching the operation mode of the compressor 2e has been described in the second embodiment described above, but the configuration of the sixth embodiment may be applied to other embodiments described above.

Seventh Embodiment

Next, a seventh embodiment will be described. In the third embodiment, a detailed description of the same parts as those of each embodiment described above will be omitted, and parts different from each of the embodiments will be mainly described. Further, a hardware configuration of a memory system in the third embodiment is the same as that in each of the embodiments described above, and therefore, will be described with reference to FIG. 1 as appropriate.

The sixth embodiment described above describes that the compression efficiency calculated by the compression efficiency monitoring unit 13 may be taken into consideration in the determination process by the mode switching determination unit 16a, but the seventh embodiment specifically describes a configuration that determines whether or not to switch the operation mode of the compressor 2e based on the compression efficiency (that is, determines the operation mode).

The sixth embodiment described above describes that the mode switching determination unit 16a included in the mode switching detection unit 16 determines whether or not to switch the operation mode of the compressor 2e based on the state of various resources (write buffer 2g or internal command queue 2h) inside the memory system 1 (SSD), the state of the external command queue 101 on the DRAM included in the host 100, or the operational situation of the garbage collection (GC), but the seventh embodiment includes a monitor unit that monitors at least one of the operational situations of the above-described write buffer 2g, internal command queue 2h, external command queue 101, and garbage collection to switch the operation mode based on the monitored result by the monitoring unit and the compression efficiency of the dictionary coding unit 11.

First, the configuration (hereinafter, referred to as a first configuration) for determining the operation mode based on the compression efficiency of the dictionary coding unit 11 and a free space of the write buffer 2g will be described with reference to FIG. 37.

In the first configuration, as illustrated in FIG. 37, the mode switching detection unit 16 includes a mode switching determination unit 16a and a write buffer monitoring unit 16c. In FIG. 37, the mode buffer 16b described in the sixth embodiment described above is omitted.

The write buffer monitoring unit 16c monitors the free space of the write buffer 2g and outputs the monitored result to the mode switching determination unit 16a.

The mode switching determination unit 16a determines the operation mode of the compressor 2e based on the compression efficiency of the dictionary coding unit 11 calculated in the compression efficiency monitoring unit 13 and the monitored result (free space of the write buffer 2g) output from the write buffer monitoring unit 16c.

In the first configuration, it is assumed that the operation mode of the compressor 2e is determined by referring to, for example, the first operation mode table illustrated in FIG. 38. As illustrated in FIG. 38, the first operation mode table stores a condition (switching condition of the operation mode) regarding the compression efficiency of the dictionary coding unit 11 and the free space of the write buffer 2g and the operation mode (that is, operation mode after the switching) switched when the condition is satisfied.

Specifically, in the first operation mode table, when the compression efficiency of the dictionary coding unit 11 is 0.03 or more and the free space of the write buffer 2g is 512 bytes or more, it is defined that the operation mode of the compressor 2e is switched to the low-speed high-compression mode 0 (that is, determine the low-speed high-compression mode 0 as the operation mode of the compressor 2e).

In addition, in the first operation mode table, when the compression efficiency of the dictionary coding unit 11 is 0.03 or more and the free space of the write buffer 2g is 768 bytes or more, it is defined that the operation mode of the compressor 2e is switched to the low-speed high-compression mode 0 (that is, determine the low-speed high-compression mode 0 as the operation mode of the compressor 2e).

According to such a first operation mode table, it is possible to determine the operation mode of the compressor 2e based on the compression efficiency of the dictionary coding unit 11 calculated in the compression efficiency monitoring unit 13 and the monitored result (free space of the write buffer 2g) output from the write buffer monitoring unit 16c.

When the low-speed high-compression mode 0 or the low-speed high-compression mode 1 is determined by referring to the first operation mode table, the operation mode is maintained over, for example, 64 cycles, and then returns to the high-speed low-compression mode. Since the operations of the dictionary coding unit 11 and the entropy coding unit 12 in the low-speed high-compression mode 0 and the low-speed high-compression mode 1 are as described in the sixth embodiment described above, a detailed description thereof will be omitted here. The same applies to the following description.

In the first operation mode table described above, 0.03 compared with the compression efficiency of the dictionary coding unit 11 is a predetermined threshold, and may be another value.

On the other hand, a threshold (512 bytes and 768 bytes) compared with the free space of the write buffer 2g in the first operation mode table corresponds to the free space required to prevent the write buffer 2g from overflowing even if the throughput (the speed at which the uncompressed data is extracted from the write buffer 2g) of the dictionary coding unit 11 is reduced by switching the operation mode of compressor 2e, and is calculated by, for example, "(throughput in high-speed low-compression mode-throughput in low-speed high-compression mode)×64".

Specifically, the throughput in the high-speed low-compression mode is 16 bytes/cycle, and the throughput in the low-speed high-compression mode 0 corresponds to 8 bytes/cycle. Therefore, the threshold (free space) compared with the free space of the write buffer 2g in order to determine the low-speed high-compression mode 0 is (16−8)×64=512 bytes. Similarly, the throughput in the high-speed low-compression mode is 16 bytes/cycle, and the throughput in the low-speed high-compression mode 1 corresponds to 4 bytes/cycle. Therefore, the threshold (free space) compared with the free space of the write buffer 2g in order to determine the low-speed high-compression mode 1 is (16−4)×64=768 bytes.

As described above, in the first configuration, the appropriate operation mode of the compressor 2e can be determined based on the compression efficiency of the dictionary coding unit 11 and the free space of the write buffer 2g.

Here, it describes that the compression efficiency of the dictionary coding unit 11 is used, but it may be in configuration in which the operation mode of the compressor 2e may be determined based on the compression efficiency of the entropy coding unit 12 and the free space of the write buffer 2g. Although the detailed description is omitted, in this case, the operation mode of the compressor 2e can be determined from the compression efficiency of the entropy coding unit 12 and the free space of the write buffer 2g by using the first operation mode table illustrated in FIG. 39.

The first configuration described above may be the configuration in which the operation mode of the compressor 2e is determined based on the compression efficiency of the dictionary coding unit 11, the compression efficiency of the entropy coding, and the free space of the write buffer 2g.

Next, the configuration (hereinafter, referred to as the second configuration) in which the operation mode is determined based on the compression efficiency of the dictionary coding unit 11 and the number of write commands stored in the internal command queue 2h will be described with reference to FIG. 40.

In the second configuration, as illustrated in FIG. 40, the mode switching detection unit 16 includes a mode switching determination unit 16a and an internal command queue monitoring unit 16d. In FIG. 40, the mode buffer 16b described in the sixth embodiment described above is omitted.

The internal command queue monitoring unit 16d monitors the number of write commands stored in the internal command queue 2h, and outputs the monitored result to the mode switching determination unit 16a.

The mode switching determination unit 16a determines the operation mode of the compressor 2e based on the compression efficiency of the dictionary coding unit 11 calculated in the compression efficiency monitoring unit 13 and the monitored result (the number of write commands stored in the internal command queue 2h) output from the internal command queue monitoring unit 16d.

In the second configuration, it is assumed that the operation mode of the compressor 2e is determined by referring to, for example, the second operation mode table illustrated in FIG. 41. As illustrated in FIG. 41, the second operation mode table stores the condition (switching condition of the operation mode) regarding the compression efficiency of the dictionary coding unit 11 and the number of write commands stored in the internal command queue 2h and the operation mode (that is, operation mode after the switching) switched when the condition is satisfied.

Specifically, in the second operation mode table, when the compression efficiency of the dictionary coding unit 11 is 0.03 or more and the number of write commands stored in the internal command queue 2h is 32 bytes or less, it is defined that the operation mode of the compressor 2e is switched to the low-speed high-compression mode 0 (that is, determine the low-speed high-compression mode 0 as the operation mode of the compressor 2e).

In addition, in the second operation mode table, when the compression efficiency of the dictionary coding unit 11 is 0.03 or more and the number of write commands stored in the internal command queue 2h is 16 bytes or less, it is defined that the operation mode of the compressor 2e is switched to the low-speed high-compression mode 1 (that is, determine the low-speed high-compression mode 1 as the operation mode of the compressor 2e).

According to such a second operation table, when the compression efficiency of the dictionary coding unit 11 is equal to or greater than a predetermined threshold and the number of write commands in the internal command queue 2h is small, the high-speed low-compression mode can be switched to the low-speed high-compression mode. The threshold compared with the number of write commands stored in the internal command queue 2h in the second operation table may be the threshold for determining low-speed high-compression mode 1 greater than the threshold for determining the low-speed high-compression mode 0, and may be different from the value illustrated in FIG. 41.

When the low-speed high-compression mode 0 or the low-speed high-compression mode 1 is determined by referring to the second operation mode table, as described above, the operation mode is maintained over, for example, 64 cycles, and then returns to the high-speed low-compression mode.

As described above, in the second configuration, the appropriate operation mode of the compressor 2e can be determined based on the compression efficiency of the dictionary coding unit 11 and the number of write commands stored in the internal command queue 2h.

Here, it is described that the compression efficiency of the dictionary coding unit 11 is used, but it may be the configuration in which the operation mode of the compressor 2e is determined based on the compression efficiency of the entropy coding unit 12 and the number of write commands stored in the internal command queue 2h. Although the detailed description is omitted, in this case, the operation mode of the compressor 2e can be determined from the compression efficiency of the entropy coding unit 12 and the number of write commands stored in the internal command queue 2h by using the second operation mode table illustrated in FIG. 42.

The second configuration described above may be the configuration in which the operation mode of the compressor 2e is determined based on the compression efficiency of the dictionary coding unit 11, the compression efficiency of the entropy coding unit 12, and the number of write commands stored in the internal command queue 2h.

Next, the configuration (hereinafter, referred to as the third configuration) in which the operation mode is determined based on the compression efficiency of the dictionary coding unit 11 and the number of write commands stored in the external command queue 101 will be described with reference to FIG. 43.

In the third configuration, as illustrated in FIG. 43, the mode switching detection unit 16 includes a mode switching determination unit 16a and an external command queue monitoring unit 16e. In FIG. 43, the mode buffer 16b described in the sixth embodiment described above is omitted.

The external command queue monitoring unit 16e monitors the number of write commands stored in the external command queue 101, and outputs the monitored result to the mode switching determination unit 16a.

The mode switching determination unit 16a determines the operation mode of the compressor 2e based on the compression efficiency of the dictionary coding unit 11 calculated in the compression efficiency monitoring unit 13 and the monitored result (the number of write commands stored in the external command queue 101) output from the external command queue monitoring unit 16e.

In the third configuration, it is assumed that the operation mode of the compressor 2e is determined by referring to, for example, the third operation mode table illustrated in FIG. 44. As illustrated in FIG. 44, the third operation mode table stores the condition (switching condition of the operation mode) regarding the compression efficiency of the dictionary coding unit 11 and the number of write commands stored in the external command queue 101 and the operation mode (that is, operation mode after the switching) switched when the condition is satisfied.

Specifically, in the third operation mode table, when the compression efficiency of the dictionary coding unit 11 is 0.03 or more and the number of write commands stored in the external command queue 101 is 64 bytes or less, it is defined that the operation mode of the compressor 2e is switched to the low-speed high-compression mode 0 (that is, determine the low-speed high-compression mode 0 as the operation mode of the compressor 2e).

In addition, in the third operation mode table, when the compression efficiency of the dictionary coding unit 11 is 0.03 or more and the number of write commands stored in the internal command queue 2h is 32 bytes or less, it is defined that the operation mode of the compressor 2e is switched to the low-speed high-compression mode 1 (that is, determine the low-speed high-compression mode 1 as the operation mode of the compressor 2e).

According to such a third operation table, when the compression efficiency of the dictionary coding unit 11 is equal to or greater than a predetermined threshold and the number of write commands in the external command queue 101 is small, the high-speed low-compression mode can be switched to the low-speed high-compression mode. The threshold compared with the number of write commands stored in the external command queue 101 in the third operation table may be the threshold for determining low-speed high-compression mode 1 greater than the threshold for determining the low-speed high-compression mode 0, and may be different from the value illustrated in FIG. 44.

When the low-speed high-compression mode 0 or the low-speed high-compression mode 1 is determined by referring to the third operation mode table, as described above, the operation mode is maintained over, for example, 64 cycles, and then returns to the high-speed low-compression mode.

As described above, in the third configuration, the appropriate operation mode of the compressor 2e can be determined based on the compression efficiency of the dictionary coding unit 11 and the number of write commands stored in the external command queue 101.

Here, it is described that the compression efficiency of the dictionary coding unit 11 is used, but it may be the configuration in which the operation mode of the compressor 2e is determined based on the compression efficiency of the entropy coding unit 12 and the number of write commands stored in the external command queue 101. Although the detailed description is omitted, in this case, the operation mode of the compressor 2e can be determined from the compression efficiency of the entropy coding unit 12 and the number of write commands stored in the external command queue 101 by using the third operation mode table illustrated in FIG. 45.

The third configuration described above may be the configuration in which the operation mode of the compressor 2e is determined based on the compression efficiency of the dictionary coding unit 11, the compression efficiency of the entropy coding unit 12, and the number of write commands stored in the external command queue 101.

As illustrated in FIG. 46, the configuration may be a combination of the above-described first to third configurations. Although the detailed description is omitted, in the configuration illustrated in FIG. 46, the mode switching detection unit 16 includes the write buffer monitoring unit 16c, the internal command queue monitoring unit 16d, and the external command queue monitoring unit 16e, so the mode switching determination unit 16a may determine the operation mode of the compressor 2e based on the compression efficiency calculated in the compression efficiency monitoring unit 13, the free space of the write buffer 2g, the number of write commands stored in the internal command queue 2h, and the number of write commands stored in the external command queue 101. In this case, the mode switching determination unit 16a determines the operation mode of the compressor 2e by referring to the operation mode table illustrated in FIG. 47, for example.

Also, it may be the configuration in which the operation mode of the compressor 2e is determined based on the compression efficiency of the entropy coding unit 12, the free space of the write buffer 2g, the number of write commands stored in the internal command queue 2h, and the number of write commands stored in the external command queue 101. In this case, the operation mode table illustrated in FIG. 48 may be referenced.

Furthermore, it may be the configuration in which the operation mode of the compressor 2e is determined based on the compression efficiency of the dictionary coding unit 11, the compression efficiency of the entropy coding unit 12, the free space of the write buffer 2g, the number of write commands stored in the internal command queue 2h, and the number of write commands stored in the external command queue 101.

Next, the configuration (hereinafter, referred to as a fourth configuration) for determining the operation mode based on the compression efficiency of the dictionary coding unit 11 and the operational situation of the garbage collection (GC) will be described with reference to FIG. 49.

In the fourth configuration, as illustrated in FIG. 49, the mode switching detection unit 16 includes a mode switching determination unit 16a and a GC monitoring unit 16f. In FIG. 49, the mode buffer 16b described in the sixth embodiment described above is omitted.

Here, in the memory system 1 (SSD), the garbage collection is performed in order to release an unnecessary memory area of the NAND flash memory 3 (non-volatile memory). In the garbage collection, the process of reading the data on the NAND flash memory (memory cell array) 3 and writing the read data back to another position is executed. Therefore, when the garbage collection is executed, the write process to the NAND flash memory 3 (that is, the write command for GC) caused by the garbage collection occurs. Note that "G" written in the internal command queue 2h illustrated in FIG. 49 represents the write command for GC stored in the internal command queue 2h.

Therefore, in the fourth configuration, the GC monitoring unit 16f monitors a ratio of the number of write commands for GC to all the write commands (the write command issued from the host 100 and the write command for GC) stored in the internal command queue 2h in order to grasp the operational situation of the garbage collection, and outputs the monitored result to the mode switching determination unit 16a.

The mode switching determination unit 16a determines the operation mode of the compressor 2e based on the compression efficiency of the dictionary coding unit 11 calculated in the compression efficiency monitoring unit 13 and the monitored result (the ratio of the number of write commands for GC) output from the GC monitoring unit 16f.

In the fourth configuration, for example, when the compression efficiency of the dictionary coding unit 11 is equal to or greater than a predetermined threshold and the ratio of the number of write commands for GC is equal to or greater than the first threshold, the operation mode of the compressor 2e is switched to the low-speed high-compression mode 0 (that is, determine the low-speed high-compression mode 0 as the operating mode of the compressor 2e). In addition, for example, when the compression efficiency of the dictionary coding unit 11 is equal to or greater than a predetermined threshold and the ratio of the number of write commands for GC is equal to or greater the second threshold greater than the first threshold, the operation mode of the compressor 2e is switched to the low-speed high-compression mode 1 (that is, determine the low-speed high-compression mode 1 as the operating mode of the compressor 2e). Note that the ratio of the number of write commands for GC is equal to or greater than the threshold means that the input throughput of the uncompressed data for the compressor 2e is lower than the amount estimated from the number of write commands stored in the internal command queue 2h. Here, it is assumed that the compressed data is not decompressed and recompressed (that is, the compressed data is copied as it is) when the garbage collection is performed, so when the ratio of the number of write commands for GC is large, the throughput of the uncompressed data for the compressor 2e is reduced.

When the low-speed high-compression mode 0 or the low-speed high-compression mode 1 is determined as the operation mode of the compressor 2e as described above, the operation mode is maintained over, for example, 64 cycles, and then returns to the high-speed low-compression mode.

As described above, in the fourth configuration, the appropriate operation mode of the compressor 2e can be determined based on the compression efficiency of the dictionary coding unit 11 and (the ratio of) the number of write commands for GC.

Here, it is described that the compression efficiency of the dictionary coding unit 11 is used, but it may be the configuration in which the operation mode of the compressor 2e may be determined based on the compression efficiency of the entropy coding unit 12 and the number of write commands for GC.

The fourth configuration described above may be the configuration in which the operation mode of the compressor 2e is determined based on the compression efficiency of the dictionary coding unit 11, the compression efficiency of the entropy coding unit 12, and the number of write commands for GC.

The seventh embodiment describes the configurations (first to fourth configurations) in which the operation mode of the compressor 2e is determined based on at least one of the compression efficiency of the dictionary coding unit 11, the free space of the write buffer 2g, the number of write commands stored in the internal command queue 2h, the number of write commands stored in the external command queue 101, and the number of write commands for GC, but may have the configuration in which the operation mode of the compressor 2e is determined based on, for example, the number of searches specified in the write command.

Hereinafter, the configuration (hereinafter, referred to as a fifth configuration) for determining the operation mode based on the number of searches specified in the compression efficiency of the dictionary coding unit 11 and the write command will be described with reference to FIG. 50.

In the fifth configuration, when the host 100 issues the write command to the external command queue 101, it is possible to specify the number of searches (the number of searches for the history buffer 11d) for the corresponding write command. In this case, the write command is provided with the number of times specification field 101a, and the mode switching determination unit 16a determines the operation mode of the compressor 2e based on the number of searches set (specified) in the number of times specification field 101a.

Specifically, for example, when the compression efficiency of the dictionary coding unit 11 is equal to or higher than a predetermined threshold value the number of searches set in the number of times specification field is two, the mode switching determination unit 16a can determine the low-speed high-compression mode 0 as the operation mode of the compressor 2e. In addition, for example, when the compression efficiency of the dictionary coding unit 11 is equal to or higher than a predetermined threshold value the number of searches set in the number of times specification field 101a is four, the mode switching determination unit 16a can determine the low-speed high-compression mode 1 as the operation mode of the compressor 2e.

In the fifth configuration, for example, it can be set whether or not to consider the compression efficiency of the dictionary coding unit 11 when determining the operation mode of the compressor 2e by using a flag.

As a result, for example, when the flag indicating that the compression efficiency of the dictionary coding unit 11 is not considered is set, the operation mode of the compressor 2e can be determined based on only the number of searches set in the number of times specification field 101a without considering the compression efficiency.

The number of times specification field 101a described above can be referenced from the write command stored in the internal command queue 2h.

When the low-speed high-compression mode 0 or the low-speed high-compression mode 1 is determined as the operation mode of the compressor 2e as described above, the operation mode is maintained over, for example, 64 cycles, and then returns to the high-speed low-compression mode.

As described above, in the fifth configuration, the appropriate operation mode of the compressor 2e can be determined based on the compression efficiency of the dictionary coding unit 11 and the number of searches specified in the write command.

Here, it is described that the operation mode of the compressor 2e is determined based on the number of searches specified in the write command, but it may be, for example, the configuration in which the operation mode of the compressor 2e is determined based on the number of times (the number of sorts in the frequency table) of sorts specified in the write command (the number of times specification field 101a). In this case, when the number of sorts specified in the write command is two, the mode switching determination unit 16a can determine the low-speed high-compression mode 0 as the operation mode of the compressor 2e. Further, when the number of sorts specified in the write specification command is 4, the mode switching determination unit 16a can determine the low-speed high-compression mode 1 as the operation mode of the compressor 2e.

In addition, it is described that the compression efficiency of the dictionary coding unit 11 is used, but it may be the configuration in which the operation mode of the compressor 2e may be determined based on the compression efficiency of the entropy coding unit 12.

It may be the configuration in which the operation mode of the compressor 2e may be determined based on the compression efficiency of the dictionary coding unit 11, the compression efficiency of the entropy coding unit 12, and the number of searches or the number of sorts specified in the write command.

As described above, the seventh embodiment determines the operation mode of the compressor 2e based on at least one of the compression efficiency (compression efficiencies of the dictionary coding unit 11 or the entropy coding unit 12), the free space of the write buffer 2g, the number of write commands stored in the internal command queue 2h, the number of write commands stored in the external command queue 101, and the number of write commands for GC, thereby operating the compressor 2e (dictionary coding unit 11 and entropy coding unit 12) in the appropriate operation mode.

Further, in the seventh embodiment, the operation mode may be determined based on the number of searches or the number of sorts specified in the write command. According to such a configuration, it is possible to make the compressor 2e perform an operation according to the specified number of searches and the specified number of sorts.

In the seventh embodiment, the first to fifth configurations have been mainly described, but the first to fifth configurations may be combined as appropriate.

Further, in the seventh embodiment, it is assumed that the dictionary coding unit 11 and the entropy coding unit 12 operate in the same operation mode, but may have the configuration in which different operation modes are determined for each of the dictionary coding unit 11 and the entropy coding unit 12. In this case, it may be, for example, the configuration in which the operation mode of the dictionary coding unit 11 is determined based on the compression efficiency of the dictionary coding unit 11, and the operation mode of the entropy coding unit 12 is determined based on the compression efficiency of the entropy coding unit 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a compressor configured to output second data obtained by compressing input first data; and
   a non-volatile memory to which third data based on the second data output from the compressor is written,
   wherein the compressor comprises:
   a dictionary coding unit configured to perform dictionary coding on the first data and output a result of the dictionary coding;
   an entropy coding unit configured to perform entropy coding on the result of the dictionary coding and output the result of the entropy coding as the second data;
   a first calculation unit configured to calculate compression efficiencies of the dictionary coding and the entropy coding; and
   a first control unit configured to control an operation of at least one of the dictionary coding unit and the entropy coding unit for fourth data input to the compressor based on the calculated compression efficiencies and a power reduction level input to the compressor.

2. The memory system according to claim 1, wherein
   when the operation of the dictionary coding unit is skipped by the first control unit, the result of the entropy coding for the fourth data is output from the compressor,
   when the operation of the entropy coding unit is skipped by the first control unit, the result of the dictionary coding unit is output from the compressor, and
   when the operations of the dictionary coding unit and the entropy coding unit are skipped by the first control unit, the fourth data is output from the compressor.

3. The memory system according to claim 1, wherein
   the dictionary coding performed by the dictionary coding unit is a coding method that converts data input to the dictionary coding unit into a relative reference of data older than the data, and
   the entropy coding performed by the entropy coding unit is a coding method of converting the data input to the entropy coding unit into a code having a code length according to an appearance frequency of the data.

4. The memory system according to claim 1, wherein the first calculation unit is configured to calculate the compression efficiencies based on the result of the dictionary coding for the first data and the result of the entropy coding for the result of the dictionary coding.

5. The memory system according to claim 4, further comprising:
   a classification unit configured to classify the fourth data,
   wherein the first calculation unit is configured to calculate the compression efficiencies based on the classification result.

6. The memory system according to claim 5, wherein the first calculation unit is configured to calculate the compression efficiency based on compression performance or an indicator that correlates with the compression performance based on the classification result.

7. The memory system according to claim 5, wherein the first calculation unit is configured to calculate the compression efficiency based on power consumption or an indicator that correlates with the power consumption based on the classification result.

8. The memory system according to claim 4, wherein
   the dictionary coding unit comprises a first dictionary coding unit configured to perform dictionary coding converting the data input to the dictionary coding unit into a relative reference of relatively close past data, a second dictionary coding unit configured to perform dictionary coding converting the data input to the dictionary coding unit into a relative reference of relatively distant past data,
   the first calculation unit is configured to calculate the compression efficiencies of the dictionary coding by the first dictionary coding unit and the dictionary coding by the second dictionary coding unit based on the result of the dictionary coding by the first dictionary coding unit and the result of the dictionary coding by the second dictionary coding unit, and
   the first control unit is configured to control the operation of at least one of the first dictionary coding unit and the second dictionary coding unit for the fourth data based on the calculated compression efficiencies.

9. The memory system according to claim 8, wherein
   the second dictionary coding unit comprises a third dictionary coding unit configured to perform the dictionary coding converting the data input to the dictionary coding unit into a relative reference of a part of the relatively distant past data and a fourth dictionary coding unit configured to perform the dictionary coding converting the data input to the dictionary coding unit into a relative reference of another part of the relatively distant past data,
   the first calculation unit is configured to calculate the compression efficiencies of the dictionary coding by the third dictionary coding unit and the dictionary coding by the fourth dictionary coding unit based on the result of the dictionary coding by the third dictionary coding unit and the result of the dictionary coding by the fourth dictionary coding unit, and
   the first control unit is configured to control the operation of at least one of the third dictionary coding unit and the fourth dictionary coding unit for the fourth data based on the calculated compression efficiencies.

10. The memory system according to claim 9, wherein
    the first calculation unit is configured to calculate separate compression efficiencies of the third dictionary coding unit and the fourth dictionary coding unit, respectively, and the first control unit is configured to control the operations of the third dictionary coding unit and the fourth dictionary coding unit, respectively, based on the compression efficiency separately calculated by the first calculation unit.

11. The memory system according to claim 8, wherein
the first calculation unit is configured to calculate separate compression efficiencies of the first dictionary coding unit and the second dictionary coding unit, respectively, and
the first control unit is configured to control the operations of the first dictionary coding unit and the second dictionary coding unit, respectively, based on the compression efficiency separately calculated by the first calculation unit.

12. The memory system according to claim 4, wherein
the result of the dictionary coding comprises a plurality of symbols,
the entropy coding unit comprises a first generation unit configured to generate a first frequency table storing an appearance frequency for each symbol, a second generation unit configured to generate a first coding table used for converting the symbol into a code based on the first frequency table, a coding unit configured to perform the entropy coding using the first coding table, and a second calculation unit configured to calculate similarity between the first frequency table and a past second frequency table,
the first calculation unit is configured to calculate the compression efficiency of the entropy coding based on the similarity,
the first control unit is configured to skip an operation of the second generation unit based on the calculated compression efficiency, and
the coding unit is configured to perform the entropy coding using a past second coding table when the operation of the second generation unit is skipped.

13. The memory system according to claim 12, wherein
the first calculation unit is configured to separately calculate the compression efficiency of the entropy coding unit when the entropy coding is performed using each of the first and second coding tables, and
the first control unit is configured to control the operations of the first generation unit, the second generation unit, and the coding unit, respectively, based on the compression efficiency separately calculated by the first calculation unit.

14. The memory system according to claim 4, wherein
the result of the dictionary coding comprises a plurality of symbols,
the entropy coding unit comprises a first generation unit configured to generate a first frequency table storing an appearance frequency for each symbol, a second generation unit configured to generate a first coding table used for converting the symbol into a code based on the first frequency table, a coding unit configured to perform the entropy coding using the first coding table, and a third calculation unit configured to calculate a code amount when the entropy coding is performed using a third coding table prepared in advance independent of a plurality of symbols in the result of the dictionary coding,
the first calculation unit is configured to calculate the compression efficiency of the entropy coding unit based on the calculated code amount,
the first control unit is configured to skip the operation of the second generation unit based on the calculated compression efficiency, and
the coding unit is configured to perform the entropy coding using the third coding table when the operation of the second generation unit is skipped.

15. The memory system according to claim 14, wherein
the first calculation unit is configured to separately calculate the compression efficiency of the entropy coding unit when the entropy coding is performed using each of the first and third coding tables, and
the first control unit is configured to control the operations of the first generation unit, the second generation unit, and the coding unit, respectively, based on the compression efficiency separately calculated by the first calculation unit.

16. The memory system according to claim 1, wherein
the first calculation unit is configured to calculate separate compression efficiencies of the dictionary coding unit and the entropy coding unit, respectively, and
the first control unit is configured to control the operations of each of the dictionary coding unit and the entropy coding unit based on the compression efficiency separately calculated by the first calculation unit.

17. The memory system according to claim 1, wherein
the first calculation unit is configured to calculate a compression efficiency of the dictionary coding unit and the entropy coding unit, and
the first control unit is configured to collectively control the operations of the dictionary coding unit and the entropy coding unit based on the compression efficiency calculated by the first calculation unit.

18. The memory system according to claim 1, wherein
the dictionary coding performed by the dictionary coding unit is a coding method that converts the data input to the dictionary coding unit into a relative reference of data older than the data, and the result of the dictionary coding comprises a match length as the relative reference, and
the first calculation unit is configured to calculate the compression efficiency of the dictionary coding unit based on the match length.

19. The memory system according to claim 1, wherein
the dictionary coding performed by the dictionary coding unit is a coding method that converts the data input to the dictionary coding unit into a relative reference of data older than the data, and the result of the dictionary coding comprises a match length as the relative reference, and
the first calculation unit is configured to calculate the compression efficiency of the dictionary coding unit based on compression performance and power consumption based on the match length.

20. The memory system according to claim 1, wherein
the entropy coding performed by the entropy coding unit is a coding method of converting the data input to the entropy coding unit into a code having a code length according to an appearance frequency of the data, and
the first calculation unit is configured to calculate the compression efficiency of the entropy coding unit based on the code length.

21. The memory system according to claim 1, wherein
the entropy coding performed by the entropy coding unit is a coding method of converting the data input to the entropy coding unit into a code having a code length according to an appearance frequency of the data, and the first calculation unit is configured to calculate the compression efficiency of the entropy coding unit based on compression performance and power consumption based on the code length.

22. The memory system according to claim 1, wherein the first calculation unit is configured to calculate the compression efficiency based on power consumption of at least a part of the compressor.

23. The memory system according to claim 1, further comprising:
   a decompressor configured to output the first data obtained by decompressing the second data based on the third data written to the non-volatile memory,
   wherein the first calculation unit is configured to calculate the compression efficiency based on power consumption of at least a part of the decompressor.

24. The memory system according to claim 1, wherein the first calculation unit is configured to calculate the compression efficiency based on power consumption of at least a part of the non-volatile memory.

25. The memory system according to claim 1, wherein the first calculation unit is configured to calculate the compression efficiency based on power consumption of the entire memory system.

26. The memory system according to claim 1, further comprising:
   a detection unit configured to detect switching of an operation mode of the compressor; and
   a second control unit configured to switch the operation mode of the compressor based on the detection result.

27. The memory system according to claim 26, wherein the detection unit is configured to detect the switching of the operation mode of the compressor based on the compression efficiency.

28. The memory system according to claim 26, wherein the first calculation unit is configured to calculate the compression efficiency based on the detection result.

29. The memory system according to claim 26, further comprising:
   a fourth buffer configured to store write data specified in a write command issued from a host connected to the memory system; and
   an internal command queue configured to store the write command,
   wherein the detection unit further comprises a monitoring unit configured to monitor at least one of a free space of the fourth buffer, a number of write commands stored in the internal command queue, the number of write commands stored in an external command queue included in the host, and the number of write commands due to garbage collection executed within the memory system, and is configured to detect the switching of the operation mode of the compressor based on the monitored result.

30. The memory system according to claim 26, wherein the dictionary coding performed by the dictionary coding unit is a coding method that converts the data input to the dictionary coding unit into a relative reference of data older than the data, and the dictionary coding unit comprises a fifth buffer configured to store the past data, and
   the second control unit is configured to control a number of searches for the fifth buffer for the dictionary coding based on the detection result.

31. The memory system according to claim 26, wherein the entropy coding performed by the entropy coding unit is a coding method that converts a symbol input to the entropy coding unit into the code having a code length according to a frequency of appearance of the symbol,
   the entropy coding unit comprises a first generation unit configured to generate a first frequency table storing the appearance frequency for each symbol, and
   the second control unit is configured to control a number of times the symbol is sorted based on the appearance frequency stored in the first frequency table to allocate the code to the symbol based on the detection result.

32. The memory system according to claim 26, further comprising:
   a fourth buffer configured to store write data specified in the write command issued from the host connected to the memory system,
   wherein the dictionary coding performed by the dictionary coding unit is a coding method that converts the data input to the dictionary coding unit into a relative reference of data older than the data, and the dictionary coding unit comprises a fifth buffer configured to store the past data,
   the detection unit further comprises a monitoring unit configured to monitor the a space of the fourth buffer, and is configured to determine the operation mode of the compressor based on the monitored result, and
   the second control unit is configured to control a number of searches for the fifth buffer for the dictionary coding based on the determined operation mode.

33. The memory system according to claim 26, further comprising:
   an internal command queue configured to store the write command issued from the host connected to the memory system,
   wherein the dictionary coding performed by the dictionary coding unit is a coding method that converts the data input to the dictionary coding unit into a relative reference of data older than the data, and the dictionary coding unit comprises a fifth buffer configured to store the past data,
   the detection unit further comprises a monitoring unit configured to monitor a number of write commands stored in the internal command queue, and determines the operation mode of the compressor based on the monitored result, and
   the second control unit is configured to control a number of searches for the fifth buffer for the dictionary coding based on the determined operation mode.

34. The memory system according to claim 26, wherein the dictionary coding performed by the dictionary coding unit is a coding method that converts the data input to the dictionary coding unit into a relative reference of data older than the data, and the dictionary coding unit comprises a fifth buffer configured to store the past data,
   the detection unit comprises a monitoring unit configured to monitor a number of write commands stored in an external command queue included in the host connected to the memory system, and is configured to determine the operation mode of the compressor based on the monitored result, and
   the second control unit is configured to control a number of searches for the fifth buffer for the dictionary coding based on the determined operation mode.

35. The memory system according to claim 26, further comprising:
   a fourth buffer configured to store write data specified in a write command issued from a host connected to the memory system; and an internal command queue configured to store the write command, wherein the dictionary coding performed by the dictionary coding unit is a coding method that converts the data input to the dictionary coding unit into a relative reference of data older than the data, and the dictionary coding unit comprises a fifth buffer configured to store the past data, the detection unit further comprises a first monitoring unit configured to monitor a free space of the fourth buffer, a second monitoring unit configured to monitor a number of write commands stored in the internal command queue, and a third monitoring unit configured to monitor the number of write commands stored in an external command queue included in the host, and is configured to determine the operation mode of the compressor based on the monitored result by each of the first to third monitoring units, and the second control unit is configured to control a number of searches for the fifth buffer for the dictionary coding based on the determined operation mode.

36. The memory system according to claim 26, wherein the dictionary coding performed by the dictionary coding unit is a coding method that converts the data input to the dictionary coding unit into a relative reference of data older than the data, the dictionary coding unit comprises a fifth buffer configured to store the past data, the detection unit is configured to determine the operation mode of the compressor according to a number of searches set in a field provided in the write command issued from the host connected to the memory system, and the second control unit is configured to control the number of searches for the fifth buffer for the dictionary coding based on the determined operation mode.

37. The memory system according to claim 26, wherein the dictionary coding performed by the dictionary coding unit is a coding method that converts the data input to the dictionary coding unit into a relative reference of data older than the data, and the dictionary coding unit comprises a fifth buffer configured to store the past data, the detection unit further comprises a monitoring unit configured to monitor a number of write commands due to garbage collection executed within the memory system, and is configured to determine the operation mode of the compressor based on the monitored result, and the second control unit is configured to control a number of searches for the fifth buffer for the dictionary coding based on the determined operation mode.

38. The memory system according to claim 26, further comprising:

a fourth buffer configured to store write data specified in the write command issued from the host connected to the memory system, wherein the entropy coding performed by the entropy coding unit is a coding method that converts a symbol input to the entropy coding unit into the code having a code length according to a frequency of appearance of the symbol, and the entropy coding unit comprises a first generation unit configured to generate a first frequency table storing the appearance frequency for each symbol, the detection unit further comprises a monitoring unit configured to monitor a free space of the fourth buffer, and is configured to determine the operation mode of the compressor based on the monitored result, and the second control unit is configured to control a number of times the symbol is sorted based on the appearance frequency stored in the first frequency table to allocate the code to the symbol based on the determined operation mode.

39. The memory system according to claim 26, further comprising:

an internal command queue configured to store the write command issued from the host connected to the memory system, wherein the entropy coding performed by the entropy coding unit is a coding method that converts a symbol input to the entropy coding unit into the code having a code length according to a frequency of appearance of the symbol, and the entropy coding unit comprises a first generation unit is configured to generate a first frequency table storing the appearance frequency for each symbol, the detection unit further comprises a monitoring unit configured to monitor a number of write commands stored in the internal command queue, and is configured to determine the operation mode of the compressor based on the monitored result, and the second control unit is configured to control a number of times the symbol is sorted based on the appearance frequency stored in the first frequency table to allocate the code to the symbol based on the determined operation mode.

40. The memory system according to claim 26, wherein the entropy coding performed by the entropy coding unit is a coding method that converts a symbol input to the entropy coding unit into the code having a code length according to a frequency of appearance of the symbol, and the entropy coding unit comprises a first generation unit configured to generate a first frequency table storing the appearance frequency for each symbol, the detection unit comprises a monitoring unit configured to monitor a number of write commands stored in an external command queue included in the host connected to the memory system, and is configured to determine the operation mode of the compressor based on the monitored result, and the second control unit is configured to control a number of times the symbol is sorted based on the appearance frequency stored in the first frequency table to allocate the code to the symbol based on the determined operation mode.

41. The memory system according to claim 26, further comprising:

a fourth buffer configured to store write data specified in a write command issued from a host connected to the memory system; and an internal command queue configured to store the write command, wherein the entropy coding performed by the entropy coding unit is a coding method that converts a symbol input to the entropy coding unit into the code having a code length according to a frequency of appearance of the symbol, and the entropy coding unit comprises a first generation unit configured to generate a first frequency table storing the appearance frequency for each symbol, the detection unit further comprises a first monitoring unit configured to monitor a free space of the fourth buffer, a second monitoring unit configured to monitor a number of write commands stored in the internal command queue, and a third monitoring unit configured to monitor the number of write commands stored in an external command queue included in the host, and is configured to determine the operation mode of the compressor based on the monitored result by each of the first to third monitoring units, and the second control unit is configured to control a number of times the symbol is sorted based on the appearance frequency stored in the first frequency table to allocate the code to the symbol based on the determined operation mode.

42. The memory system according to claim 26, wherein the entropy coding performed by the entropy coding unit is a coding method that converts a symbol input to the entropy coding unit into the code having a code length according to a frequency of appearance of the symbol, and the entropy coding unit comprises a first generation unit configured to generate a first frequency table storing the appearance frequency for each symbol, the detection unit is configured to determine the operation mode of the compressor according to a number of sorts set in a field provided in the write command issued from the host connected to the memory system, and the second control unit is configured to control a number of times the symbol is sorted based on the appearance frequency stored in the first frequency table to allocate the code to the symbol based on the determined operation mode.

43. The memory system according to claim 26, wherein the entropy coding performed by the entropy coding unit is a coding method that converts a symbol input to the entropy coding unit into the code having a code length according to a frequency of appearance of the symbol, and the entropy coding unit comprises a first generation unit configured to generate a first frequency table storing the appearance frequency for each symbol, the detection unit further comprises a monitoring unit configured to monitor a number of write commands due to garbage collection executed within the memory system, and is configured to determine the operation mode of the compressor based on the monitored result, and the second control unit is configured to control a number of times the symbol is sorted based on the appearance frequency stored in the first frequency table to allocate the code to the symbol based on the determined operation mode.

44. The memory system according to claim 1, wherein the first control unit is configured to decide a threshold based on the power reduction level and skip an operation of at least one of the dictionary coding unit and the entropy coding unit for the fourth data by comparing the calculated compression and the threshold.

* * * * *